United States Patent
Chang et al.

(10) Patent No.: US 11,552,069 B1
(45) Date of Patent: Jan. 10, 2023

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Kuang-Ching Chang, Hsinchu (TW); Jung-Chan Yang, Hsinchu (TW); Hui-Zhong Zhuang, Hsinchu (TW); Chih-Liang Chen, Hsinchu (TW); Kuo-Nan Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/463,241

(22) Filed: Aug. 31, 2021

(51) Int. Cl.
  *H01L 27/02* (2006.01)
  *G06F 1/3287* (2019.01)
(52) U.S. Cl.
  CPC ........ *H01L 27/0207* (2013.01); *G06F 1/3287* (2013.01)
(58) Field of Classification Search
  CPC .................... H01L 27/0207; G06F 1/3287
  USPC ....................................................... 327/427
  See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2* | 2/2016 | Yu ........................... | G06F 30/39 |
| 2014/0040838 A1 | 2/2014 | Liu et al. | |
| 2015/0278429 A1* | 10/2015 | Chang ....................... | G03F 1/36 |
| | | | 716/52 |

* cited by examiner

*Primary Examiner* — Tomi Skibinski
(74) *Attorney, Agent, or Firm* — Hauptman Ham, LLP

(57) ABSTRACT

An integrated circuit includes a first, second and third power rail, and a header circuit coupled to a gated circuit. The gated circuit is configured to operate on a first or second voltage. The first and second power rail are on a back-side of a wafer, and extend in a first direction. The header circuit is configured to supply the first voltage to the gated circuit by the first power rail. The second power rail is separated from the first power rail in a second direction. The second power rail is configured to supply the second voltage to the gated circuit. The third power rail is on a front-side of the wafer and includes a first set of conductors extending in the second direction, and separated in the first direction. Each of the first set of conductors is configured to supply a third voltage to the header circuit.

20 Claims, 37 Drawing Sheets

INTEGRATED CIRCUIT AND METHOD OF FORMING THE SAME

BACKGROUND

The semiconductor integrated circuit (IC) industry has produced a wide variety of analog and digital devices to address issues in a number of different areas. As ICs have become smaller and more complex, operating voltages of these analog and digital devices are reduced affecting the operating voltages of these digital devices and overall IC performance. Furthermore, power consumption in these analog and digital devices can increase due to resistance. Power gating is a technique to reduce power consumption in circuits within an IC by disconnecting power supplied to circuits within the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
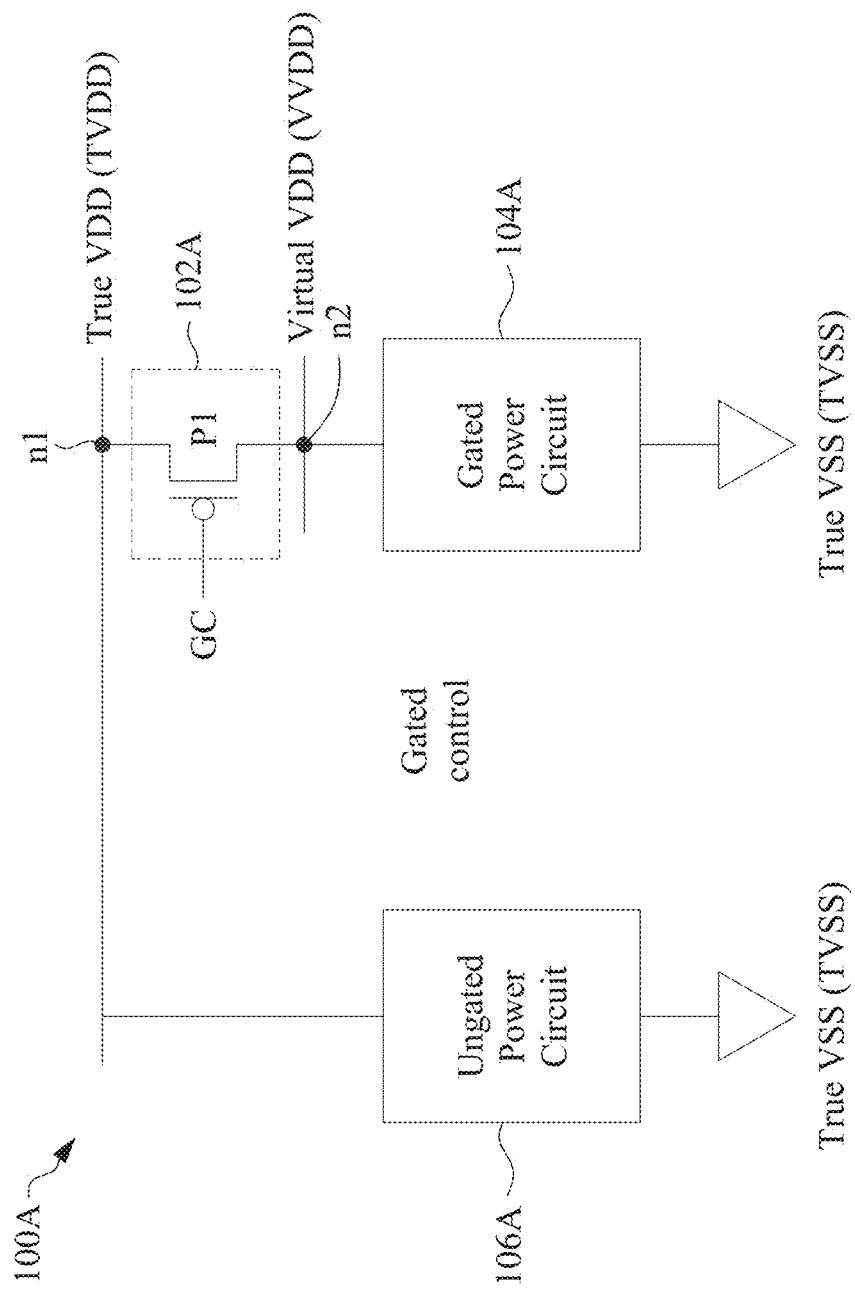
FIGS. 1A-1B are block diagrams of an IC, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit (IC) includes a header circuit coupled to a gated circuit. In some embodiments, the gated circuit is configured to operate on at least a first voltage or a second voltage. In some embodiments, the IC further includes a first power rail, a second power rail and a third power rail.

In some embodiments, the first power rail is on a back-side of a wafer, and extends in a first direction. In some embodiments, the header circuit is configured to supply the first voltage to the gated circuit by the first power rail from the back-side of the wafer.

In some embodiments, the second power rail is on the back-side of the wafer, extends in the first direction and is separated from the first power rail in a second direction different from the first direction. In some embodiments, the second power rail is configured to supply the second voltage to the gated circuit. In some embodiments, the second voltage is different from the first voltage.

In some embodiments, the third power rail is on a front-side of the wafer opposite of the back-side of the wafer. In some embodiments, the third power rail includes a first set of conductors extending in the second direction. In some embodiments, each conductor of the first set of conductors is separated from one another in the first direction. In some embodiments, each conductor of the first set of conductors is configured to supply a third voltage to the header circuit from the front-side of the wafer.

In some embodiments, the third power rail is coupled with the header circuit in a parallel manner thereby lowering the resistance of the third power rail. In some embodiments, the second power rail is coupled with the header circuit in a parallel manner, thereby lowering the resistance of the second power rail.

In some embodiments, by lowering the resistance of the second power rail and the third power rail, the power consumption of the header circuit is reduced compared with other approaches, thereby improving the efficiency of the header circuit compared with other approaches.

FIG. 1A is a block diagram of an IC 100A, in accordance with some embodiments.

IC 100A includes a header circuit 102A coupled to a gated power circuit 104A, and an ungated power circuit 106A. Gated power circuit 104A is configured to receive a gated power (e.g., VVDD) from header circuit 102A. Ungated power circuit 106A is configured to receive an ungated power (e.g., TVDD) from a first voltage supply TVDD.

Header circuit 102A is coupled to a node n1 of the first voltage supply TVDD and a node n2. Header circuit 102A is configured to receive a first voltage from the first voltage supply TVDD. In some embodiments, the first voltage supply TVDD is a voltage supply positioned external of IC 100A, and is referred to as a true VDD (TVDD). In some embodiments, the first voltage supply TVDD is a voltage supply positioned internal of IC 100A.

Header circuit 102A is configured to receive a control signal GC. In some embodiments, header circuit 102A is configured to be turned on based on control signal GC. In some embodiments, header circuit 102A is configured to be turned on, and configured to provide a second voltage to the second node n2, and is referred to as a virtual voltage supply (VVDD) or a second voltage supply VVDD. The first voltage of the first voltage supply TVDD is the same as the second voltage of the second supply voltage VVDD. In some embodiments, the first voltage of the first voltage supply TVDD is different from the second voltage of the second supply voltage VVDD.

Header circuit 102A is configured to provide the second voltage to at least gated power circuit 104A or node n2 responsive to the control signal GC. In some embodiments, based on different power states of the gated power circuit 104A, header circuit 102A is configured to switch on and thereby provide power to the gated power circuit 104A responsive to the control signal GC, or header circuit 102A is configured to switch off and thereby cut off power provided to the gated power circuit 104A responsive to the control signal GC. For example, when gated power circuit 104A is in a sleep mode or a standby mode, header circuit 102A is configured to be turned off, and the power provided to gated power circuit 104A is thereby cut off. For example, when gated power circuit 104A is in an active mode, header circuit 102A is configured to be turned on, and thereby provides power to gated power circuit 104A. In some embodiments, the control signal GC is received from a power management controller circuit (such as a power management integrated circuit not shown). Header circuit 102A is configured to improve the efficiency of IC 100A by reducing the power consumed by header circuit 102A.

Header circuit 102A includes a P-type metal oxide semiconductor (PMOS) transistor P1. Other types of transistors or numbers of transistors in header circuit 102A are within the contemplated scope of the present disclosure. A gate terminal of PMOS transistor P1 is configured to receive the control signal GC. A source terminal of PMOS transistor P1 is coupled with node n1 of the first voltage supply TVDD. A drain terminal of PMOS transistor P1 is coupled with node n2 and gated power circuit 104A. PMOS transistor P1 is configured to provide the second voltage to at least gated power circuit 104A or node n2 responsive to the control signal GC. In some embodiments, header circuit 102A is turned on or off based on the control signal GC and the first voltage of the first voltage supply TVDD.

Gated power circuit 104A is coupled between node n2 of the second voltage supply VVDD and a node of the third voltage supply (TVSS) configured to supply a third supply voltage. In some embodiments, the third voltage supply TVSS is referred to as a "true reference voltage supply." Gated power circuit 104A is configured to receive gated power (e.g., the second voltage supply VVDD) from header circuit 102A. Gated power circuit 104A includes one or more transistors, ICs, active or passive devices, or logic circuits configured to operate on the second voltage of the second voltage supply VVDD.

Ungated power circuit 106A is coupled between node n1 of the first voltage supply TVDD and a node of the third voltage supply TVSS configured to supply the third supply voltage. Ungated power circuit 106A is configured to receive ungated power from the first voltage supply TVDD. Ungated power circuit 106A includes one or more transistors, ICs, active or passive devices, or logic circuits configured to operate on the first supply voltage of the first voltage supply TVDD.

Figure 1B:
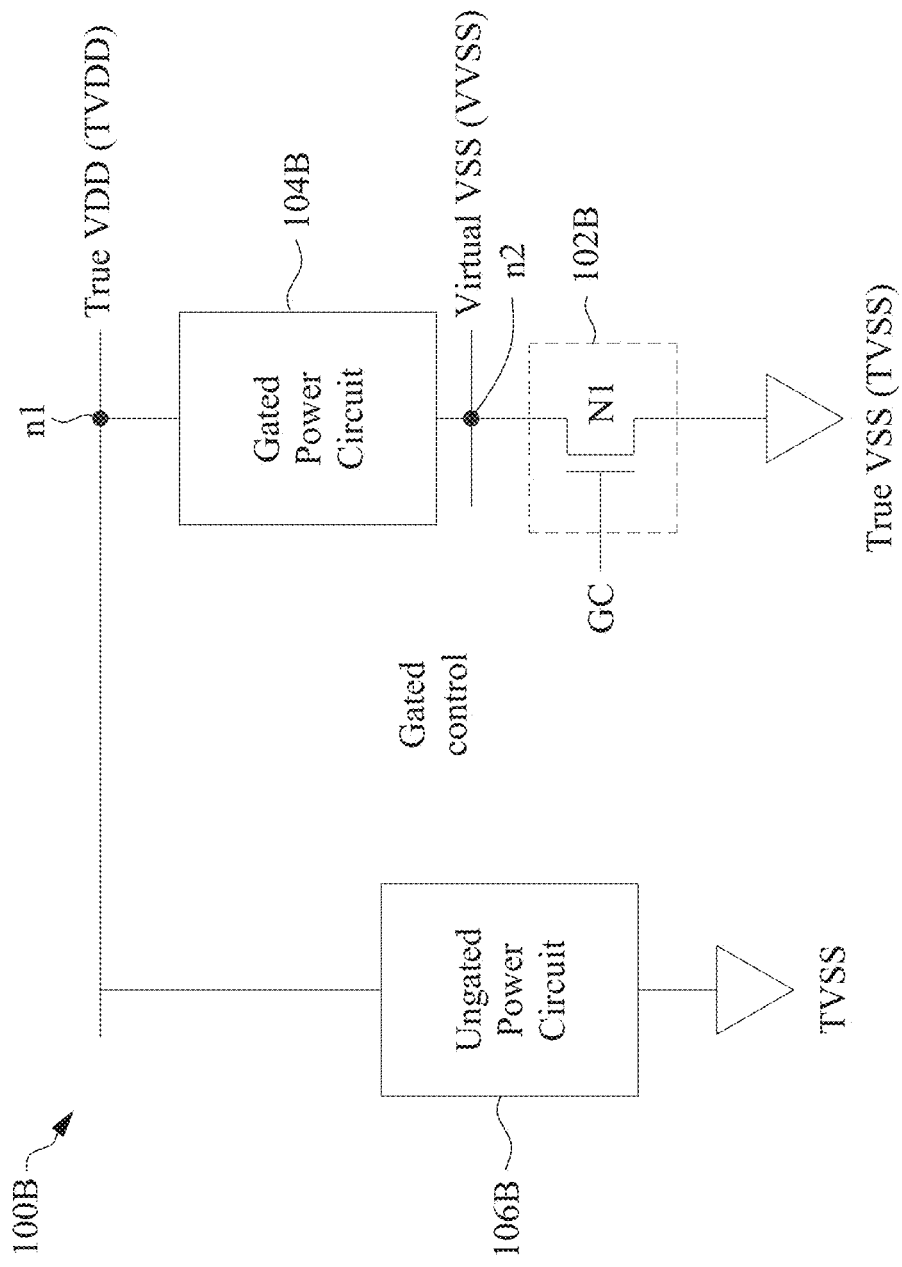

FIG. 1B is a block diagram of an IC 100B, in accordance with some embodiments.

IC 100B includes a footer circuit 102B coupled to a gated power circuit 104B, and an ungated power circuit 106B. Gated power circuit 104B is configured to receive a gated power (e.g., VVSS) from the footer circuit 102B. Ungated power circuit 106B is similar to ungated power circuit 106A, and similar detailed description is omitted.

Footer circuit 102B is coupled to node n2 of a fourth voltage supply VVSS (e.g., virtual supply reference voltage VSS) and third voltage supply TVSS. Footer circuit 102B is configured to receive a third voltage from the third voltage supply TVSS. In some embodiments, the third voltage supply TVSS is a voltage supply positioned external of IC 100B, and is referred to as a true VSS (TVSS). In some embodiments, the third voltage supply TVSS is a voltage supply positioned internal of IC 100B.

Footer circuit 102B is configured to receive a control signal GC. In some embodiments, footer circuit 102B is configured to be turned on based on control signal GC. In some embodiments, footer circuit 102B is configured to be turned on, and configured to provide a fourth voltage to the second node n2, and is referred to as a virtual supply reference voltage (VVSS). The fourth voltage of the fourth voltage supply VVSS is the same as the third voltage of the third voltage supply TVSS. In some embodiments, the fourth voltage of the fourth voltage supply VVSS is different from the third voltage of the third voltage supply TVSS.

Footer circuit 102B is configured to provide the fourth voltage to at least gated power circuit 104B or node n2 responsive to the control signal GC. In some embodiments, based on different power states of the gated power circuit 104B, footer circuit 102B is configured to switch on and thereby provide power to the gated power circuit 104B responsive to the control signal GC, or footer circuit 102B is configured to switch off and thereby cut off power provided to the gated power circuit 104B responsive to the control signal GC. For example, when gated power circuit 104B is in a sleep mode or a standby mode, footer circuit 102B is configured to be turned off, and the power provided to gated power circuit 104B is thereby cut off. For example, when gated power circuit 104B is in an active mode, footer circuit 102B is configured to be turned on, and thereby provides power to gated power circuit 104B. In some embodiments, the control signal GC is received from a power management controller circuit (not shown). Footer circuit 102B is configured to improve the efficiency of IC 100B by reducing the power consumed by footer switch 102B.

Footer circuit 102B includes an N-type metal oxide semiconductor (NMOS) transistor N1. Other types of transistors or numbers of transistors in footer circuit 102B are within the contemplated scope of the present disclosure. A gate terminal of NMOS transistor N1 is configured to receive the control signal GC. A drain terminal of NMOS transistor N1 is coupled with node n2 of the fourth voltage supply VVSS and gated power circuit 104B. A source terminal of NMOS transistor N1 is coupled with the third voltage supply TVSS. NMOS transistor N1 is configured to provide the third voltage to at least gated power circuit 104B or node n2 responsive to the control signal GC. In some embodiments, footer circuit 102B is turned on or off based on the control signal GC and the third voltage of the third voltage supply VVSS.

In some embodiments, at least header circuit 102A of FIG. 1A or PMOS transistor P1 and footer circuit 102B of FIG. 1B or NMOS transistor N1 include one or more nanosheet transistors, nanowire transistors, finFETs, planar transistors, or the like. Other types of transistors or numbers of transistors in header circuit 102A and footer circuit 102B are within the contemplated scope of the present disclosure. In some embodiments, at least header circuit 102A or footer circuit 102B includes one or more diode elements or diode coupled transistors. In some embodiments, at least header circuit 102A or footer circuit 102B includes one or more elements capable of exhibiting switching behavior or function.

Gated power circuit 104B is coupled between node n2 of the fourth voltage supply VVSS and node n1 of the first voltage supply TVDD. Gated power circuit 104B is configured to receive gated power (e.g., the fourth voltage supply VVSS) from footer circuit 102B. Gated power circuit 104B includes one or more transistors, ICs, active or passive devices, or logic circuits configured to operate on the first supply voltage VVSS.

In some embodiments, a logic circuit of at least gated power circuit 104A or 104B includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more active or passive elements include, but are not limited to, transistors and diodes. In some embodiments, transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drain, or the like. Examples of passive elements include, but are not limited to, capacitors, inductors, fuses, and resistors.

FIGS. 2A-2G are diagrams of a layout design 200 of an IC, in accordance with some embodiments. Layout design 200 is a layout diagram of header switch 102A or footer switch 102B of FIGS. 1A-1B. In some embodiments, region 250a is a layout design 200 usable to manufacture a power switch, such as header circuit 102A or footer circuit 102B for use in IC 100A or 100B.

FIGS. 2A-2G are diagrams of corresponding portions 200A-200F of layout design 200, simplified for ease of illustration.

Layout diagram 200 is a layout diagram of integrated circuit 300 of FIGS. 3A-3I.

For ease of illustration, some of the labeled elements of FIGS. 2A-2G are not labelled in each of FIGS. 2A-2G. In some embodiments, layout design 200 includes additional elements not shown in FIGS. 2A-2G.

Portion 200A includes one or more features of layout design 200 of the buried power (BP) level and the via buried power (VBP) level of layout design 200. Portion 200B includes one or more features of layout design 200 of the oxide diffusion (OD) (e.g., active region) level, the metal over diffusion (MD) level, and the via over diffusion (VD) level of layout design 200. Portion 200C includes one or more features of layout design 200 of the metal 0 (M0) level and the via over M0 (VO) level of layout design 200. Portion 200D includes one or more features of layout design 200 of the metal 1 (M1) level of layout design 200. Portion 200E includes one or more features of layout design 200 of the OD level, the VBP level, the VD level, the via over gate (VG) level, and the metal 1 (M1) level of layout design 200. Portion 200F includes one or more features of the OD level, the MD level, the VD level, and the M0 level of layout design 200. Portion 200G includes one or more features of the OD level, the MD level, the POLY level, the VD level, the VG level, and the BV level of layout design 200.

In some embodiments, the term "oxide diffusion" is used which is hereinafter also referred to as "active region" in the remainder of the present disclosure for brevity.

Layout design 200 is usable to manufacture IC 100A and 100B. Layout design 200 includes a region 250a that is usable to manufacture header switch 102A or footer switch 102B. Layout design 200 includes a region 250b that is usable to manufacture gated power circuit 104A or 104B. Layout design 200 includes a region 250c that is usable to manufacture gated power circuit 104A or 104B.

Layout design 200 has a cell boundary 201a that extends in a first direction X and a second direction Y around layout design 200. Layout design 200 has a height 201b, shown along cell boundary 201a in the second direction Y. In some embodiments, the second direction Y is different from the first direction X. In some embodiments, layout design 200 abuts other cell layout designs (not shown) along either of the X direction or the Y direction of cell boundary 201a.

Layout design 200 includes one or more power rail layout patterns 202a, 202b or 202c extending in the first direction X, and being located on a first layout level. In some embodiments, the term "layout pattern" is used which is hereinafter also referred to as "patterns" in the remainder of the present disclosure for brevity.

The one or more power rail patterns 202a, 202b or 202c are collectively referred to as a "set of power rail patterns 202". In some embodiments, the first layout level corresponds to a buried power (BP) level of one or more of layout designs 200 (FIGS. 2A-2G) or integrated circuits 300-900.

The set of power rail patterns 202 is usable to manufacture a corresponding set of power rails 302 of IC 300 (FIGS. 3A-3I). In some embodiments, the set of power rails 302 are located on a back-side 321a of IC 300. In some embodiments, power rail patterns 202a, 202b, 202c of the set of power rail patterns 202 are usable to manufacture corresponding power rails 302a, 302b, 302c of the set of power rails 302 (FIGS. 3A-3I) of IC 300.

In some embodiments, at least power rail pattern 202a, 202b or 202c of the set of power rail patterns 202 is located along corresponding cell boundary 201a of layout design 200. Other configurations, arrangements on other layout levels or quantities of patterns in the set of power rail patterns 202 are within the scope of the present disclosure. In some embodiments, other configurations, arrangements on other layout levels or quantities of patterns in the set of power rail patterns 202 are discussed below with reference sets of power rails 402, 702, and 902 of FIGS. 4A, 7A, and 9A.

In some embodiments, power rail pattern 202b and 202c are located at opposite sides of boundary 201a along the first direction (e.g., X direction). In some embodiments, power rail pattern 202b and 202c are separated from each other in the first direction X. In some embodiments, power rail pattern 202b and 202c are a set of power rail patterns. In some embodiments, power rail pattern 202c is located along cell boundary 201a on an opposite side of portion 200A.

In some embodiments, power rail pattern 202a has an I-shape. In some embodiments, power rail pattern 202a includes a central portion 201a1, a portion 201a2 and a portion 201a3. Central portion 201a1 is coupled to portions 201a2 and 201a3. A first end of central portion 201a1 is coupled to portion 201a2, and a second end of central portion 201a1 is coupled to portion 201a3. Other shapes for power rail pattern 202a are within the scope of the present disclosure.

In some embodiments, other configurations, arrangements on other layout levels or quantities of patterns in the set of power rail patterns 202 are within the scope of the present disclosure. For example, one or more additional power rail patterns is discussed in detail below with reference to sets of power rails 402, 702 and 902 of FIGS. 4A, 7A and 9A.

Layout design 200 further includes one or more active region patterns 204a, 204b, 204c, 204d, 204e, and 204f (collectively referred to as a "set of active region patterns 204") extending in the first direction X. Active region patterns 204a, 204b, 204c, 204d, 204e and 204f of the set of active region patterns 204 are separated from one another in the second direction Y. The set of active region patterns 204 is usable to manufacture a corresponding set of active regions 304 (FIGS. 3A-3I) of IC 300. In some embodiments, the set of active regions 304 are located on the front-side 321b of IC 300. In some embodiments, active region patterns 204a, 204b, 204c, 204d, 204e, and 204f of the set of active region patterns 204 are usable to manufacture corresponding active regions 304a, 304b, 304c, 304d, 304e, and 304f of the set of active regions 304 (FIGS. 3A-3I) of IC 300.

In some embodiments, the set of active region patterns 204 is referred to as an oxide diffusion (OD) region which defines the source or drain diffusion regions of at least IC 300 (FIGS. 3A-3I).

In some embodiments, one or more of active region pattern 204a, 204b, 204c or 204d of the set of active region patterns 204 is usable to manufacture source and drain regions of PMOS transistors of IC 300, and active region patterns 204e and 204f of the set of active region patterns 204 are usable to manufacture source and drain regions of NMOS transistors of IC 300. In some embodiments, one or more of active region pattern 204a, 204b, 204c or 204d of the set of active region patterns 204 is usable to manufacture source and drain regions of NMOS transistors of IC 300, and active region patterns 204e and 204f of the set of active region patterns 204 is usable to manufacture source and drain regions of PMOS transistors of IC 300.

Active region pattern 204e and 204b are separated from each other in the first direction X in a region 252a. Active region pattern 204f and 204c are separated from each other in the first direction X in region 252a. In a region 252b, active region pattern 204b and 204c are separated from other active regions (not shown, but adjacent to region 252b) in the first direction X.

In some embodiments, the set of active region patterns 204 is located on a second layout level. In some embodiments, the second layout level is above the first layout level. In some embodiments, the second layout level corresponds to an active level or an OD level of one or more of layout designs 200 or IC 300 (FIGS. 3A-3I). In some embodiments, the BP or BS level is below the OD level.

In some embodiments, other configurations, arrangements on other layout levels or quantities of patterns in the set of active region patterns 204 are within the scope of the present disclosure. In some embodiments, there may be more or fewer active region patterns, such as in FIG. 5B and active regions 504a, 504b, and 504c.

Layout design 200 further includes one or more contact patterns 206a, 206b, 206c, or 206d (collectively referred to as a "set of contact patterns 206") extending in the second direction Y. Each of the contact patterns of the set of contact patterns 206 is separated from an adjacent contact pattern of the set of contact patterns 206 in the first direction X. In some embodiments, contact patterns 206a and 206b alternate along active region 204a, 204b, 204c and 204d, where contact patterns 206b are shown as being below via over diffusion (VD) patterns 210a. In some embodiments, contact patterns 206c and 206b alternate along active regions 204e and 204f, where at least one contact pattern 206d is shown as being below VD pattern 210a.

The set of contact patterns 206 is usable to manufacture a corresponding set of contacts 306 (FIGS. 3A-3I) of IC 300. In some embodiments, contact pattern 206a, 206b, 206c or 206d of the set of contact patterns 206 is usable to manufacture corresponding contact 306a, 306b, 306c, or 306d of the set of contacts 306. In some embodiments, the set of contact patterns 206 is also referred to as a set of metal over diffusion (MD) patterns.

In some embodiments, at least one of contact pattern 206a or 206b of the set of contact patterns 206 is usable to manufacture source and drain terminals of one of PMOS or NMOS transistors of IC 300, and at least one contact pattern 206c or 206d of the set of contact patterns 206 is usable to manufacture source and drain terminals of one of NMOS or PMOS transistors of IC 300.

In some embodiments, the set of contact patterns 206 overlap the set of active region patterns 204. In some embodiments, at least contact pattern 206a or 206b is over active region patterns 204a, 204b, 204c, or 204d. In some embodiments, at least contact pattern 206c or 206d is over active region patterns 204e or 204f. In some embodiments, contact patterns 206a or 206b extend in the second direction (Y direction) from a lower boundary 201a in the first direction (X direction) to the upper boundary 201a in the first direction (X direction). Thus, in some embodiments, contact patterns 206a and 206b extend over all of active region patterns 204a, 204b, 204c, or 204d.

In some embodiments, the set of contact patterns 206 is located on a third layout level. In some embodiments, the third layout level is different from the first layout level and the second layout level. In some embodiments, the third layout level is above the first layout level and the second layout level. In some embodiments, a first portion of the third layout level is above the first layout level and the second layout level, and a second portion of the of the third layout level is below the first layout level and the second layout level. In some embodiments, the third layout level corresponds to contact level or the MD level of one or more of layout designs 200 (FIGS. 2A-2G) or IC 300 (FIGS. 3A-3I).

Layout design 200 further includes a set of cut feature patterns 260.

The set of cut feature patterns 260 extends in the first direction X. The set of cut feature patterns 260 includes at least cut feature layout pattern 260a, 260b, 260c, 260d, 260e, 260f, 260g or 260h. In some embodiments, each cut feature layout pattern 260a, 260b, 260c, 260d, 260e, 260f, 260g or 260h of the set of cut feature patterns 260 is separated from an adjacent cut feature layout pattern in the second direction Y. The set of cut feature patterns 260 is located on the third layout level.

In some embodiments, the set of cut feature patterns 260 overlaps at least a portion of a pattern of the set of contact patterns 206. In some embodiments, the set of cut feature patterns 260 overlaps other underlying layout patterns (not shown) of other layout levels (e.g., Active, MD, BP or the like) of layout design 200.

Figure 11:
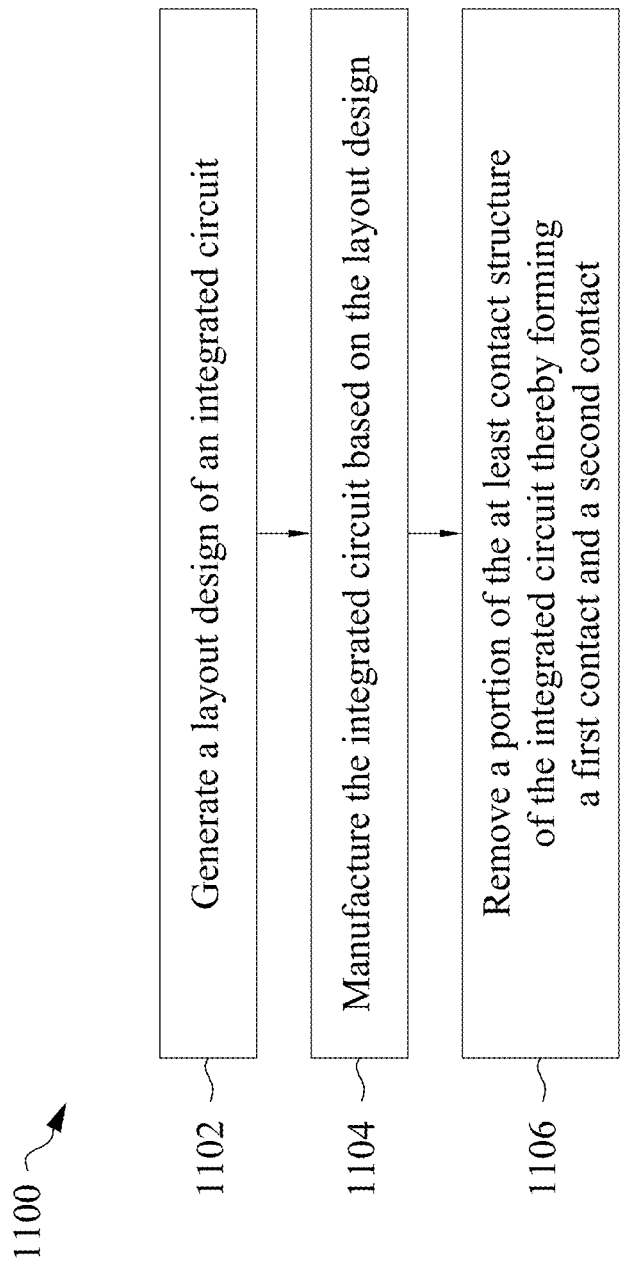
FIG. 11 is a flowchart of a method of generating a layout design of an IC in accordance with some embodiments.

In some embodiments, cut feature patterns 260a, 260b, 260c, 260d, 260e, 260f, 260g or 260h identify corresponding locations of corresponding portions of corresponding contact 360a, 360b, 360c, 360d, 360e, 360f, 360g or 360h that are removed in operation 1106 of method 1100 (FIG. 11).

Cut feature pattern 260c, 260d, 260e is separated from corresponding cut feature pattern 260f, 260g or 260h in the first direction X.

Cut feature patterns 260a and 260b overlap contact patterns 206a, 206b, 206c, 206d. In region 250a, cut feature patterns 260c, 260d, 260e, 260f, 260g and 260h do not overlap contact patterns 206a, 206b, 206c, 206d.

In region 250b, each of cut feature pattern 260a, 260b, 260c, 260d, 260e overlap contact pattern 206c, 206d. In region 250c, each of cut feature pattern 260a, 260b, 260f, 260g, 260h overlap contact pattern 206c, 206d.

Figure 2A:
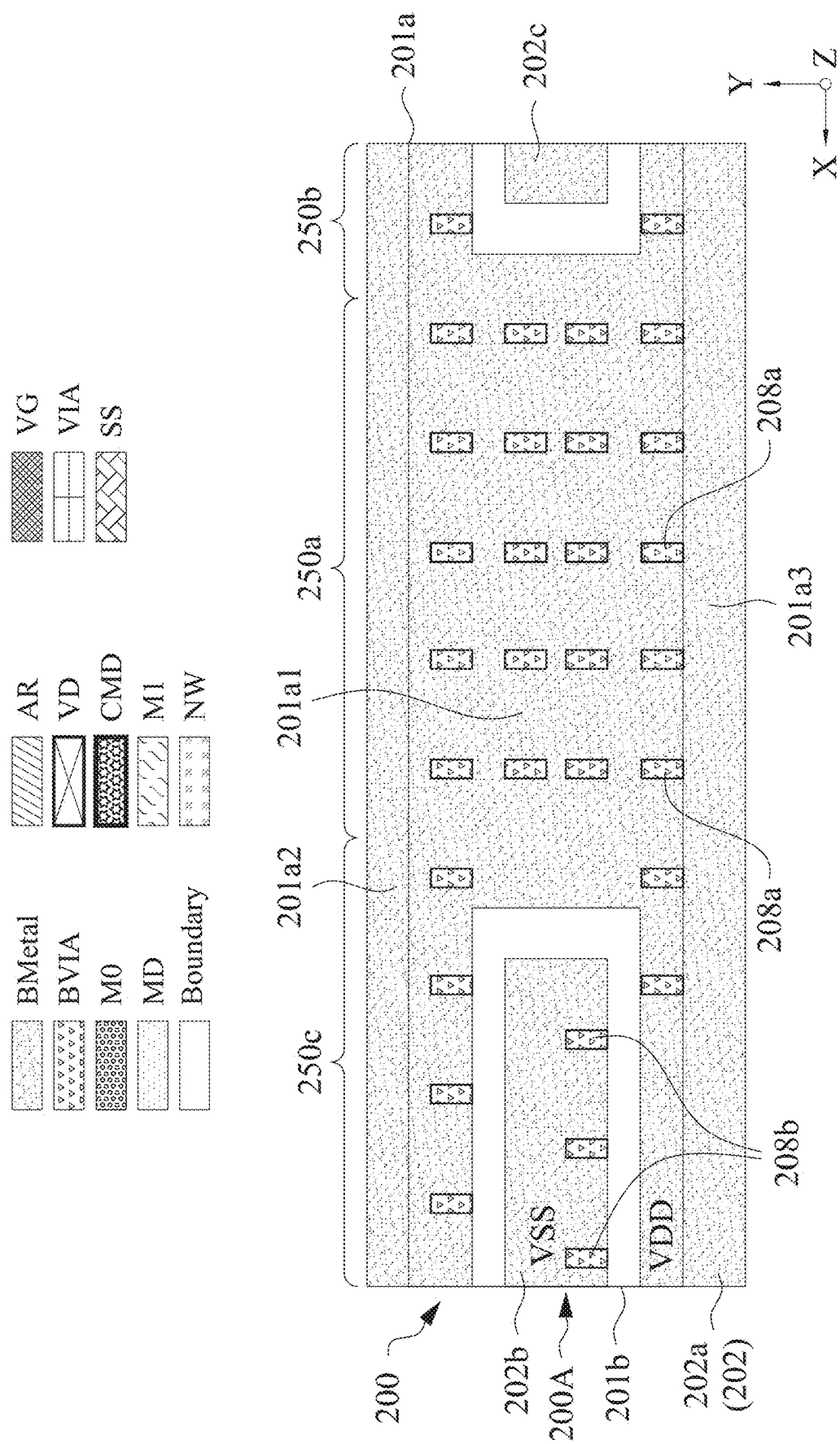
FIGS. 2A-2G are diagrams of a layout design of an IC, in accordance with some embodiments.
Figure 2B:
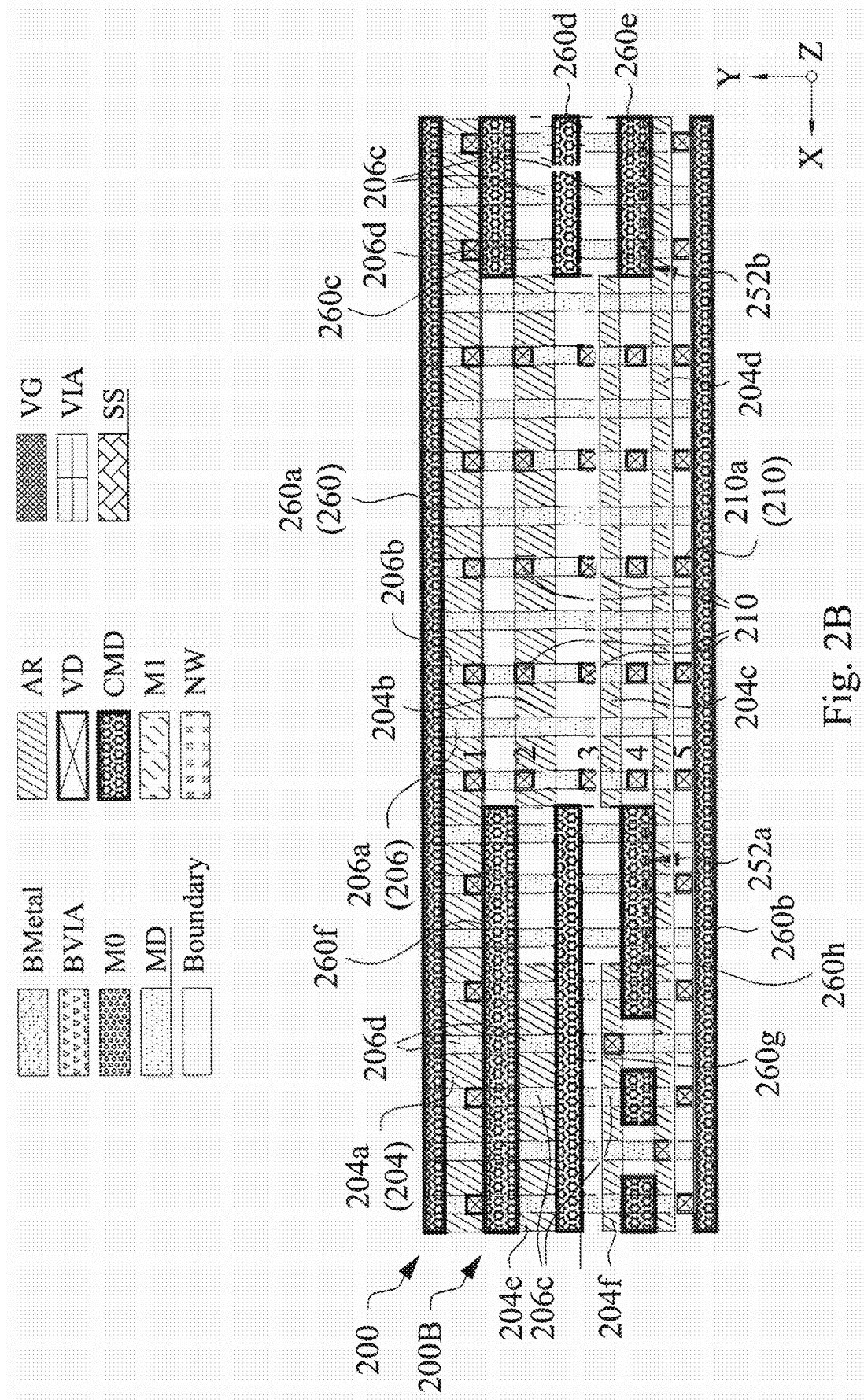
Figure 2C:
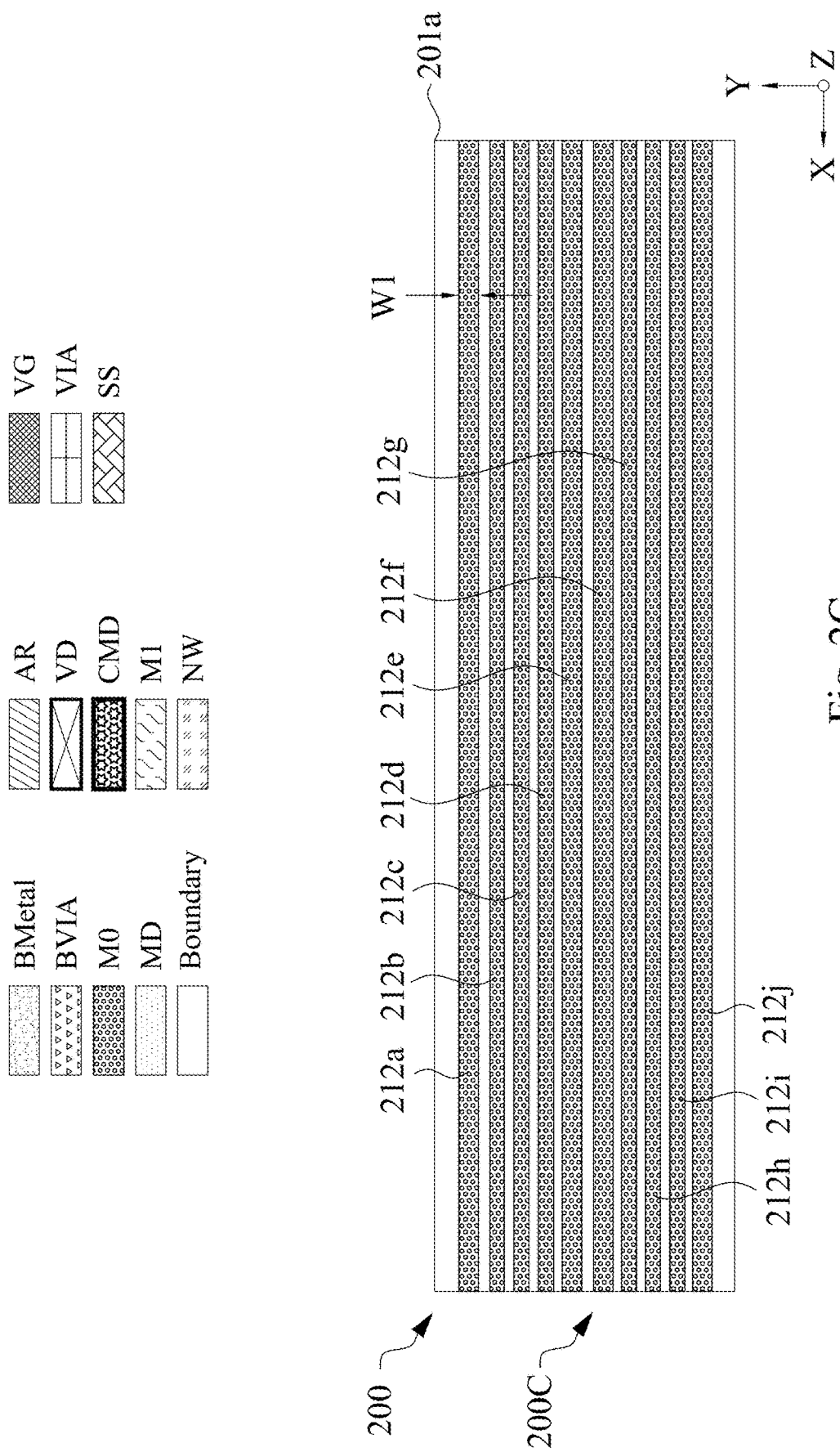
Figure 2D:
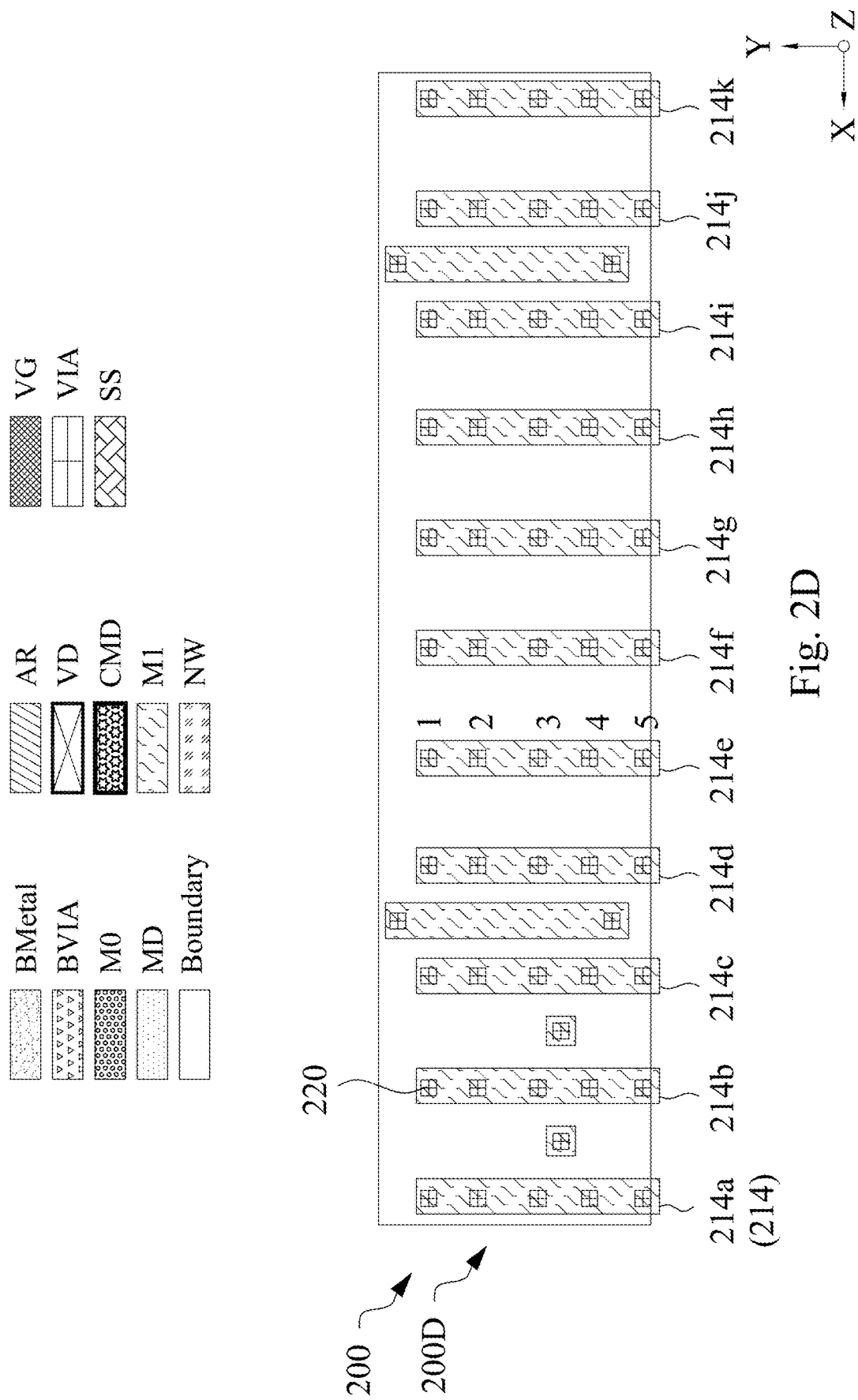
Figure 2E:
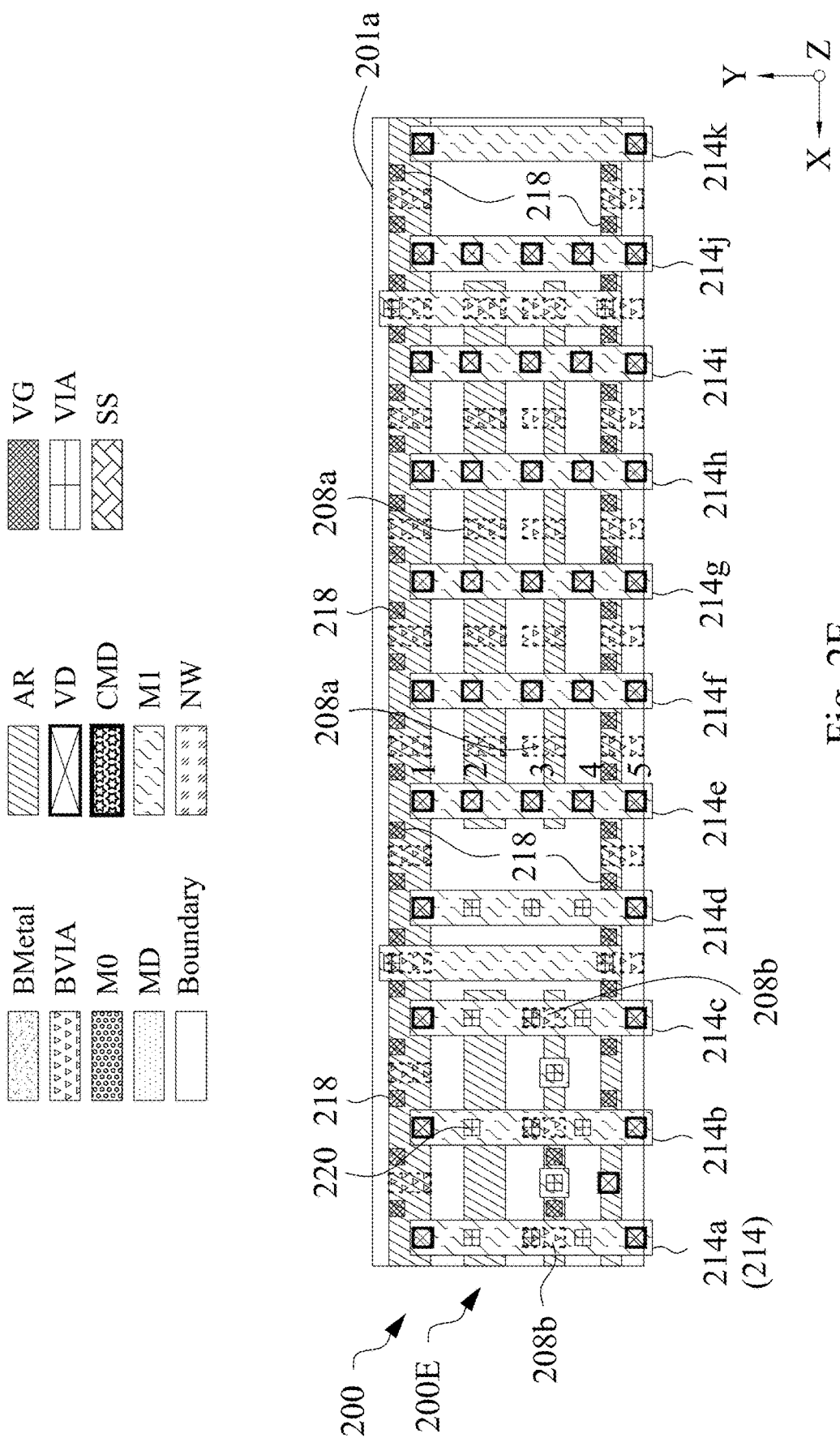
Figure 2F:
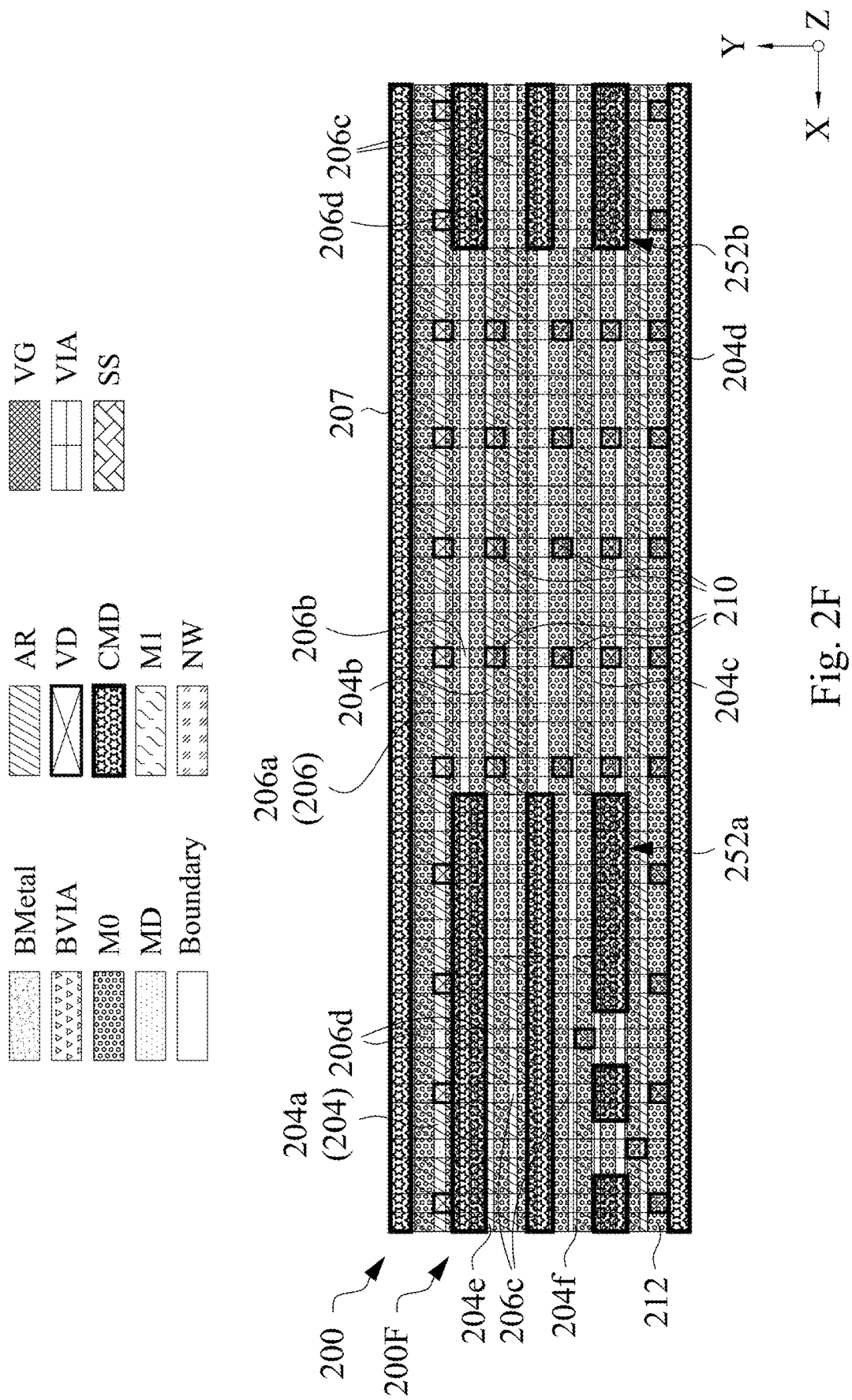
Figure 2G:
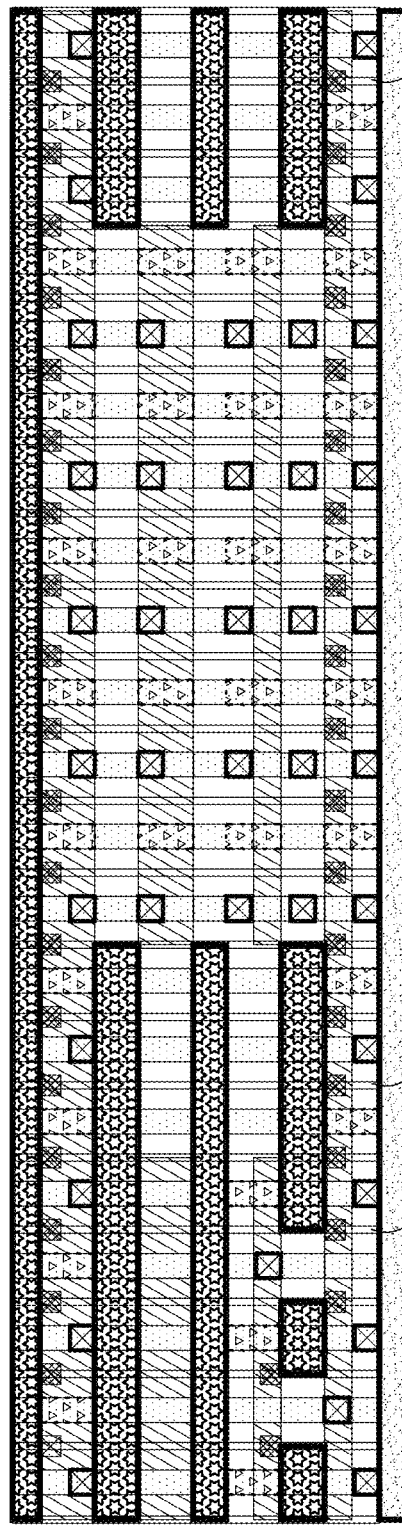

Cut feature pattern 260h is shown in FIG. 2B as including multiple portions separated from each other in the first direction X. In some embodiments, cut feature pattern 260h includes a single pattern. In some embodiments, one or more of 260a, 260b, 260c, 260d, 260f, 260g or 260h include multiple portions separated from each other in the first direction X.

Other configurations or quantities of patterns in the set of cut feature patterns 260 are within the scope of the present disclosure.

In some embodiments, other configurations, arrangements on other layout levels or quantities of patterns in the set of contact patterns 206 are within the scope of the present disclosure.

Layout design 200 further includes one or more via patterns 208a or 208b (collectively referred to as a "set of via patterns 208"). The set of via patterns 208 is usable to manufacture a corresponding set of vias 308 (FIGS. 3A-3I). In some embodiments, via patterns 208a or 208b of the set of via patterns 208 are usable to manufacture corresponding vias 308a or 308b of the set of vias 308 (FIGS. 3A-3I) of IC 300.

In some embodiments, the set of via patterns 208 are between the set of power rail patterns 202 and the set of active region patterns 204.

In some embodiments, set of via patterns 208 are positioned at a via buried power (VBP) level of one or more of layout designs 200 (FIGS. 2A-2G) or IC 300 (FIGS. 3A-3I). In some embodiments, the VBP level is between the BP level and at least the OD level or the MD level. In some embodiments, the VBP level is between the first layout level and at least the second layout level or the third layout level. Other layout levels are within the scope of the present disclosure.

In some embodiments, via pattern 208a is between power rail pattern 202a and active region patterns 204a, 204b, 204c, and 204d. Via pattern 208b is between power rail pattern 202b and active region pattern 204f. In some embodiments, via pattern 208b is between power rail pattern 202b and active region pattern 204e. In some embodiments, at least one via pattern of the set of via patterns 208 is not included in layout design 200.

In some embodiments, other configurations, arrangements on other layout levels or quantities of patterns in the set of via patterns 208 are within the scope of the present disclosure.

In some embodiments, layout design 200 further includes one or more gate patterns (shown in FIGS. 5A-5B, 7B, 8B, 9B and 10B). Gate patterns (shown in FIG. 5B, and collectively referred to as a "set of gate patterns 216"), not shown in layout design 200 for clarity of the FIGS. and brevity for discussion of layout design 200, extend in the second direction Y. Each of the gate patterns of the set of gate patterns 216 is separated from an adjacent gate pattern of the set of gate patterns 216 in the first direction X by a first pitch (not shown).

In some embodiments, the set of gate patterns 216 is usable to manufacture a corresponding set of gates for IC 300. In some embodiments, gate patterns of the set of gate patterns 216 are usable to manufacture corresponding gates for IC 300.

In some embodiments, the set of gate patterns 216 are above the set of power rail patterns 202 and the set of active region patterns 204. The set of gate patterns 216 are positioned on a fourth layout level (POLY) different from the first layout level and the second layout level. In some embodiments, the fourth layout level is the same as the third layout level. In some embodiments, the fourth layout level is different from the third layout level.

In some embodiments, other configurations, arrangements on other layout levels or quantities of patterns in the set of gate patterns 216 are within the scope of the present disclosure.

Layout design 200 further includes one or more conductive feature patterns 212a, 212b, 212c, 212d, 212e, 212f, 212g, 212h, 212i, and 212j (collectively referred to as a "set of conductive feature patterns 212") extending in the first direction X, and being located on a fifth layout level. In some embodiments, the fifth layout level is different from the first layout level, the second layout level, the third layout level and the fourth layout level. In some embodiments, the fifth layout level corresponds to a metal 0 (M0) level of one or more of layout designs 200 or IC 300 (FIGS. 2A-2G or 3A-3I).

In some embodiments, the M0 level is above the OD level, the BP level, the MD level and the POLY level.

In some embodiments, the set of conductive feature patterns 212 is usable to manufacture a corresponding set of conductive features 312 (FIGS. 3A-3I) of IC 300. Conductive feature patterns 212a, 212b, 212c, 212d, 212e, 212f, 212g, 212h, 212i, and 212j are usable to manufacture corresponding conductive features 312a, 312b, 312c, 312d, 312e, 312f, 312g, 312h, 312i, and 312j (FIGS. 3A-3I).

The set of conductive feature patterns 212 overlaps at least one power rail pattern of the set of power rail patterns 202.

In some embodiments, at least pattern 212a, 212e, 212f, or 212j of the set of conductive feature patterns 212 has a width W1 in the second direction Y. Other widths for the set of conductive feature patterns 212 are within the scope of the present disclosure. In some embodiments, at least one conductive feature pattern of the set of conductive feature patterns 212 has a width in the second direction Y different from width W1.

In some embodiments, conductive feature patterns 212a, 212b, 212c, 212d, 212e, 212f, 212g, 212h, 212i, and 212j of the set of conductive feature patterns 212 correspond to 10

M0 routing tracks in layout design 200. Other numbers of M0 routing tracks are within the scope of the present disclosure.

In some embodiments, other configurations, arrangements on other layout levels or quantities of patterns in the set of conductive feature patterns 212 are within the scope of the present disclosure. In some embodiments, other configurations, arrangements on other layout levels or quantities of patterns in layout design 200 are within the scope of the present disclosure.

In some embodiments, the set of conductive feature patterns 212 is an upper metal layer track located on the M0 level, metal 1 (M1) level, or the like of the front-side of layout design 200 or IC 300. In some embodiments, when compared with other approaches, the set of power rail patterns 202, or a portion of the set of power rail patterns 214, are moved from the front-side of layout design 200 or IC 300 to the back-side of layout design 200 or IC 300. In some embodiments, moving the set of power rail patterns 202 from the front-side of layout design 200 or IC 300 to the back-side of layout design 200 or IC 300, results in layout design 200 or IC 300 using at least one less upper metal layer track (including the set of conductive feature patterns 212), resulting in a layout design with a parallel power routing between the front-side and backside of layout design 200 or IC 300 as compared with other approaches.

In some embodiments, since at least one upper metal layer track in the set of conductive feature patterns 212 is reduced, the width of one or more conductive feature patterns in the set of conductive feature patterns 212 is increased, yielding a layout design 200 or IC 300 with better current resistance (IR) compared with other approaches. In some embodiments, by utilizing the set of power rail patterns 202 of the present disclosure, the gate density of the set of gate patterns 216 is increased compared with other approaches. In some embodiments, by utilizing at least the set of power rail patterns 202 of the present disclosure, layout design 200 or IC 300 offers more routing flexibility and increases routing resources compared to other approaches.

Layout design 200 further includes a set of power rail patterns 214 located on the front-side of layout design 200. In some embodiments, the set of power rail patterns 214 includes power rail patterns 214a, 214b, 214c, 214d, 214e, 214f, 214g, 214h, 214i, 214j and 214k (collectively referred to as a "set of power rail patterns 214") extending in the second direction Y, and being located on a sixth layout level. In some embodiments, the sixth layout level is different from the first layout level, the second layout level, the third layout level, the fourth layout level, and the fifth layout level. In some embodiments, the sixth layout level corresponds to a metal 1 (M1) level of one or more of layout designs 200 or IC 300 (FIGS. 2A-2G or 3A-3I).

In some embodiments, the M1 level is above the OD level, the BP level, the MD level, the POLY level and the M0 level.

In some embodiments, the set of power rail patterns 214 is usable to manufacture a corresponding power rail 314 (FIGS. 3A-3I) of IC 300. Power rail patterns 214a, 214b, 214c, 214d, 214e, 214f, 214g, 214h, 214i, 214j and 214k are usable to manufacture corresponding power rails 314a, 314b, 314c, 314d, 314e, 314f, 314g, 314h, 314i, 314j and 314k (FIGS. 3A-3I.)

In some embodiments, the set of power rail patterns 214 overlaps at least one power rail pattern of the set of power rail patterns 202, at least one active region pattern 204, at least one set of conductive feature patterns 212, and at least one contact pattern of the set of contact patterns 206. In some embodiments, set of power rail patterns 214 overlaps other underlying patterns (not shown for ease of illustration) of other layout levels of layout design 200. For example, portion 200D only shows via patterns 220 located below the set of power rail patterns 214 for ease of illustration.

In some embodiments, set of power rail patterns 214a, 214b, 214c, 214d, 214e, 214f, 214g, 214h, 214i, 214j and 214k of set of power rail pattern 214 correspond to 11 M1 routing tracks in layout design 200. Other numbers of M1 routing tracks are within the scope of the present disclosure.

In some embodiments, other configurations, arrangements on other layout levels or quantities of patterns in the set of power rail patterns 214 are within the scope of the present disclosure. In some embodiments, other configurations, arrangements on other layout levels or quantities of patterns in layout design 200 are within the scope of the present disclosure.

In some embodiments, the set of power rails 214 is an upper metal layer track located on the metal 1 (M1) level, or the like of the front-side 321b of layout design 200 or IC 300.

Layout design 200 further includes one or more via over gate patterns (VG) 218 (collectively referred to as a "set of VG patterns 218"). The set of VG patterns 218 is usable to manufacture a corresponding set of VGs 218 (FIGS. 2A-2G). In some embodiments, VG patterns 218 are usable to manufacture corresponding VGs 318 (FIGS. 3A-3I) of IC 300.

In some embodiments, VG patterns 218 are between the set gate patterns 216 and set of conductive feature patterns 212. In some embodiments, set of VG patterns 218 are positioned at the VG level of one or more of layout designs 200 (FIGS. 2A-2G) or IC 300 (FIGS. 3A-3I). In some embodiments, the VG level is between the gate level and at least the M0 level or the M1 level. In some embodiments, the VG level is between the fourth layout level and at least the fifth layout level or the sixth layout level. Other layout levels are within the scope of the present disclosure.

In some embodiments, VG pattern 218 is between gate pattern 216 and conductive feature patterns 212a and 212i.

In some embodiments, other configurations, arrangements on other layout levels or quantities of patterns in the VG patterns 218 are within the scope of the present disclosure.

Layout design 200 further includes one or more via over diffusion (VD) patterns 210 (collectively referred to as a "set of vias/VD patterns 210"). In some embodiments, the set of via/VD patterns 210 are usable to manufacture corresponding set of vias/VDs 310 (FIGS. 3A-3I) of IC 300.

In some embodiments, the set of via/VD patterns 210 are between the set of contact patterns 206 and the set of conductive feature patterns 212. In some embodiments, set of via/VD patterns 210 are positioned between the MD level and the M0 level of one or more of layout designs 200 (FIGS. 2A-2G) or IC 300 (FIGS. 3A-3I). In some embodiments, the VD level is between the MD level and at least the M0 level. In some embodiments, the VD level is between the third layout level and at least the fifth layout level. Other layout levels are within the scope of the present disclosure.

In some embodiments, via pattern 210 is between contact pattern 206 and conductive feature patterns 212b, 212d, 212g, and 212j. In some embodiments, at least one via pattern of the set of via patterns 210 is not included in layout design 200. In some embodiments, other configurations, arrangements on other layout levels or quantities of patterns in the set of via patterns 210 are within the scope of the present disclosure.

FIGS. 3A-3I are diagrams of an IC 300, in accordance with some embodiments.

Figure 3A:
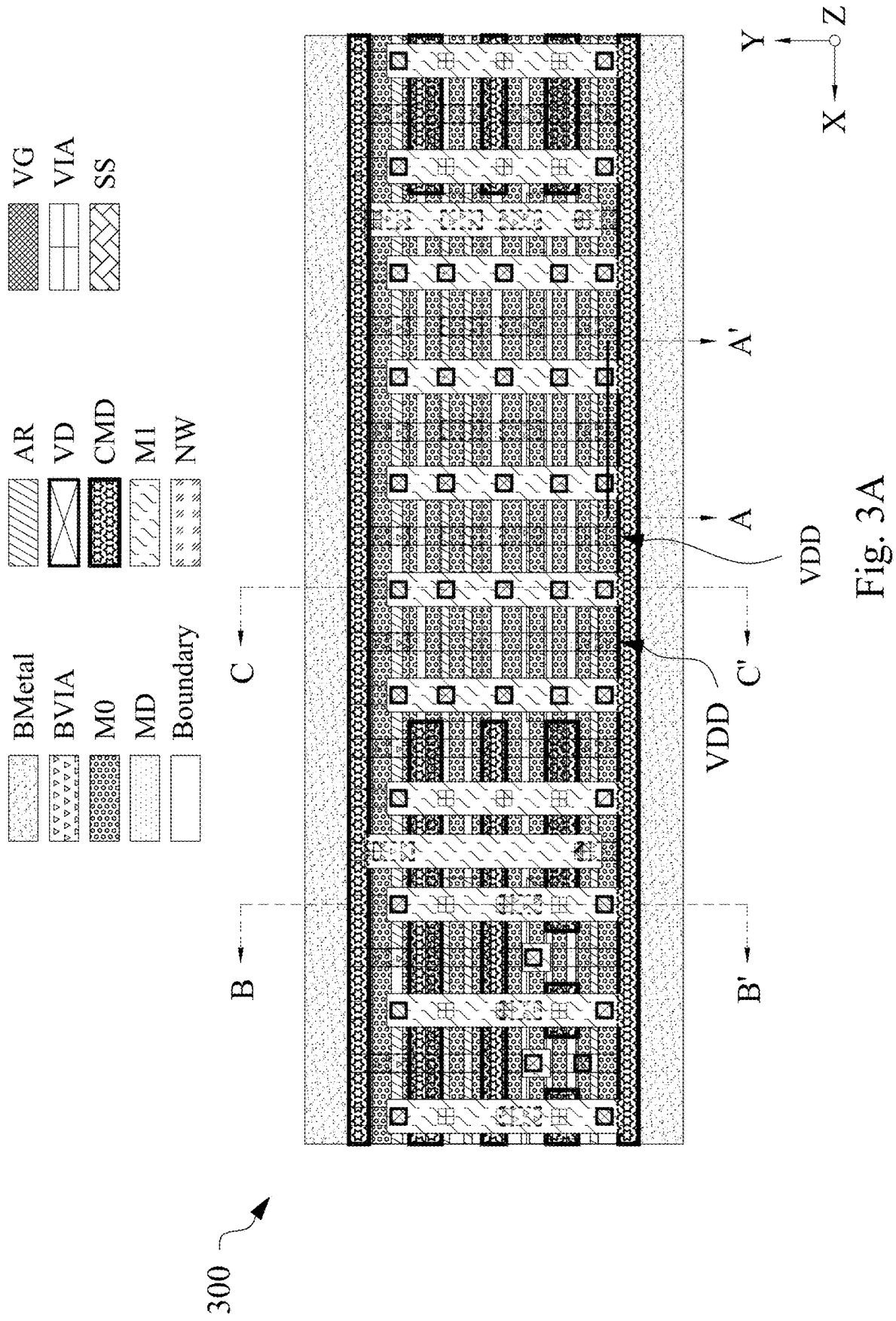
FIGS. 3A-3I are diagrams of an IC, in accordance with some embodiments.
Figure 3B:
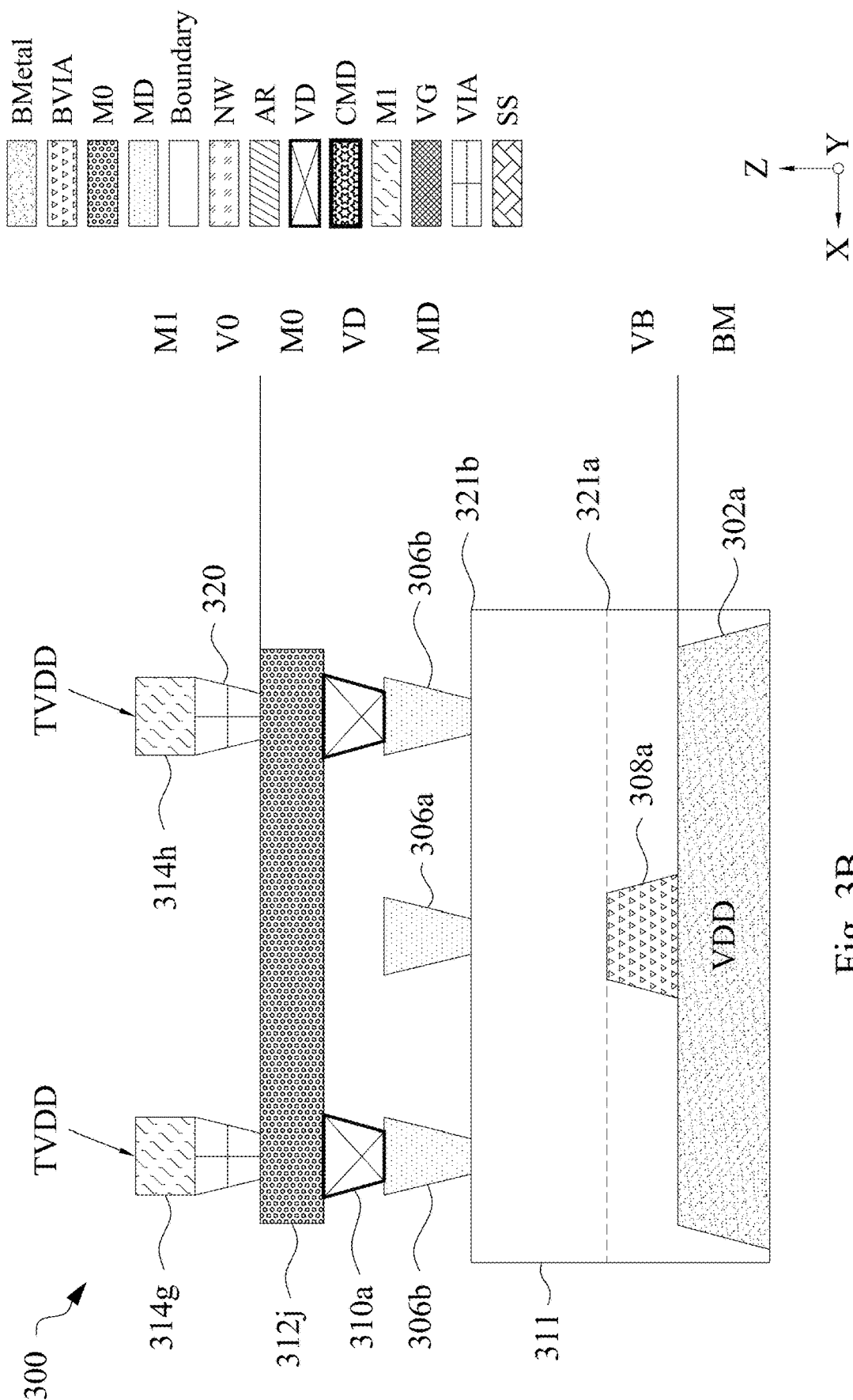
Figure 3C:
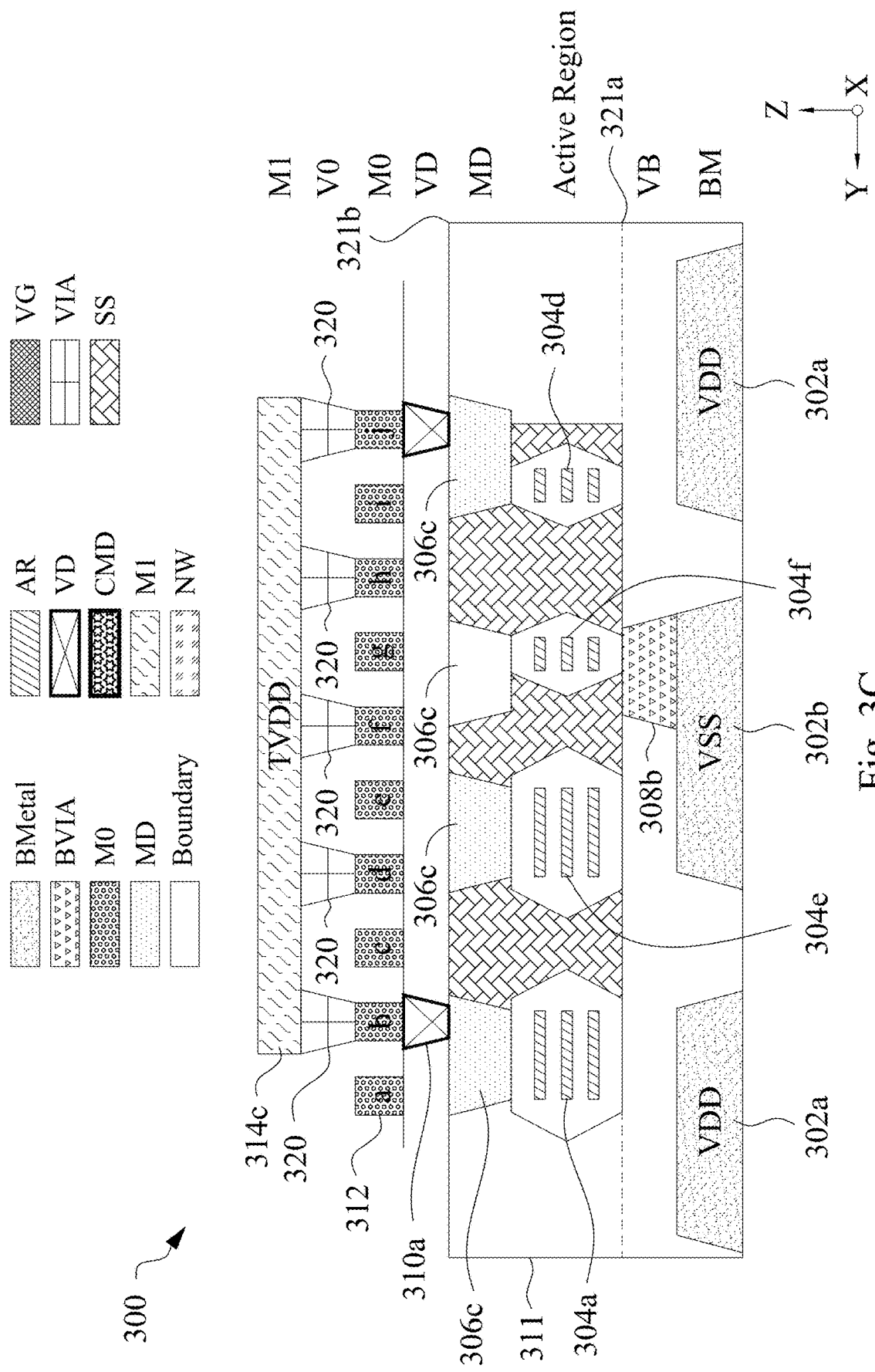
Figure 3D:
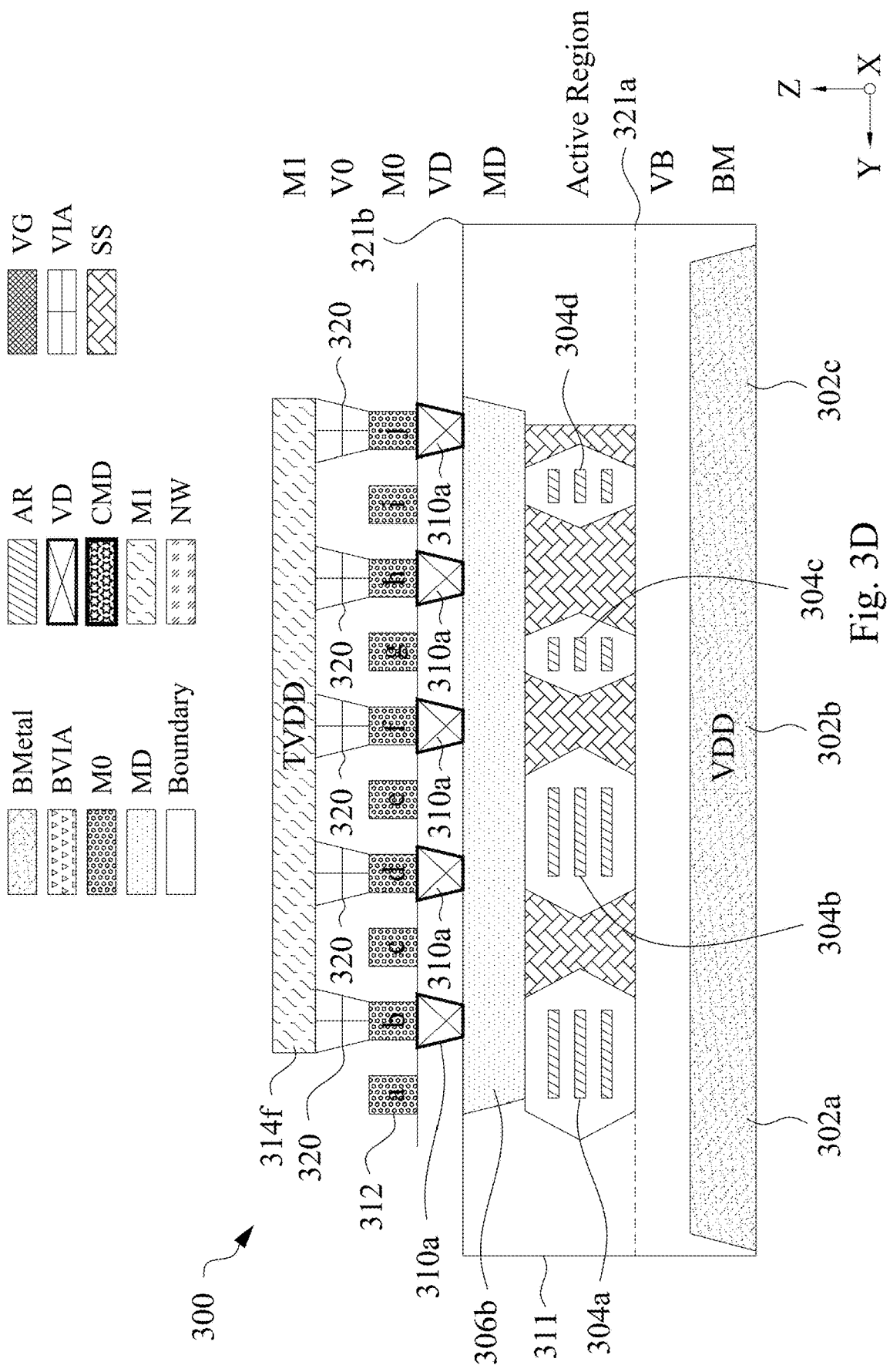

FIG. 3A is a top view of IC 300, in accordance with some embodiments. FIG. 3B is a cross-sectional view of IC 300 as intersected by plane A-A', in accordance with some embodiments. FIG. 3C is a cross-sectional view of IC 300 as intersected by plane B-B', in accordance with some embodiments. FIG. 3D is a cross-sectional view of IC 300, in accordance with some embodiments. FIG. 3D is a cross-sectional view of IC 300 as intersected by plane C-C', in accordance with some embodiments. Components that are the same or similar to those in one or more of FIGS. 2A-2G are given the same reference numbers, and similar detailed description thereof is thus omitted.

FIGS. 3E-3I are diagrams of corresponding portions 300A, 300B, 300C, 300E and 300F of IC 300 manufactured by corresponding portions 200A, 200B, 200C, 200E and 200G of layout design 200 of FIGS. 2A-2C, 2E and 2G, simplified for ease of illustration. FIG. 3A is a diagram of IC 300 and includes portions 300A, 300B, 300C, and 300D, simplified for ease of illustration.

In some embodiments, IC 300 is manufactured by layout design 200. Structural relationships including alignment, lengths and widths, as well as configurations and layers of IC 300 are similar to the structural relationships and configurations and layers of layout design 200 of FIGS. 2A-2G, and similar detailed description will not be described in at least FIGS. 3A-3I, for brevity.

In some embodiments, IC 300 includes at least set of power rails 302, set of active regions 304, set of contacts 306, set of vias 308, set of vias 310, set of conductive features 312, set of power rails 314, set of vias 320 or set of gates 716.

In some embodiments, set of power rails 302 include one or more of power rails 302a, 302b, or 302c. In some embodiments, the set of power rails 302 is configured to provide a first supply voltage of a voltage supply VDD and a second supply voltage of a reference voltage supply VSS to the IC, such as IC 300. In some embodiments, the first supply voltage is different from the second supply voltage. In some embodiments, where region 350a is a header switch, the set of power rails 302 are configured to provide a supply voltage of a voltage supply VVDD and a supply voltage of a reference voltage supply VSS to an IC, such as at least region 350b and 350c. In some embodiments, where region 350a is a footer switch, the set of power rails 302 is configured to provide a supply voltage of a voltage supply VVSS and a supply voltage of a reference voltage supply TVSS to an IC, such as at least region 350b and 350c.

In some embodiments, power rail 302a is configured to provide the supply voltage of voltage supply VDD, and power rail 302b is configured to provide the supply voltage of reference voltage supply VSS. In some embodiments, power rail 302a is configured to provide the supply voltage of reference voltage supply VSS, and power rail 302b is configured to provide the supply voltage of voltage supply VDD. In some embodiments, the set of power rails 302 are configured to provide power to the set of active regions 304.

In some embodiments, power rail 302a is configured to provide the supply voltage of voltage supply VVSS, and power rail 302b is configured to provide the supply voltage of voltage supply VDD. In some embodiments, power rail 302a is configured to provide the supply voltage of reference voltage supply TVSS, and power rail 302b is configured to provide the supply voltage of voltage supply VVSS.

The set of power rails 302 are located on a back-side 321a of a substrate 311 of IC 300. The set of active regions 304 are located on a front-side 321b of substrate 311 of IC 300. In some embodiments, the front-side 321b of IC 300 is opposite from the back-side 321a of IC 300 in a third direction Z. In some embodiments, by positioning set of power rails 302 on back-side 321a of IC 300, results in IC 300 having a reduced resistivity as power to IC 300 is routed in a parallel manner with respect to set of power rails 314.

Power rail 302a has the same structural features and shape as power rail pattern 202a, and similar detailed description is omitted. In some embodiments, power rail 302a has an I-shape. Power rail 302a further includes an opening 317b where power rail 302b is positioned within. Power rail 302a further includes an opening 317c where power rail 302c is positioned within. Opening 317b separates power rail 302b and power rail 302a, and opening 317c separates power rail 302c and power rail 302a. In some embodiments, at least opening 317b or 317c includes an insulator material or a dielectric to electrically isolate power rail 302a from power rails 302b and 302c from each other.

Other configurations, arrangements on other layout levels or quantities of structures in set of power rails 302 are within the scope of the present disclosure.

In some embodiments, set of active regions 304 include one or more of active regions 304a, 304b, 304c, 304d, 304e, and 304f in substrate 311. In some embodiments, set of active regions 304 corresponds to planar structures (not shown) of planar transistors. In some embodiments, set of active regions 304 corresponds to fin structures (not shown) of finFETs. In some embodiments, set of active regions 304 corresponds to nanosheet structures (not shown) of nanosheet transistors. In some embodiments, set of active regions 304 corresponds to nanowire structures (not shown) of nanowire transistors. In some embodiments, set of active regions 304 include drain regions and source regions grown by an epitaxial growth process. In some embodiments, set of active regions 304 include drain regions and source regions that are grown with an epitaxial material at the corresponding drain regions and source regions.

In some embodiments, active regions 304e and 304f of set of active regions 304 corresponds to source and drain regions of transistors of gated power circuits 104A, 104B of ICs 300, 400, 600, 700, 800 and 900. In some embodiments, portions of active regions 304a and 304b in regions 350b and 350c corresponds to source and drain regions of transistors of gated power circuits 104A, 104B of ICs 300, 400, 600, 700, 800 and 900. In some embodiments, portions of active regions 304a and 304b in region 350a corresponds to source and drain regions of transistors of header 102A or footer 102B of ICs 300, 400, 600, 700, 800 and 900.

In some embodiments, active regions 304e and 304f of set of active regions 304 corresponds to source and drain regions of NMOS transistors of ICs 300, 400, 600, 700, 800 and 900, and active regions 304a, 304b, 304c, 304d of set of active regions 304 corresponds to source and drain regions of PMOS transistors of ICs 300, 400, 600, 700, 800 and 900.

In some embodiments, active regions 304e and 304f of set of active regions 304 corresponds to source and drain regions of PMOS transistors of ICs 300, 400, 600, 700, 800 and 900, and active regions 304a, 304b, 304c, 304d of set of active regions 304 corresponds to source and drain regions of NMOS transistors of ICs 300, 400, 600, 700, 800 and 900.

Active region 304e and 304b are separated from each other in the first direction X in a region 352a. Active region 304f and 304c are separated from each other in the first direction X in region 352a. In a region 352b, active regions 204b and 204c are separated from other active regions (not shown, but adjacent to region 352b) in the first direction X.

In some embodiments, the set of active regions 304 is above set of power rails 302. Other configurations, arrangements on other layout levels or quantities of structures in set of active regions 304 are within the scope of the present disclosure.

In some embodiments, set of contacts 306 includes one or more of contacts 306a, 306b, 306c or 306d.

In some embodiments, contacts 306c and 306d corresponds to contacts of source and drain regions of transistors of gated power circuits 104A, 104B of ICs 300, 400, 600, 700, 800 and 900. In some embodiments, contacts 306a and 306b corresponds to source and drain regions of transistors of header 102A or footer 102B of ICs 300, 400, 600, 700, 800 and 900. In some embodiments, contacts 306a and 306b extend continuously in the second direction Y, thereby electrically coupling the source or drain regions of transistors in portions of active regions 304a, 304b, 304c and 304d that are overlapped by the corresponding contact in parallel.

For example, in some embodiments, each contact 306a extends continuously in the second direction Y, thereby electrically coupling the drain region of each transistor in active regions 304a, 304b, 304c and 304d that is overlapped by contact 306a (e.g., a column along the second direction Y) in parallel. For example, in some embodiments, each contact 306b extends continuously in the second direction Y, thereby electrically coupling the drain region of each transistor in active regions 304a, 304b, 304c and 304d that is overlapped by contact 306b (e.g., a column along the second direction Y) in parallel.

In some embodiments, at least one of contact 306a, 306b, 306c or 306d of set of contacts 306 corresponds to source and drain terminals of NMOS transistors of ICs 300, 400, 600, 700, 800 and 900. In some embodiments, at least one of contact 306a, 306b, 306c or 306d of set of contacts 306 corresponds to source and drain terminals of PMOS transistors of ICs 300, 400, 600, 700, 800 and 900.

In some embodiments, set of contacts 306 is above set of active regions 304, and set of power rails 302. In some embodiments, set of contacts 306 encapsulates set of active regions 304. In some embodiments, a first portion of set of contacts 306 is above set of active regions 304, and a second portion of set of contacts 306 is below set of active regions 304.

In some embodiments, other configurations, arrangements on other layout levels or quantities of contacts in set of contacts 306 are within the scope of the present disclosure.

In some embodiments, set of vias 308 includes one or more of vias 308a or 308b. In some embodiments, set of vias 308 are between set of power rails 302 and set of active regions 304. In some embodiments, set of vias 308 are between set of power rails 302 and set of contacts 306.

The power rail 302a is electrically coupled to each of active regions 304a, 304b, 304c and 304d by vias 308a on the back-side 321a of substrate 311. In some embodiments, by being electrically coupled to each of active regions 304a, 304b, 304c and 304d by vias 308a, power rail 302a is configured to be coupled in parallel with drain regions of each of active regions 304a, 304b, 304c and 304d by vias 308a from the back-side 321a of substrate 311, thereby lowering resistance from the back-side power rail and improving efficiency of the header or footer circuit of IC 300. In some embodiments, via 308a is between power rail 302a and active region 304a, and thereby provides an electrical connection between power rail 302a and active region 304a on the back-side 321a of substrate 311. In some embodiments, via 308a is between power rail 302a and active region 304b, and thereby provides an electrical connection between power rail 302a and active region 304b on the back-side 321a of substrate 311. In some embodiments, via 308a is between power rail 302a and active region 304c and thereby provides an electrical connection between power rail 302a and active region 304c on the back-side 321a of substrate 311. In some embodiments, via 308a is between power rail 302a and active region 304d, and thereby provides an electrical connection between power rail 302a and active region 304d on the back-side 321a of substrate 311. In some embodiments, via 308a is between power rail 302a and contact 306a, and thereby provides an electrical connection between power rail 302a and at least contact 306a or active region 304a.

In some embodiments, via 308b is between power rail 302b and active region 304f, and thereby provides an electrical connection between power rail 302b and active region 304f. In some embodiments, via 308b is between power rail 302b and contact 306c, and thereby provides an electrical connection between power rail 302b and at least contact 306c or active region 304f.

In some embodiments, at least one via of the set of vias 308 is not included in IC 300. Other configurations, arrangements on other layout levels or quantities of vias in the set of vias 308 are within the scope of the present disclosure.

In some embodiments, set of vias 310 includes one or more of vias 310a. The set of vias 310 are between set of contacts 306 and set of conductive features 312.

In some embodiments, each via 310a is between contact 306b and set of conductive features 312. In some embodiments, each contact 306b is overlapped by 5 vias 310a. Other numbers of overlapping vias are in the scope of the present disclosure. Vias 310a are positioned in rows that are arranged in the first direction X. In some embodiments, the number of rows is 5. In some embodiments, the number of rows is different than 5. In some embodiments, via 310a is between contact 306b and one or more conductive features of the set of conductive features 312, and thereby provides an electrical connection between contact 306b and the one or more conductive features of set of conductive features 312. In some embodiments, via 310a is between contact 306d and one or more of set of conductive features 312, and thereby provides an electrical connection between contact 306d and one or more of set of conductive features 312.

In some embodiments, at least one via of the set of vias 310 is not included in IC 300. Other configurations, arrangements on other layout levels or quantities of vias in the set of vias 310 are within the scope of the present disclosure.

In some embodiments, other electrical connections between one or more of the set of active regions 304, set of contacts 306, set of conductive features 312, and set of vias 310 are within the scope of the present disclosure.

In some embodiments, set of gates 316 includes one or more of gates 316. In some embodiments, at least a portion of gates 316 of the set of gates corresponds to gates of NMOS transistors of ICs 300, 400, 600, 700, 800 and 900, and at least a portion of gate 316 of the set of gates 316 corresponds to gates of PMOS transistors of ICs 300, 400, 600, 700, 800 and 900. The set of gates 316 are above set of power rails 302 and set of active regions 304.

In some embodiments, other configurations, arrangements on other layout levels or quantities of gates in the set of gates 316 are within the scope of the present disclosure.

In some embodiments, set of conductive features 312 includes one or more of conductive features 312a, 312b, 312c, 312d, 312e, 312f, 312g, 312h, 312i, or 312j.

In some embodiments, set of conductive features 312 overlap at least one power rail of set of power rails 302. In some embodiments, set of conductive features 312 overlap the set of contacts 306 and the set of gates 716. In some embodiments, set of conductive features 312 overlaps other underlying features of other layout levels of IC 300, 400, 600, 700, 800 and 900. For example, IC 300 shows vias (e.g., VD 310, VG 318 and vias 320) located between set of conductive features 312 and at least set of gates 316 or set of contacts 306 for ease of illustration.

Each of conductive feature 312b, 312d, 312f, 312h or 312j is electrically coupled to each column of contacts 306b by a corresponding row of vias 310 thereby further electrically coupling the source regions of transistors in active regions 304a, 304b, 304c and 304d located in region 350a. For example, conductive feature 312b is electrically coupled to each column of contacts 306b by row 1 of vias 310 thereby further electrically coupling the source regions of transistors in active region 304a. In some embodiments, each of the transistors in region 350a are coupled in parallel and have an equivalent transistor that corresponds to header 102A or footer 102B.

In some embodiments, at least conductive feature 312a, 312e, 312f, or 312j of the set of conductive features 312 has a width W1 in the second direction Y. Other widths for the set of conductive features 312 is within the scope of the present disclosure. In some embodiments, at least one conductive feature of set of conductive features 312 has a width in the second direction Y different from width W1.

In some embodiments, other configurations, arrangements on other layout levels or quantities of conductive features in set of conductive features 312 are within the scope of the present disclosure.

In some embodiments, set of vias 320 includes one or more of vias 320a. The set of vias 320 are between set of power rails 314 and set of conductive features 312.

In some embodiments, each via 320 is between a power rail of the set of power rails 314 and set of conductive features 312.

In some embodiments, each of conductive features 312b, 312d, 312f, 312h and 312j is overlapped by 5 vias 320. Other numbers of overlapping vias are in the scope of the present disclosure. Vias 320a are positioned in rows that are arranged in the first direction X. In some embodiments, the number of rows is 5. In some embodiments, the number of rows is different than 5. In some embodiments, via 320a is between conductive features 312b and one or more power rails of the set of power rails 314, and thereby provides an electrical connection between conductive feature 312b and the one or more power rails of the set of power rails 314.

In some embodiments, set of power rails 314 includes one or more of power rails 314a, 314b, 314c, 314d, 314e, 314f, 314g, 314h, 314i, 314j or 314k.

In some embodiments, set of power rails 314 overlaps set of conductive features 312 and the set of vias 320. In some embodiments, set of power rails 314 overlap the set of contacts 306 and the set of active regions 304. In some embodiments, set of power rails 314 overlaps other underlying features of other layout levels of IC 300, 400, 600, 700, 800 and 900.

In some embodiments, one or more power rails of the set of power rails 314 covers or overlaps a corresponding column of contacts 306b, and a corresponding column of vias 310. In some embodiments, one or more power rails of the set of power rails 314 is electrically coupled to each corresponding column of contacts 306b by each column of vias 310 by at least conductive feature 312b, 312d, 312f, 312h or 312j, thereby electrically coupling the source regions of transistors in active regions 304a, 304b, 304c and 304d located in region 350a to one or more power rails of the set of power rails 314. For example, power rail 314c is electrically coupled to conductive features 312b, 312d, 312f, 312h or 312j by corresponding via 320a, and conductive features 312b, 312d, 312f, 312h or 312j are electrically coupled to each contact 306b by corresponding vias 310a, and each contact 306b is electrically coupled to the source regions of transistors in active regions 304a, 304b, 304c and 304d located in region 350a, thereby causing the set of power rails 314 to be coupled in parallel with the source regions of transistors in active regions 304a, 304b, 304c and 304d located in region 350a, and lowering resistance of the set of power rails 314 on the front-side 321b of substrate 311. In some embodiments, lowering resistance of the set of power rails 314 on the front-side 321b of substrate 311 results in improving efficiency of the header or footer circuit of IC 300.

In some embodiments, the set of power rails 314 is configured to receive the voltage of the voltage supply TVDD from upper metal layers of IC 300. In some embodiments, the set of power rails 314 is configured to provide voltage of the voltage supply TVDD to the front-side 321b of substrate 311, and power rail 302a is configured to provide voltage of voltage supply VDD from the back-side 321a of substrate 311.

In some embodiments, at least one power rail of set of power rails 302, at least one contact of set of contacts 306, at least one via of set of vias 308, at least one via over diffusion (VD) of set of vias 310, at least one via of set of vias 320, at least one via over gate (VG) of set of vias 318, at least one conductive feature of set of conductive features 312, or at least one power rail of set of power rails 314 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W-TiN, TiSix, NiSix, TiN, TaN, or the like. In some embodiments, a doped semiconductor includes at least doped silicon, or the like.

In some embodiments, the set of conductive features 312 is an upper metal layer track located on the M0 level of the front-side of IC 300, 400, 600, 700, 800 and 900. In some embodiments, when compared with other approaches, set of power rails 302 are moved from the front-side of IC 300 to the back-side of IC 300. In some embodiments, moving the set of power rails 302 from the front-side of IC 300 to the back-side of IC 300, results in IC 300, 400, 600, 700, 800 or 900 routing the supply voltages (e.g., first, second and third supply voltages) in parallel (i.e., set of power rails 302 on the backside and set of power rails 314 on the front-side) from both the front-side 321b and the back-side 321a. This results in an IC (e.g., IC 300, 400, 600, 700, 800 or 900) with a lower overall resistivity, a greater MOS efficiency, less power consumption, and an overall power efficiency for IC 300, 400, 600, 700, 800 or 900 and any logic circuitry coupled to IC 300, 400, 600, 700, 800 or 900, such as gated power circuit 104A or 104B.

In some embodiments, since at least one upper metal layer track in the set of conductive features 312 is reduced, the width of one or more conductive features in the set of conductive features 312 is increased, yielding an IC 300, 400, 600, 700, 800 or 900 with better current resistance (IR) and performance compared with other approaches.

In some embodiments, the set of power rails 314 is an upper metal layer track located on the M1 level of the front-side of IC 300, 400, 600, 700, 800 and 900. In some embodiments, when compared with other approaches, set of power rails 314 are routed in parallel to set of power rails 302 on the back-side 321*a* of IC 300, 400, 600, 700, 800 or 900, and results in IC 300, 400, 600, 700, 800 or 900 routing the supply voltages (e.g., first, second and third supply voltages) in parallel there by resulting in an IC (e.g., IC 300, 400, 600, 700, 800 or 900) with a lower overall resistivity, a greater MOS efficiency, less power consumption, and an overall power efficiency for IC 300, 400, 600, 700, 800 or 900 and any logic circuitry coupled to IC 300, 400, 600, 700, 800 or 900, such as gated power circuit 104A or 104B.

Figure 4A:
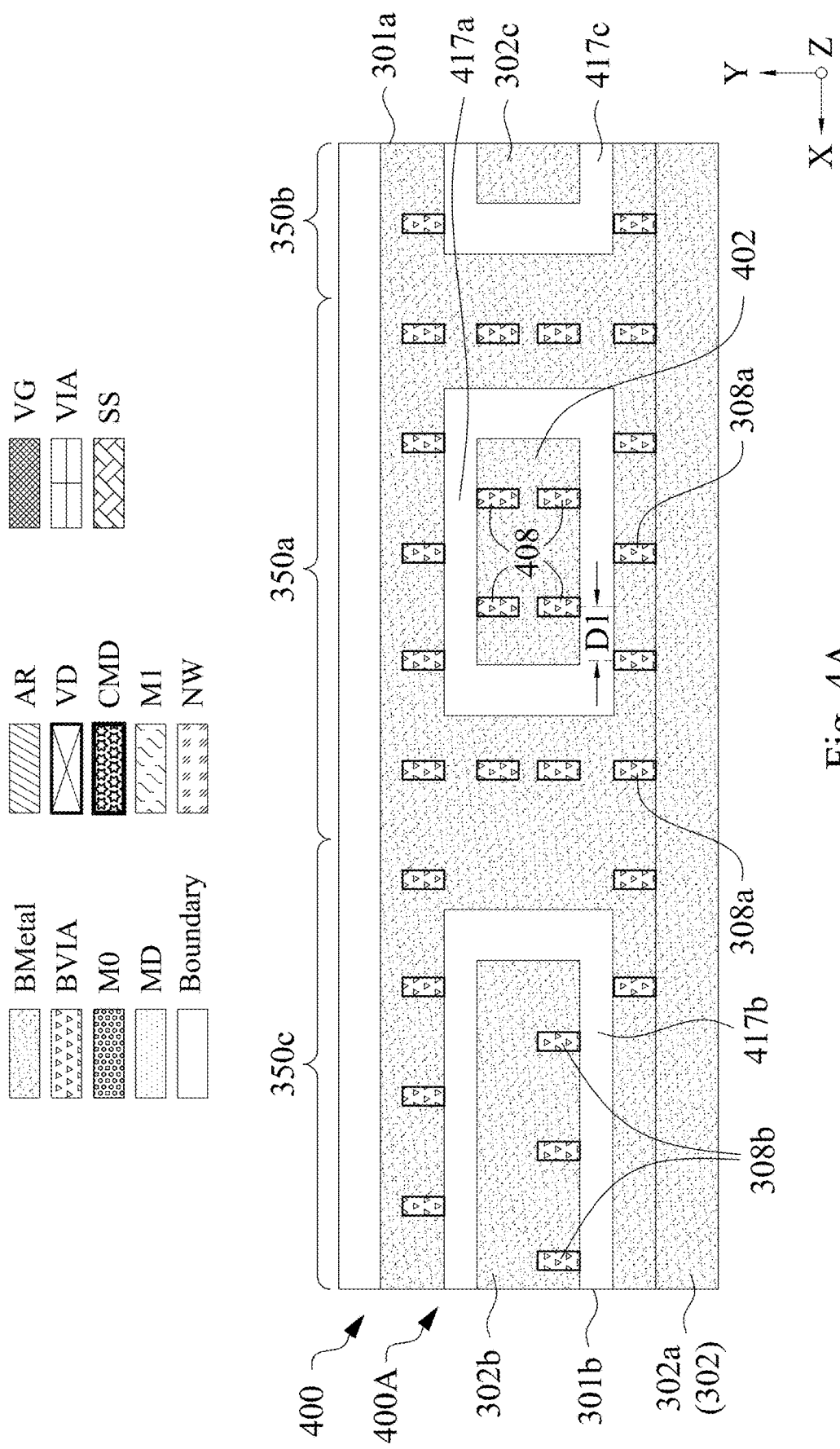
FIGS. 4A-4B are diagrams of an IC, in accordance with some embodiments.
Figure 4B:
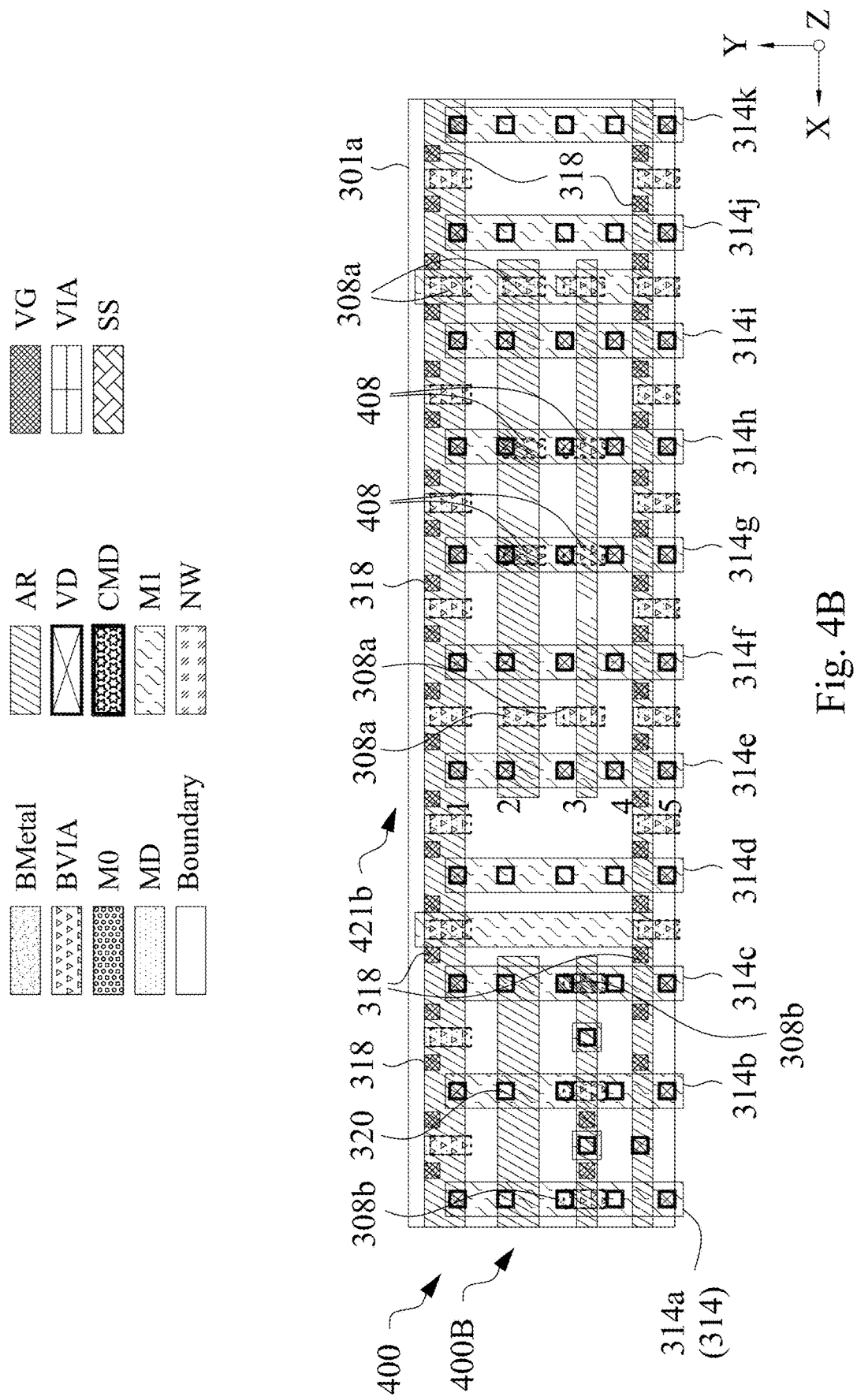

FIGS. 4A-4B are diagrams of an IC 400, in accordance with some embodiments.

In some embodiments, IC 400 is a variation of IC 300 (FIGS. 3A-3I). For example, IC 400 illustrates an example of where the BP level (e.g., set of power rails 302) includes an additional power rail 402 and a set of vias 408 on the backside 421*a* to electrically supply the voltage of voltage supply TVDD in addition to the voltage of voltage supply TVDD provided by the front-side set of power rails 314.

Integrated circuit 400, 500A, 500B, 600, 700, 800 or 900 is manufactured by a corresponding layout design similar to layout design 200, and similar detailed description is therefore omitted. For brevity FIGS. 4A-4B, 5A, 5B, 6A-6D, 7A-7B, 8A-8B and 9A-9B are described as corresponding integrated circuits 400, 500A, 500B, 600, 700, 800 and 900, but in some embodiments, FIGS. 4A-4B, 5A, 5B, 6A-6D, 7A-7B, 8A-8B and 9A-9B also correspond to layout designs similar to layout design 200, and structural elements of corresponding integrated circuits 400, 500A, 500B, 600, 700, 800 and 900 also correspond to layout patterns, and structural relationships including alignment, lengths and widths, as well as configurations and layers of a corresponding layout design of corresponding integrated circuits 400, 500A, 500B, 600, 700, 800 and 900 are similar to the structural relationships and configurations and layers of corresponding integrated circuits 400, 500A, 500B, 600, 700, 800 and 900, and similar detailed description will not be described for brevity.

In comparison with IC 300 of FIGS. 3A-3I, set of power rails 302 of IC 400 includes an additional power rail 402 that replaces a portion of power rail 302*a* (e.g., between power rail 302*b* and 302*c*) and additional set of vias 408 replace a portion of vias 308*a*, and similar detailed description is therefore omitted.

FIG. 4A is a backside 421*a* of IC 400, simplified for ease of illustration. FIG. 4B is a front-side 421*b* of IC 400, simplified for ease of illustration. For ease of illustration, some of the labeled elements of FIGS. 3A-3I are not labelled in FIGS. 4A-4B. In some embodiments, IC 400 includes additional elements not shown in FIGS. 4A-4B.

Figure 3E:
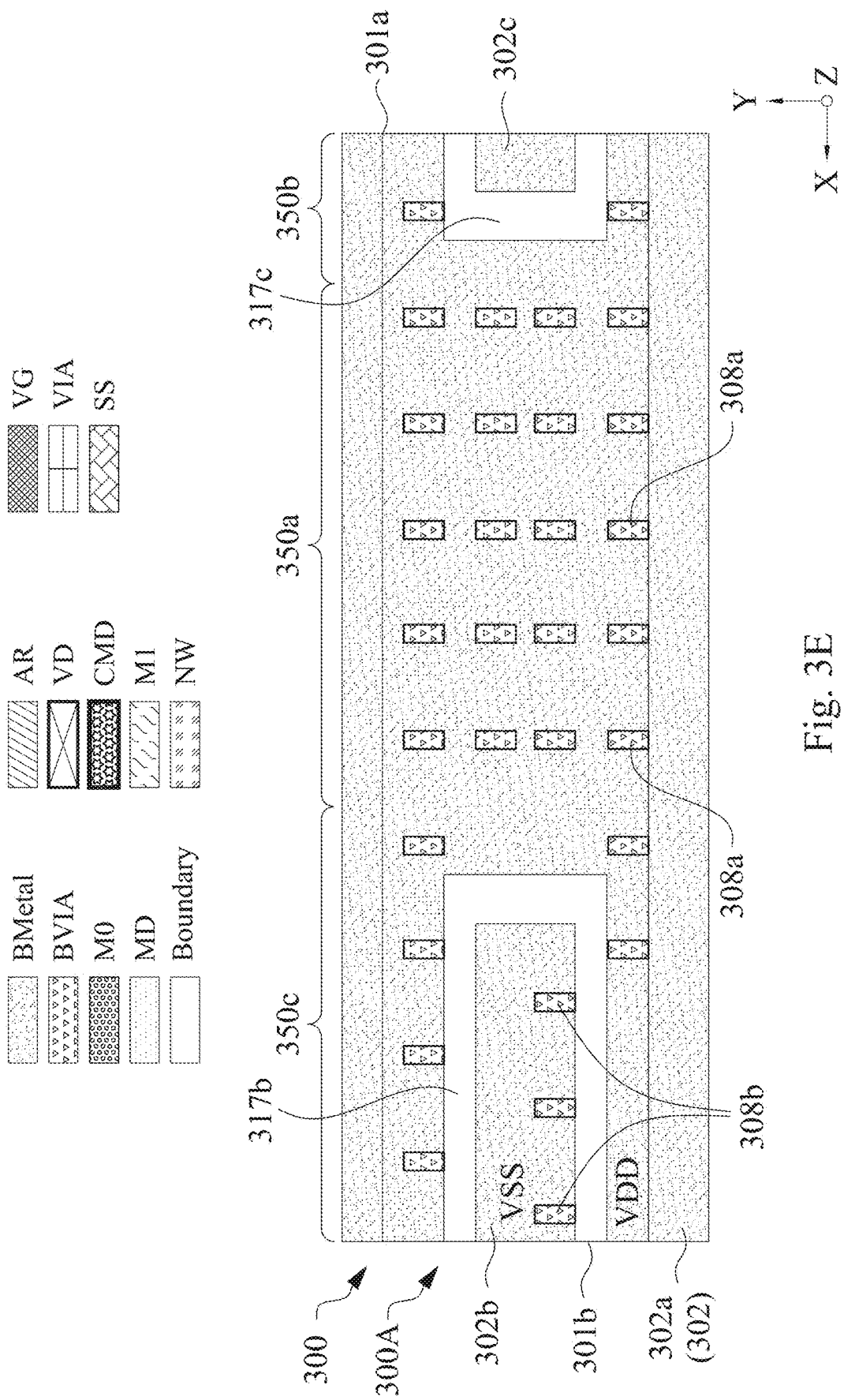
Figure 3F:
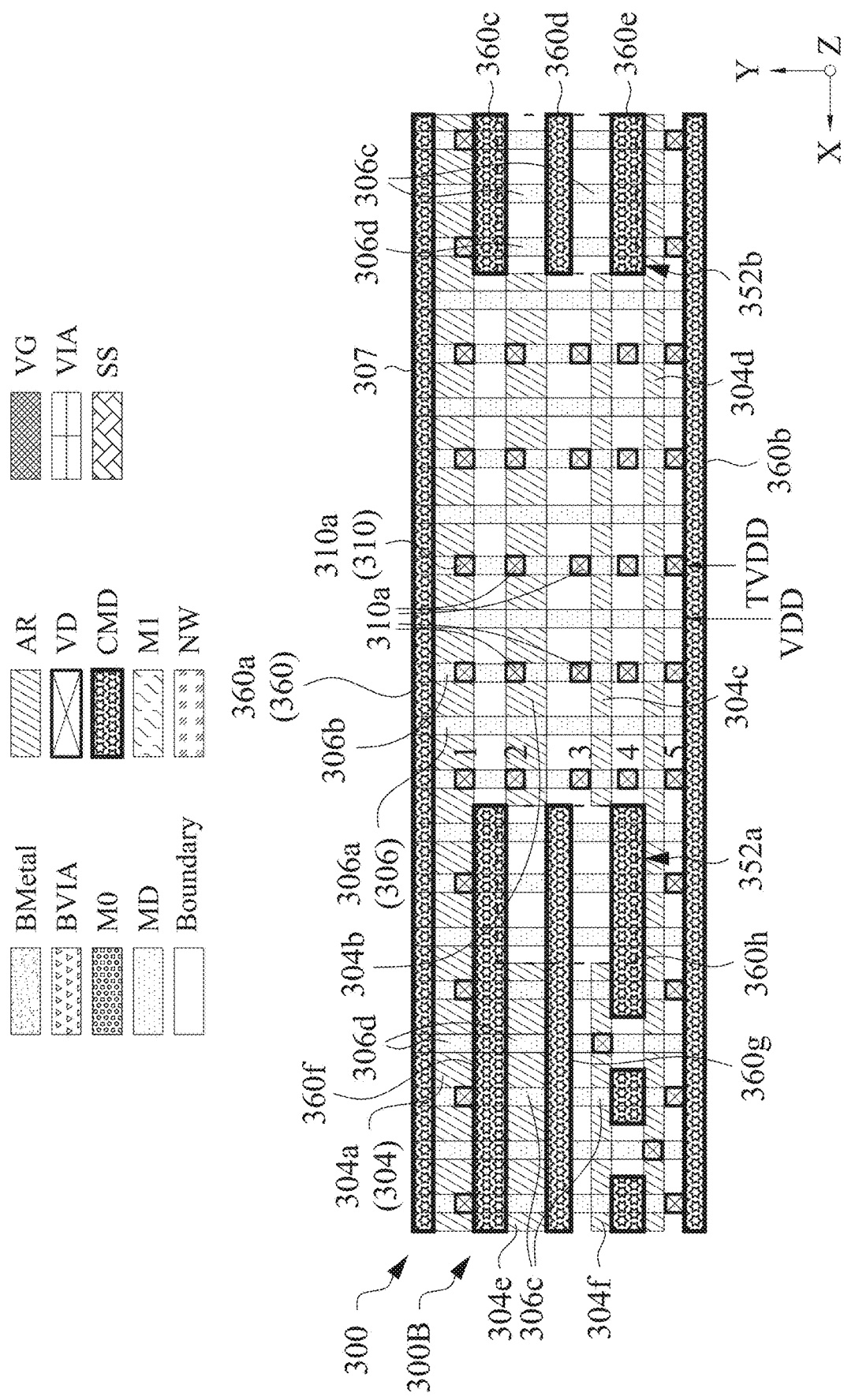
Figure 3G:
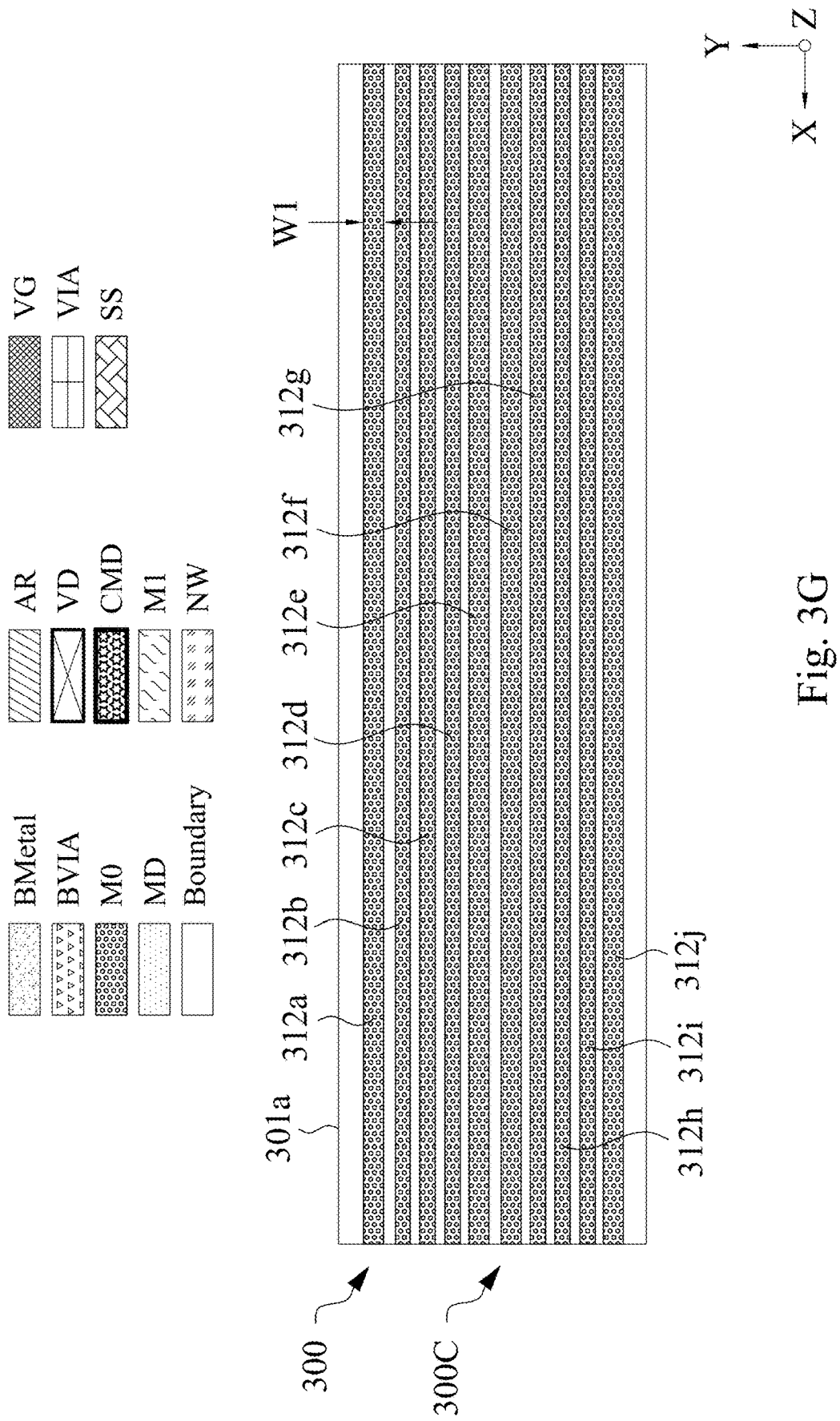
Figure 3H:
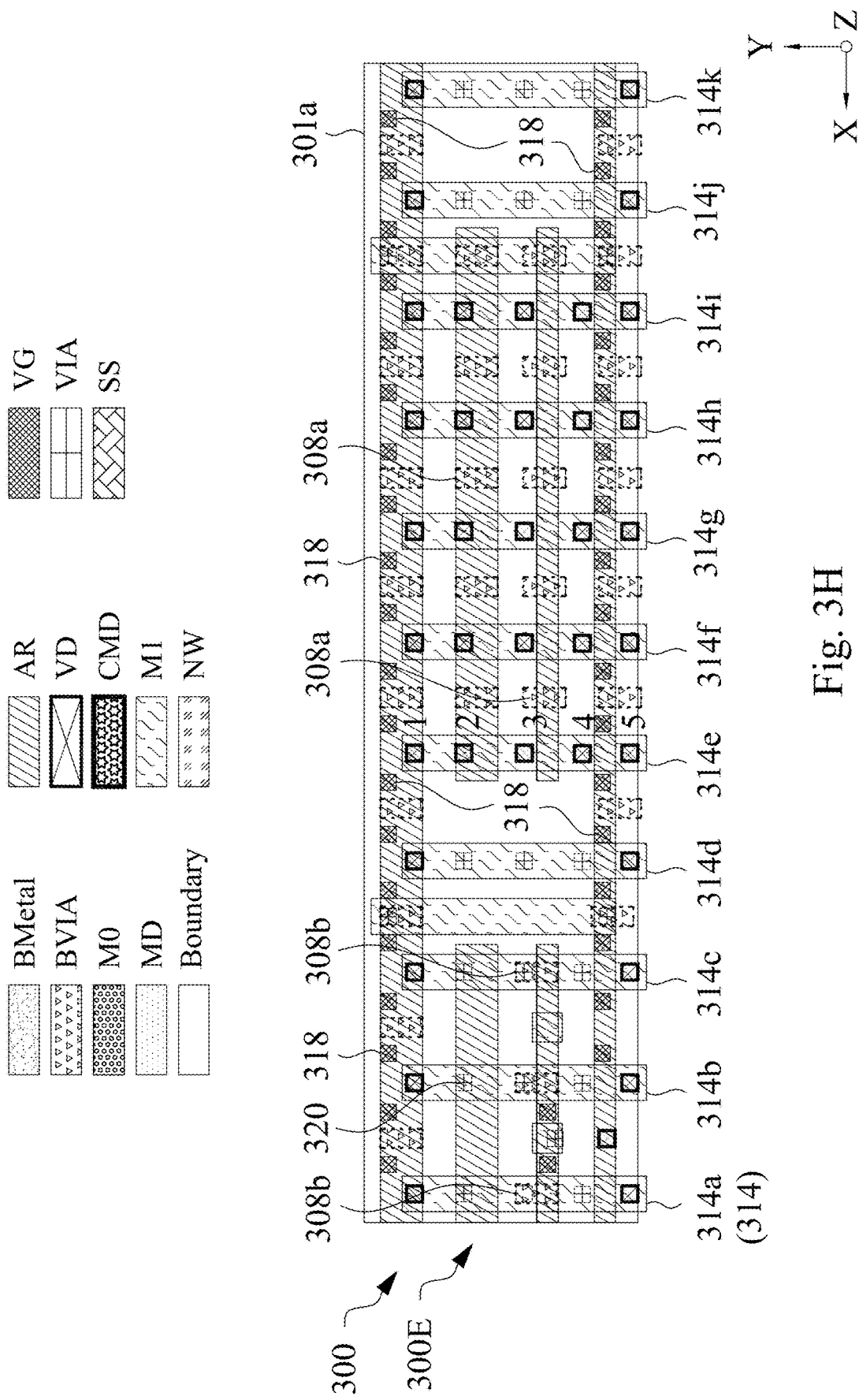
Figure 3I:
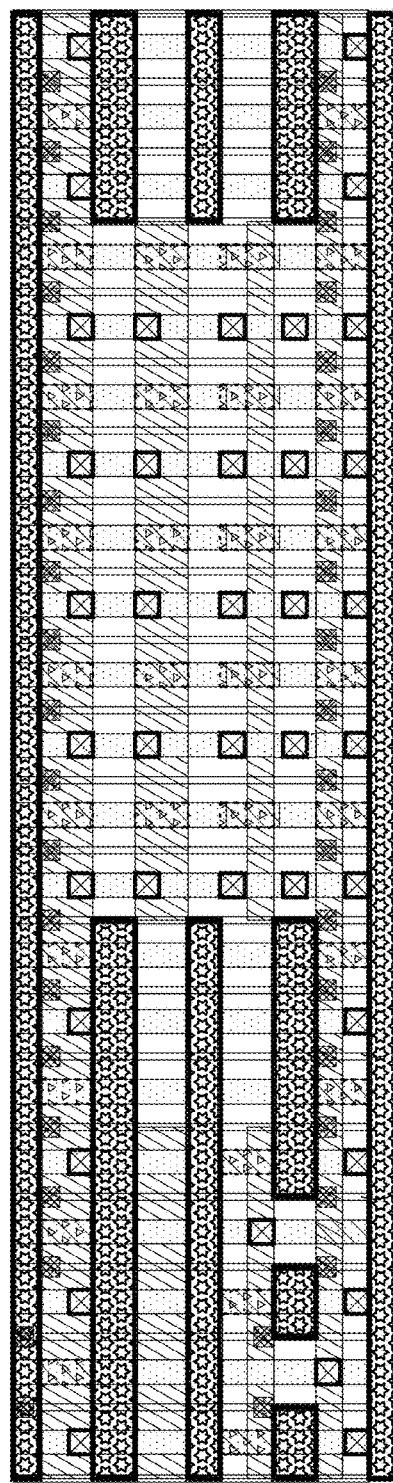

In some embodiments, back-side 421*a* of IC 400 corresponds to portion 300A of FIG. 3E, and front-side 42 1b of IC 400 corresponds to portion 300E of FIG. 3H, and similar detailed description is therefore omitted.

In some embodiments, power rail 402 is a power rail configured to supply the voltage (TVDD or TVSS) on backside 421*a* of wafer (substrate 311). In some embodiments, power rail 402 extends in the first direction X and is separated from first power rail 302*a* in the second direction Y. In some embodiments, power rail 402 is separated from power rail 302*b* in the first direction X. In some embodiments, power rail 314 and power rail 402 are configured to supply the voltage of the voltage supply (e.g., TVDD for a header switch and TVSS for a footer switch) to corresponding power gating circuit 104A or 104B.

In some embodiments, the set of vias 408 are located at the VBP level between power rail 402 (e.g., located on the BP level) and active region 304*b* and active region 304*c*. In some embodiments, set of vias 408 electrically connect power rail 402 to at least active region 304*b* or active region 304*c*. In some embodiments, set of vias 408 are offset from set of vias 308 in the first direction X by a distance D1. Power rail 302*a* further includes an opening 417*a* where the power rail 402 is positioned within. Opening 417*a* separates power rail 402 and power rail 302*a* from each other. In some embodiments, opening 417*a* includes an insulator material or a dielectric material that electrically isolates power rail 408 and power rail 302*a* from each other.

Power rails 314*g* and 314*h* overlap set of vias 408. Power rail 402 is electrically connected to power rails 314*g* and 314*h* by at least the set of vias 408 thereby providing electrical coupling of power rail 402, 314*g*, and 314*h* provides a parallel coupling of the voltage supply TVDD from both the front-side and back-side of IC 400 thereby reducing resistivity in IC 400 and increasing the speed of IC 400. In some embodiments, power rails 314*g* and 314*h* are also electrically coupled in parallel with power rails 314*a-f* and 314*i-k* through conductive features 312*b*, 312*d*, 312*f*, 312*h* or 312*j* and this additional parallel electrical connection also lowers resistivity of IC 400 through parallel electrical coupling of power rails 302 and 402.

Figure 5A:
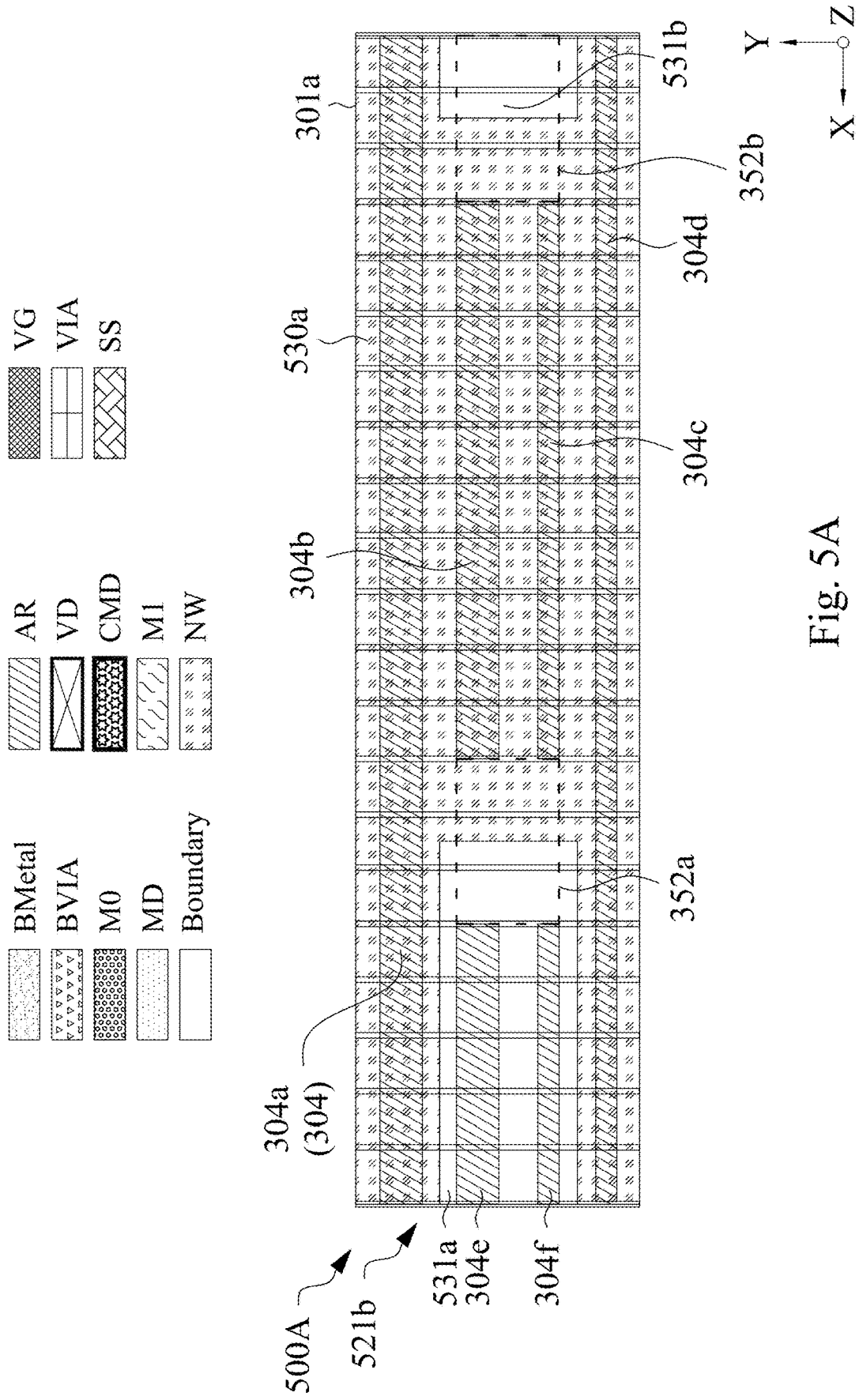
FIGS. 5A-5B are diagrams of corresponding ICs, in accordance with some embodiments.
Figure 5B:

FIGS. 5A-5B are diagrams of corresponding ICs 500A-500B, in accordance with some embodiments.

IC 500A-500B include the OD level and the poly level of portion 300F of IC 300.

IC 500A is a variation of portion 300F of IC 300, and similar detailed description is therefore omitted. For example, in comparison with portion 300F of IC 300, a front-side 521*b* of IC 500A of FIG. 5A replaces front-side 321*b* of IC 300, and similar detailed description is therefore omitted. In comparison with front-side 321*b* of FIGS. 3B 3C, and 3D, front-side 521*b* further includes well 530*a*, well 531*a* and well 531*b*, and similar detailed description is therefore omitted.

In some embodiments, front-side 521*b* of FIG. 5A and 521bb of FIG. 5B are a variation of front-side 321*b* of IC 300 (FIGS. 3A-3I). For example, front-side 521*b* illustrates a non-limiting example of N-well 530*a* located in relation to active regions 304*a*-304*d*.

IC 500B is a variation of IC 300, and similar detailed description is therefore omitted. For example, in comparison with IC 300, a front-side 521bb of IC 500B of FIG. 5B replaces front-side 321*b* of IC 300, and similar detailed description is therefore omitted. In comparison with front-side 321*b* of FIGS. 3B 3C, and 3D, front-side 521bb further includes well 530*a*, well 531*a* and well 531*b* and active region 504*a* replaces actives regions 304*a*, 304*b*, 304*c* and 304*d*, and similar detailed description is therefore omitted.

In some embodiments, front-side 521bb is a variation of front-side 321*b* of IC 300 (FIGS. 3A-3I). In comparison with IC 300 of FIGS. 3A-3I, active region 504*a* replaces active region 304*a-d* and N-well 530*a* referenced, and similar detailed description is therefore omitted. For example, front-side 521bb illustrates a non-limiting example of well 530*a* and a single active region 504*a* that extends in second direction Y along boundary 301*b* and is correspondingly like power rail 302*a* with a similar size and shape. In some embodiments, the shape of active region 504*a* is referred to as an I-beam shape. Other shapes are within the scope of the present disclosure.

In some embodiments, IC 500A or 500B includes a header circuit (e.g., 102A), and well 520*a* is an N-well including N-type dopants, and wells 531*a* and 531*b* are P-wells including P-type dopants. In some embodiments, IC 500A or 500B includes a footer circuit (e.g., 102B), and well 520*a* is a P-well including P-type dopants, and wells 531*a* and 531*b* are N-wells including N-type dopants.

In some embodiments, front-side 521*b* and 521*bb* includes wells 531*a* and 531*b* located on opposite sides, along the first direction X, of well 530*a*. In some embodiments, each of wells 531*a* and 531*b* are located at opposite sides of front-side 521*b* and 521*bb* along boundary 301*a*.

In some embodiments, the shape and location of well 531*a* corresponds to and includes active regions 304*e* and 304*f*. In some embodiments, active regions 304*e* and 304*f* include one or more NMOS transistors. In some embodiments, wells 531*a* and 531*b* correspond to power rails 302*b* and 302*c* located on backside 321*a*. In some embodiments, wells 531*a* and 531*b* represent a second voltage domain (e.g., VSS for header circuit 102A).

Active region 304*e* is separated from active region 304*b* and 504*a* in the first direction X in a region 352*a*. Active region 304*f* is separated from active regions 304*c* and 504*a* in the first direction X by region 352*a*. In region 352*b*, active regions 304*b*, 304*c* and 504*a* are separated from other active regions (not shown, but adjacent to region 352*b*) in the first direction X. In some embodiments, region 352*a* and 352*b* include an insulator or dielectric material that electrically isolates active regions 304*b*, 304*c*, and 504*a* from active regions 304*e* and 304*f*.

Other configurations or arrangements of IC 500A or 500B are within the scope of the present disclosure.

FIGS. 6A-6D are diagrams of an IC 600, in accordance with some embodiments.

Figure 6A:
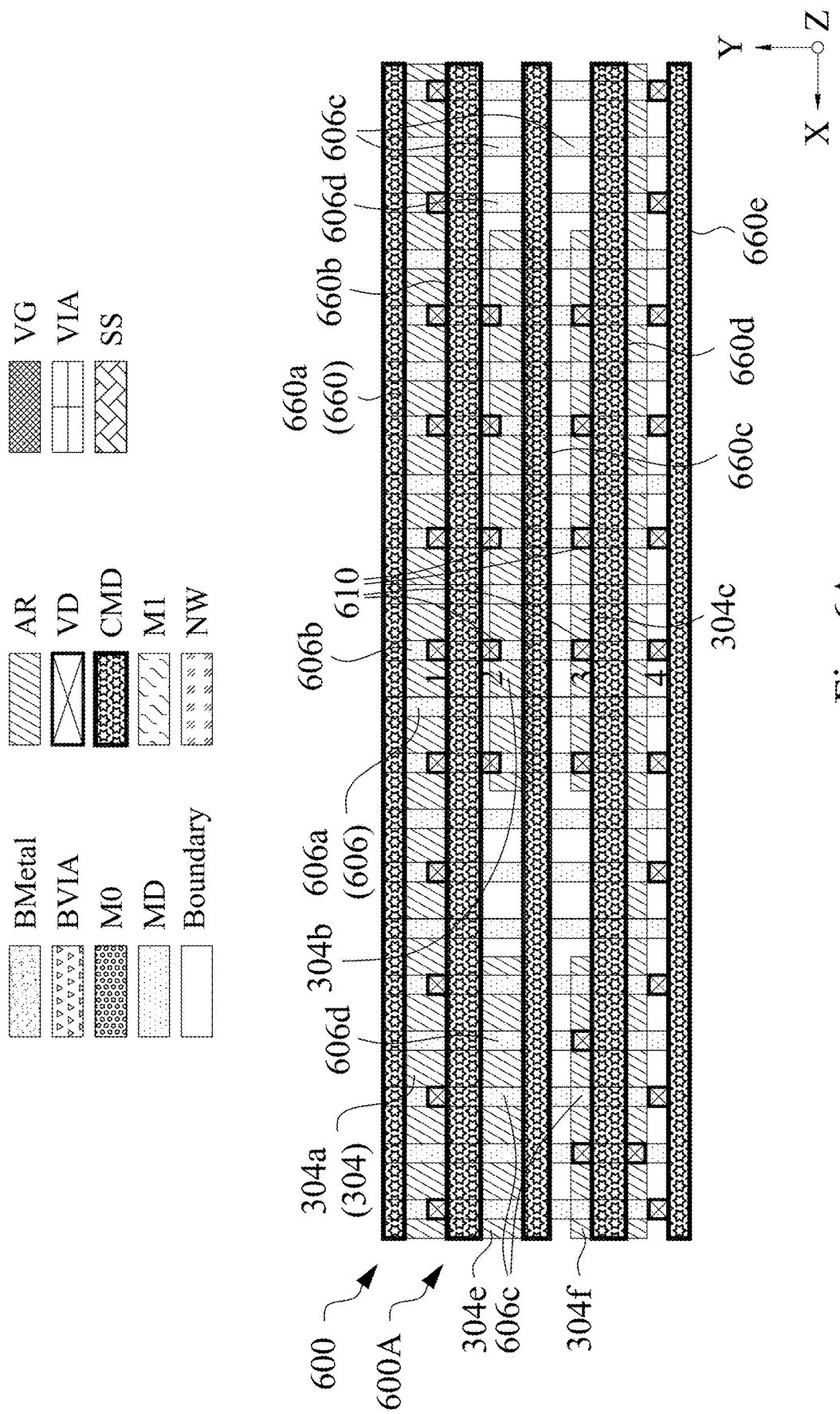
FIGS. 6A-6D are diagrams of an IC, in accordance with some embodiments.
Figure 6B:
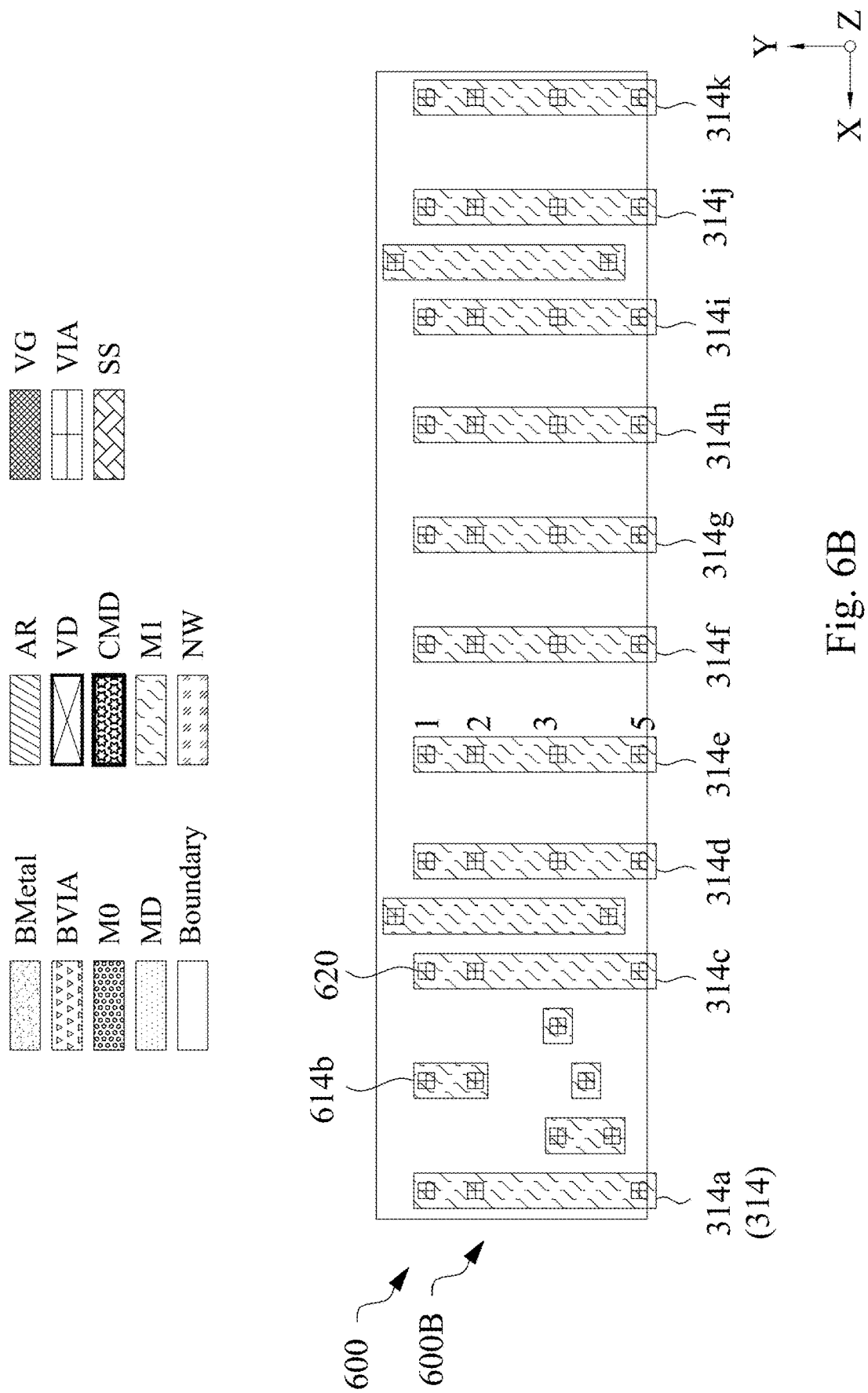
Figure 6C:
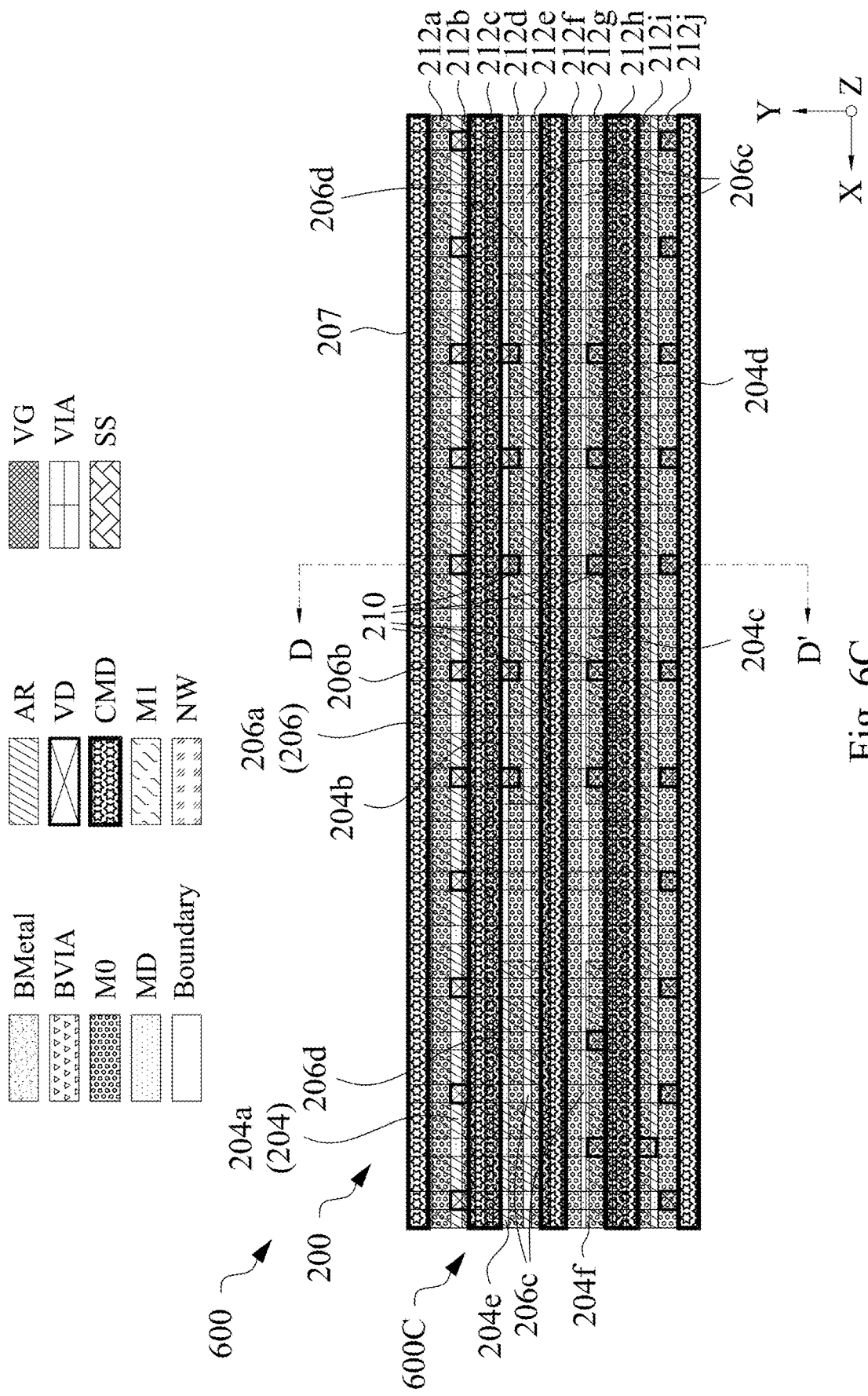
Figure 6D:
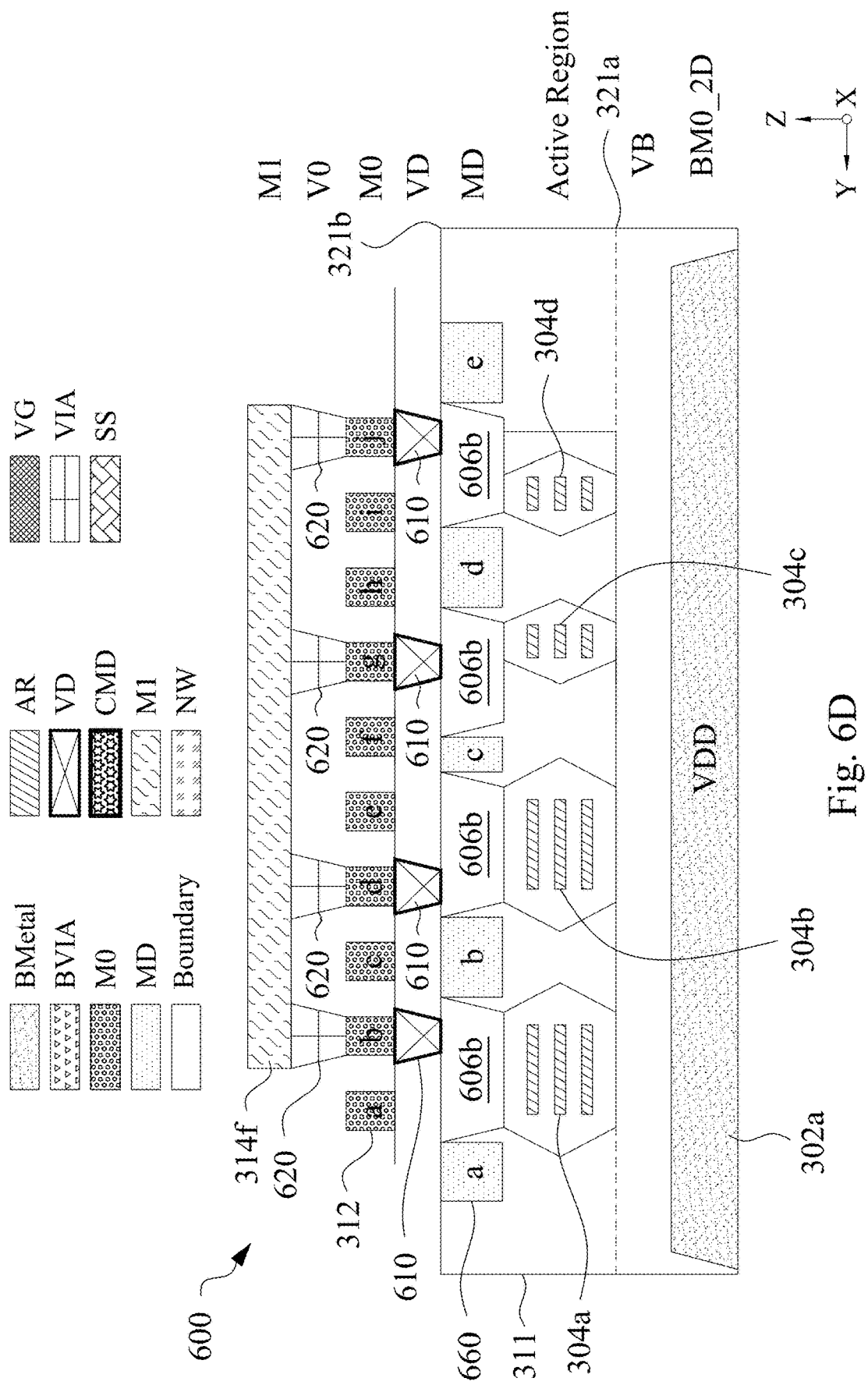

FIGS. 6A-6C are top views of corresponding portions 600A-600C of integrated circuit 600, simplified for ease of illustration. Portion 600A is similar to portion 300B, portion 600B is similar to portion 300E without the VG, VD and OD levels, and portion 600C is similar to portions 300B-300C combined, and similar detailed description is therefore omitted.

IC 600 is a variation of IC 300, and similar detailed description is therefore omitted. In comparison with IC 300, contacts 606*a* and 606*b* replace corresponding contacts 306*a* and 306*b*, vias 610 and 620 replace corresponding vias 310 and 320, and similar detailed description is therefore omitted.

In some embodiments, IC 600 is a variation of IC 300 (FIGS. 3A-3H). For example, IC 600 illustrates an example of where contacts 606*a* and 606*b* are not continuous in the second direction Y, and instead are separated by regions 660*a*-660*e*. In some embodiments, regions 660*a*-660*e* are formed by cut feature patterns similar to cut feature patterns 260*a*-260*h* that extend continuously in the second direction Y through region 350*a*, and thereby reduce the number of rows to four rows of contacts 606*a* and 606*b* and vias 610 and 620, instead of the five rows in IC 300.

In comparison with IC 300 of FIGS. 3A-3H, a five-row structure of contacts 306*a* and 306*b* and vias 310 and 320 in IC 300 is replaced with a four row structure of IC 600 that includes 4 rows of contacts 606*a* and 606*b* and vias 610 and 620. Other number of rows are within the scope of the present disclosure. In further comparison, region 660*a*-660*e* replaces portions of corresponding contact 360*a*-360*h*, representing a broken cut feature. In further comparison, the number of vias 320 are reduced to 4 vias 620 per power rail 314, and similar detailed description is therefore omitted.

In some embodiments, regions 660*a*, 660*b*, 660*c*, 660*d*, or 660*e* identify corresponding locations of corresponding removed portions of corresponding contact 360*a*, 360*b*, 360*c*, or 360*d*, that are removed in operation 1106 of method 1100 (FIG. 11).

In some embodiments, four rows of vias 620 are electrically coupled to power rails 314*d*-314*k* in contrast to the five rows of vias 320 in IC 300.

In some embodiments, by IC 600 including contacts 606*a* and 606*b* and vias 610 and 620, IC 600 achieves one or more of the benefits discussed above in FIGS. 3A-4B.

Other configurations or arrangements of IC 600 are within the scope of the present disclosure.

Figure 7A:
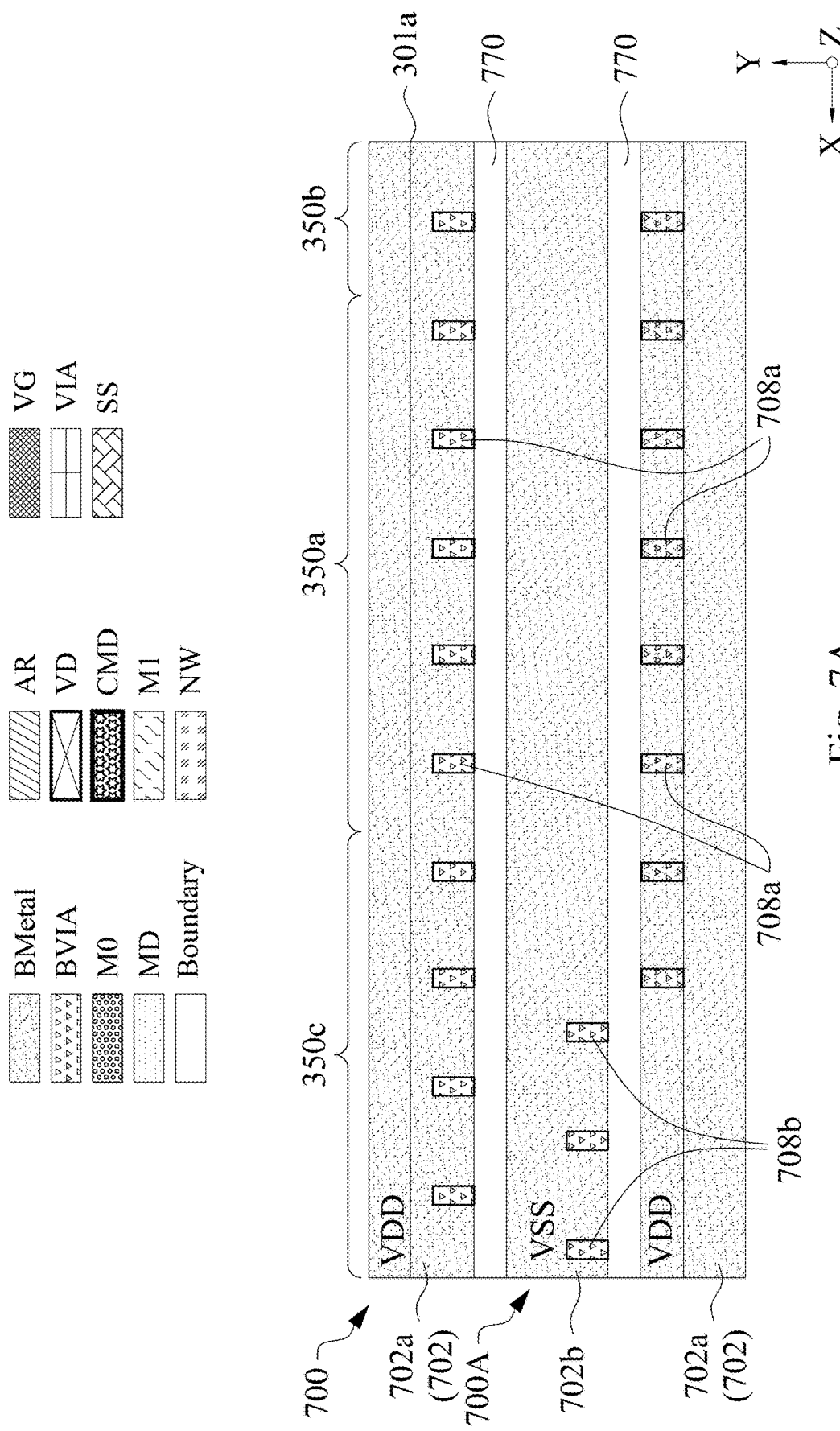
FIGS. 7A-7B are diagrams of an IC, in accordance with some embodiments.
Figure 7B:
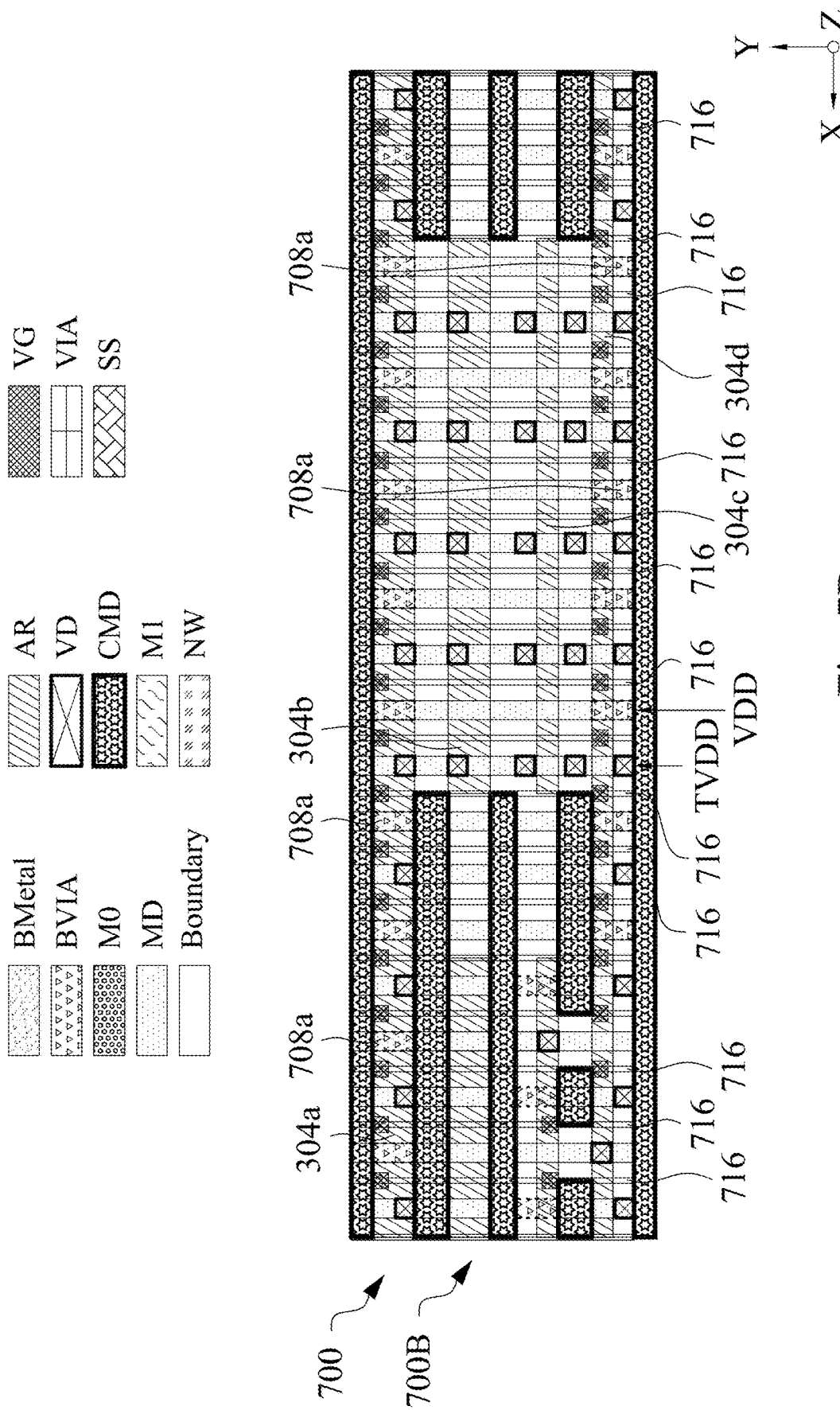

FIGS. 7A-7B are diagrams of an IC 700, in accordance with some embodiments.

FIGS. 7A-7B are top views of corresponding portions 700A-700B of integrated circuit 600, simplified for ease of illustration. Portion 700A is similar to portion 300A, and portion 700B is similar to portion 300B but further includes the VB level, and similar detailed description is therefore omitted.

IC 700 is a variation of IC 300, and similar detailed description is therefore omitted. In comparison with IC 300, set of power rails 702 replaces set of power rails 302, and vias 708*a* and 708*b* replace corresponding vias 308*a* and 308*b*, and similar detailed description is therefore omitted.

Set of power rails 702 includes power rails 702*a* and 702*b*. Power rail 702*a* replaces power rail 302*a*, and power rail 702*b* replaces power rails 302*b* and 302*c*, and similar detailed description is therefore omitted.

In some embodiments, portion 700A illustrates an example of power rail 702*b* extending across the back-side 721*a* of substrate 311 in the first direction X, and power rail 702*a* is located above and below power rail 702*b* in a separated fashion. Power rail 702*a* is split into an upper portion and a lower portion that extend in the first direction X. Power rail 702*b* is separated from power rails 702*a* by an opening 770. In some embodiments, opening 770 includes an insulator material or a dielectric to electrically isolate power rail 702*b* from power rails 702*a*.

Vias 708*a* are below active region 304*a* and 304*d*. In some embodiments, portion 700A does not include any vias 308*a* under active regions 304*b* and 304*c*. In comparison with vias 308*a* of IC 300, vias 708*a* are not included on the extended structure of power rail 702*b* (e.g., the portion of power rail 702*b* below active regions 304*b* and 304*c*).

In some embodiments, IC 700 achieves one or more of the benefits discussed above.

Other configurations or arrangements of IC 700 are within the scope of the present disclosure.

Figure 8A:
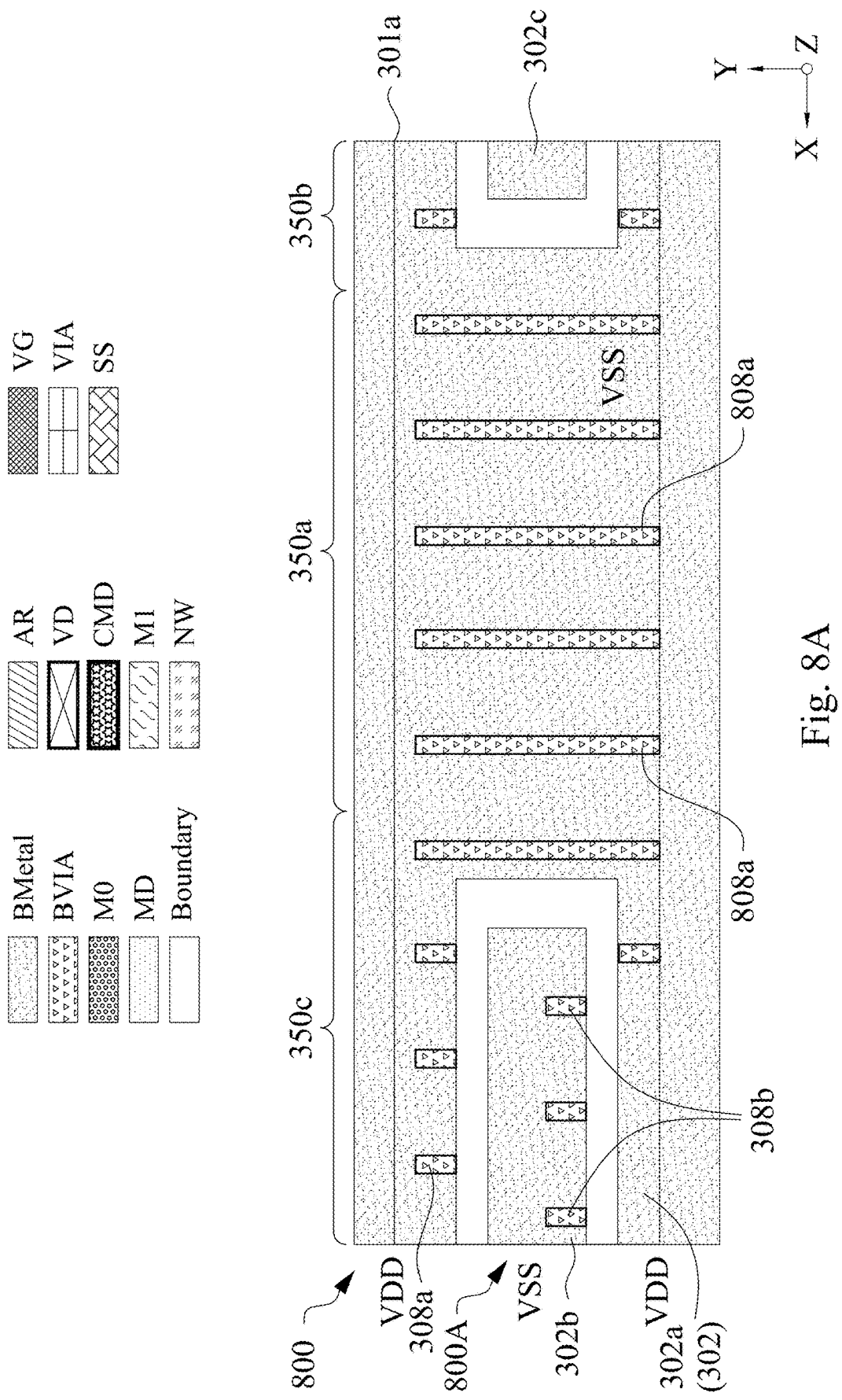
FIGS. 8A-8B are diagrams of an IC, in accordance with some embodiments.
Figure 8B:
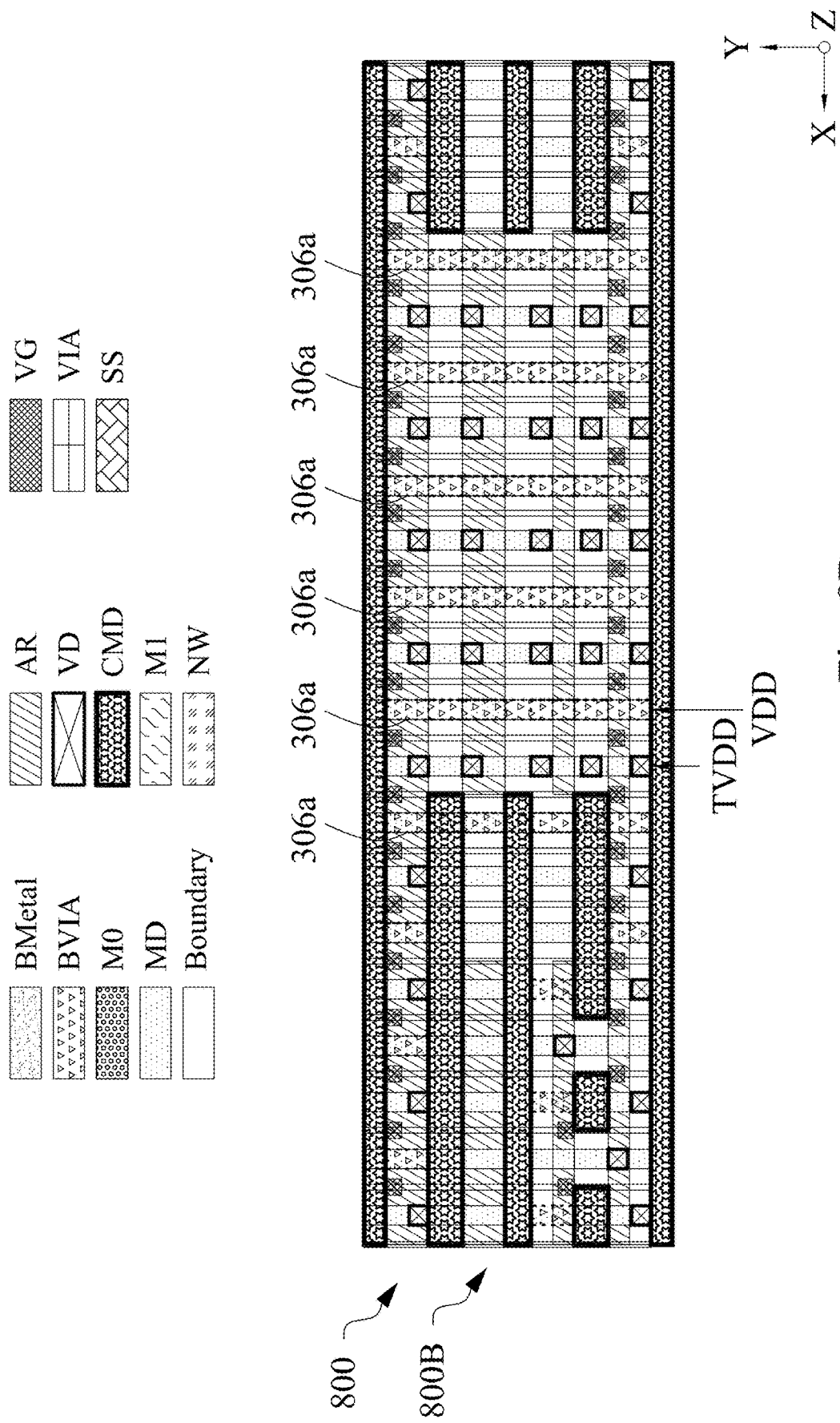

FIGS. 8A-8B are diagrams of an IC 800, in accordance with some embodiments.

FIGS. 8A-8B are top views of corresponding portions 800A-800B of integrated circuit 600, simplified for ease of illustration. Portion 800A is similar to portion 300A, and portion 800B is similar to portion 300B but further includes the VB level, and similar detailed description is therefore omitted.

IC 800 is a variation of IC 300, and similar detailed description is therefore omitted. In comparison with IC 300, vias 808*a* replace vias 308*a* in region 350*a* of IC 800, and similar detailed description is therefore omitted.

Vias 808*a* are arranged to extend continuously in the second direction Y thereby increasing the size of each of vias 808*a* thus causing a reduction in resistance and lowering current density compared to other approaches. In some embodiments, lowering the resistance from vias 808*a* causes resistance of IC 800 to be lowered than other approaches of the entire IC, and IC 800 achieves one or more of the benefits discussed above.

In FIG. 8B, vias 808a are not visible, but contacts 306a are darker in FIG. 8B (see FIG. 3F for comparison) as vias 808a are represented directly below contacts 306a.

In some embodiments, IC 800 achieves one or more of the benefits discussed above.

Other configurations or arrangements of IC 800 are within the scope of the present disclosure.

Figure 9A:
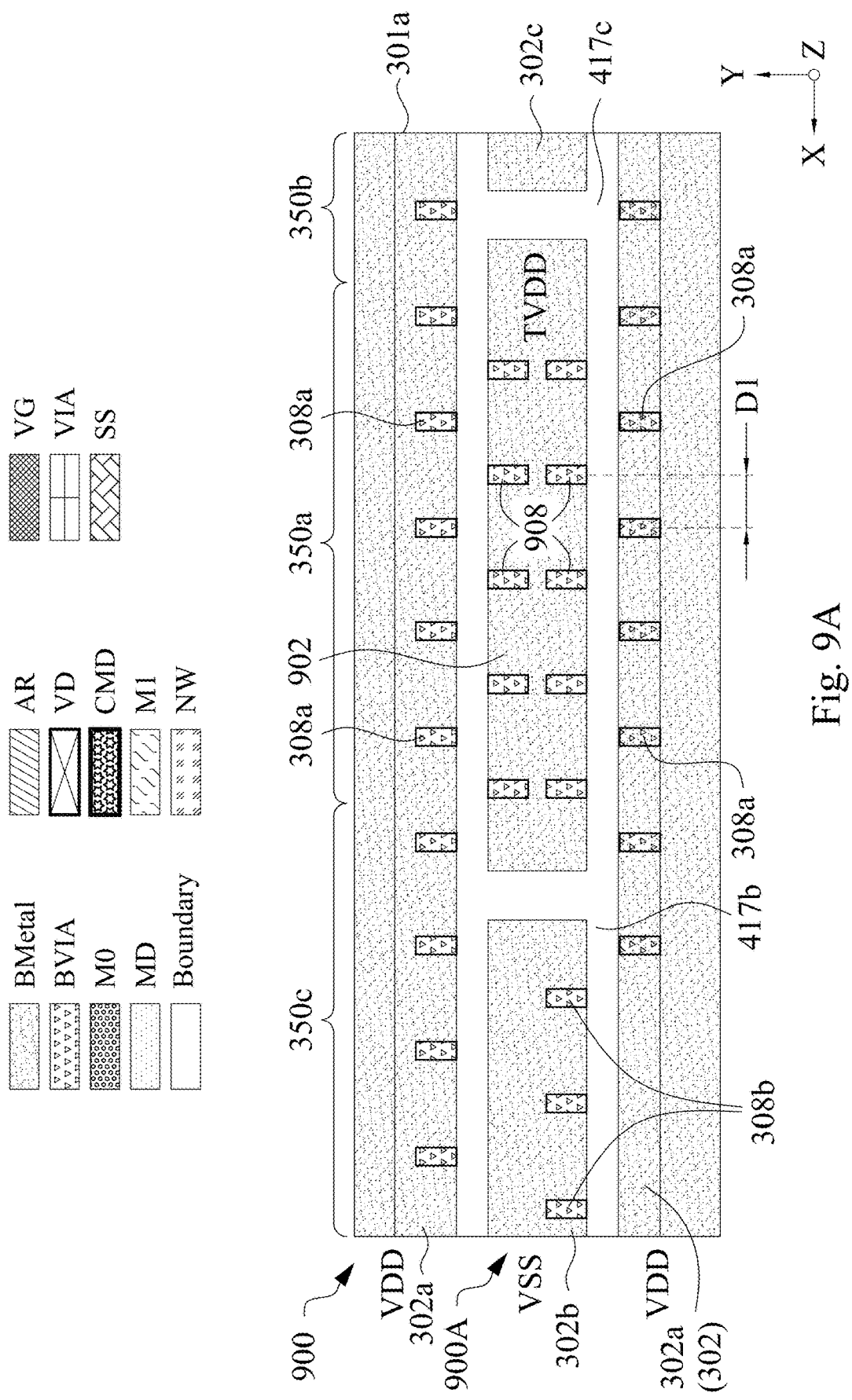
FIGS. 9A-9B are diagrams of an IC, in accordance with some embodiments.
Figure 9B:
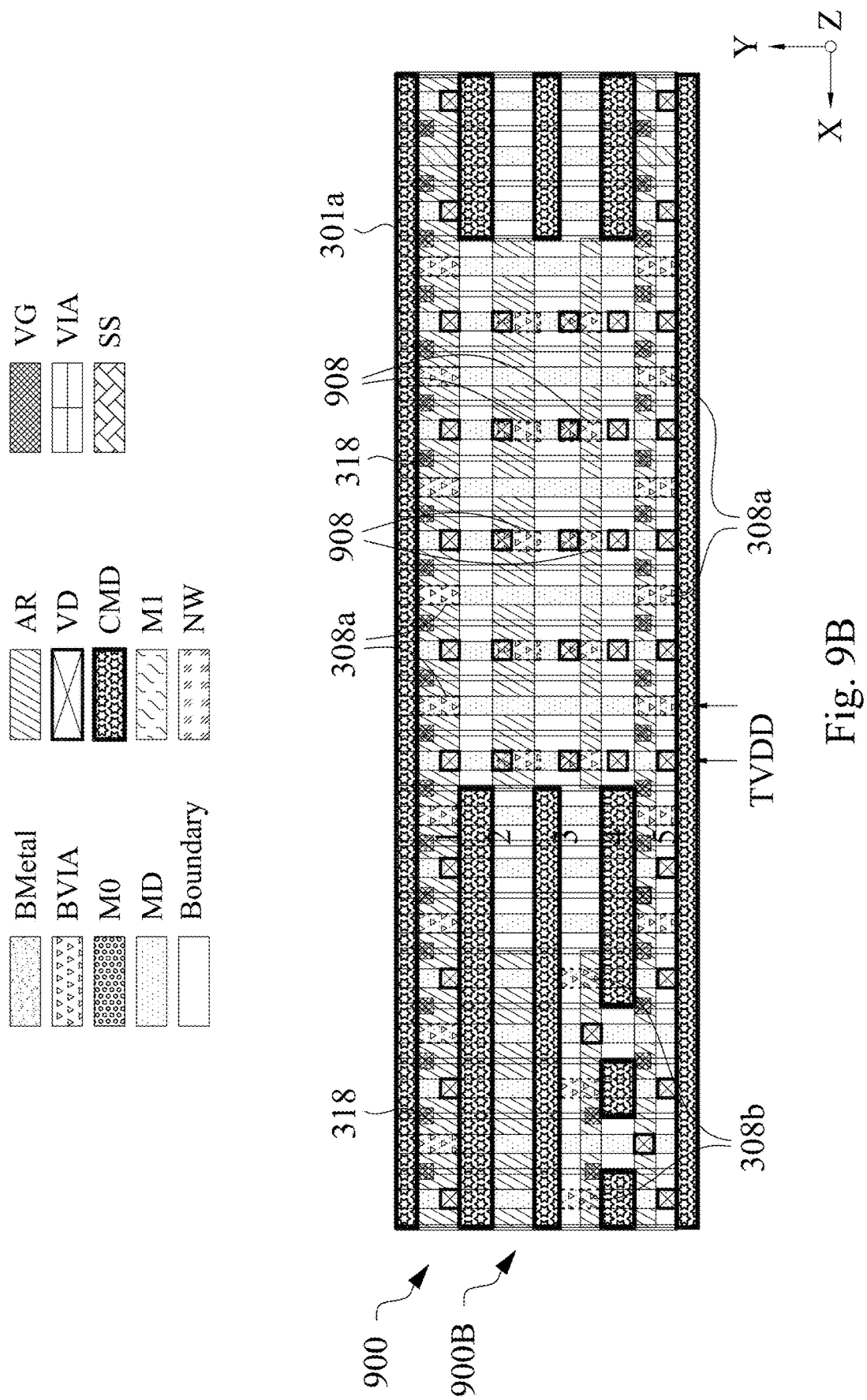

FIGS. 9A-9B are diagrams of an IC 900, in accordance with some embodiments.

FIGS. 9A-9B are top views of corresponding portions 900A-900B of integrated circuit 600, simplified for ease of illustration. Portion 900A is similar to portion 400A, and portion 900B is similar to portion 300B but further includes the VB level, and similar detailed description is therefore omitted.

IC 900 is a variation of IC 400, and similar detailed description is therefore omitted. In comparison with IC 400, vias 908 replaces vias 408, and power rail 902 replaces power rail 402, and similar detailed description is therefore omitted.

In comparison with power rail 402 of FIG. 4A, power rail 902 has an increased length (not labelled) in the first direction X, thereby causing the voltage supply TVDD to cover more area on the back-side 321a of IC 900, and providing more area for vias 908. In comparison with vias 408 of FIGS. 4A and 4B, a number of vias 908 are increased as a result of the larger area of power rail 902.

In some embodiments, compared to other approaches, by including more vias 908 and longer power rails 902, IC 900 achieves one or more of the benefits discussed above.

Other configurations or arrangements of IC 900 are within the scope of the present disclosure.

Figure 10:
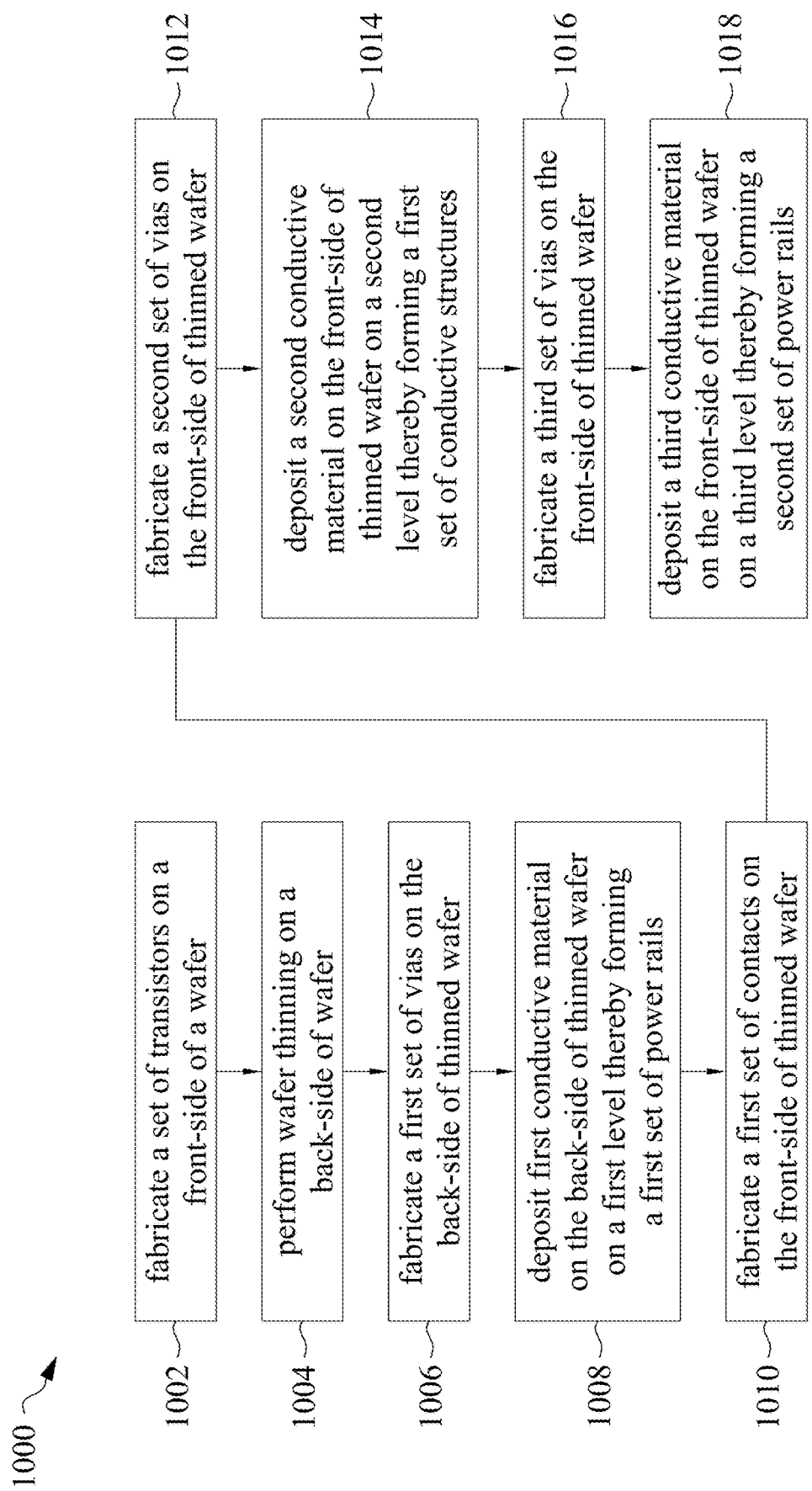
FIG. 10 is a flowchart of a method of forming or manufacturing an IC in accordance with some embodiments.

FIG. 10 is a functional flow chart of a method 1000 of manufacturing an IC device, in accordance with some embodiments. It is understood that additional operations may be performed before, during, and/or after the method 1000 depicted in FIG. 10, and that some other processes may only be briefly described herein.

In some embodiments, other order of operations of method 1000-1200 is within the scope of the present disclosure. Method 1000-1200 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of at least method 1000, 1100 or 1200 is not performed.

In some embodiments, method 1000 is an embodiment of operation 1104 of method 1100. In some embodiments, the methods 1000-1200 are usable to manufacture or fabricate at least IC 300, 400, 500A, 500B, 600, 700, 800 or 900, or an integrated circuit with similar features as at least layout design 200.

In operation 1002 of method 1000, a set of transistors are fabricated on a front-side of a semiconductor wafer or substrate. In some embodiments, the set of transistors of method 1000 includes one or more transistors in the set of active regions 304 or active region 504a. In some embodiments, the set of transistors of method 1000 includes one or more transistors described herein. In some embodiments, the front-side includes at least front-side 321b, 421b, 521b or 521bb.

In some embodiments, operation 1002 includes fabricating source and drain regions of the set of transistors in a first well. In some embodiments, the first well comprises p-type dopants. In some embodiments, the p-type dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm3 to $1 \times 10^{14}$ atoms/cm$^3$.

In some embodiments, the first well includes at least well 530a, 531a or 531b.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^3$ to about $1 \times 10^{14}$ atoms/cm$^3$.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1002 further includes forming a gate region of the set of transistors. In some embodiments, the gate regions of method 1000 include the set of gates 316.

In some embodiments, the gate region is between the drain region and the source region. In some embodiments, the gate region is over the first well and the substrate. In some embodiments, fabricating the gate regions of operation 1002 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1004 of method 1000, thinning is performed on the back-side of the wafer or substrate. In some embodiments, the back-side includes at least back-side 321a or 421a. In some embodiments, operation 1004 includes a thinning process performed on the back-side of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside of the semiconductor wafer or substrate.

In operation 1006 of method 1000, a first set of vias are formed on the back-side of the thinned wafer or substrate on a first level (e.g., VB). In some embodiments, the first set of vias of method 1000 includes one or more portions at least the set of vias 308, 408, 708a, 708b, 808a or 908. In some embodiments, operation 1006 includes forming a first set of self-aligned contacts (SACs) in the insulating layer over the back-side of the wafer. In some embodiments, the first set of vias is electrically coupled to at least the set of transistors. In some embodiments, the first set of vias of method 1000 includes one or more vias in the VB layer.

In operation 1008 of method 1000, a first conductive material is deposited on the back-side of the thinned substrate on a first level thereby forming a first set of power rails on the back-side of the wafer or substrate on a first level (e.g., BM). In some embodiments, operation 1008 includes at least depositing a first set of conductive regions over the back-side of the integrated circuit. In some embodiments, the first set of power rails of method 1000 includes one or more portions of at least the set of power rails 302 or 702, or power rail 402 or 902. In some embodiments, the first set of power rails is electrically coupled to at least the set of transistors by the first set of vias.

In operation 1010 of method 1000, a first set of contacts is formed on the front-side of the thinned wafer. In some embodiments, the first set of contacts is electrically connected to the set of transistors.

In operation 1012 of method 1000, a second set of vias are fabricated on the front-side of the wafer or substrate. In some embodiments, the second set of vias of method 1000 includes at least portions of one or more of the set of vias 310, 318 or 610. In some embodiments, the second set of vias of method 1000 includes one or more vias in the VG or VD layer.

In operation 1014 of method 1000, a second conductive material is deposited on the front-side of the wafer or substrate on a second level (e.g., M0) of the integrated circuit thereby forming a first set of conductive structures. In some embodiments, the first set of conductive structures of method 1000 includes at least portions of one or more of the set of conductive features 312. In some embodiments, the first set of conductive structures of method 1000 includes one or more conductors in the M0 layer.

In operation 1016 of method 1000, a third set of vias are fabricated on the front-side of the wafer or substrate. In some embodiments, the third set of vias (e.g., VO) of method 1000 includes at least portions of one or more of the set of vias 320 or 620. In some embodiments, the third set of vias of method 1000 includes one or more vias in the V0 layer.

In operation 1018 of method 1000, a third conductive material is deposited on the front-side of the wafer or substrate on a third level (e.g., M1) of the integrated circuit thereby forming a second set of power rails. In some embodiments, the second set of power rails of method 1000 includes one or more power rails of the set of power rails 314. In some embodiments, the second set of power rails of method 1000 includes one or more conductors in the M1 layer.

In some embodiments, one or more of operations 1006, 1008, 1010, 1012, 1014, 1016 or 1018 of method 1000 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 14:
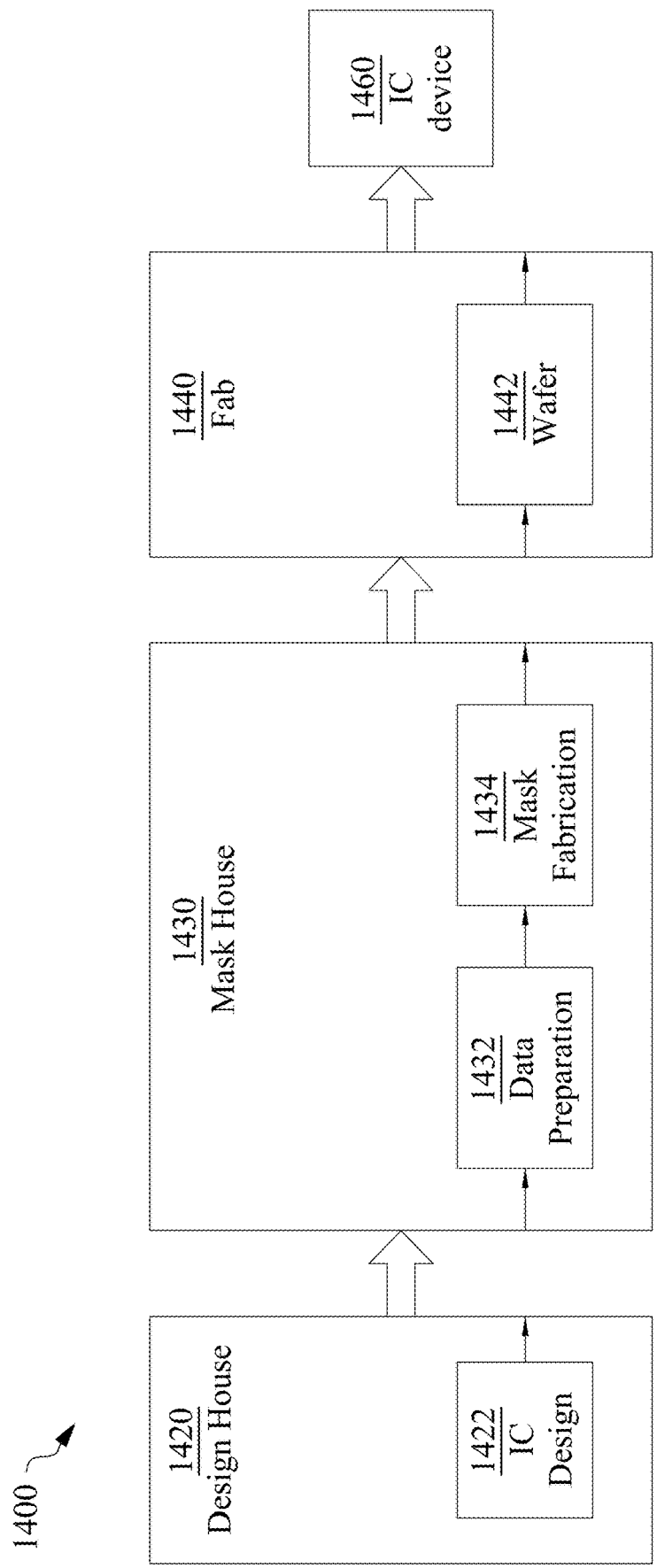
FIG. 14 is a block diagram of an IC manufacturing system, and an IC manufacturing flow associated therewith, in accordance with at least one embodiment of the present disclosure.

In some embodiments, at least one or more operations of method 1000 is performed by system 1400 of FIG. 14. In some embodiments, at least one method(s), such as method 1000 discussed above, is performed in whole or in part by at least one manufacturing system, including system 1400. One or more of the operations of method 1000 is performed by IC fab 1440 (FIG. 14) to fabricate IC device 1460. In some embodiments, one or more of the operations of method 1000 is performed by fabrication tools 1452 to fabricate wafer 1442.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 1008, 1014 or 1018, the conductive material is planarized to provide a level surface for subsequent steps.

In some embodiments, one or more of the operations of method 1000, 1100 or 1200 is not performed.

One or more of the operations of methods 1100-1200 is performed by a processing device configured to execute instructions for manufacturing an integrated circuit, such as at least IC 300, 400, 500A, 500B, 600, 700, 800 or 900. In some embodiments, one or more operations of methods 1100-1200 is performed using a same processing device as that used in a different one or more operations of methods 1100-1200. In some embodiments, a different processing device is used to perform one or more operations of methods 1100-1200 from that used to perform a different one or more operations of methods 1100-1200. In some embodiments, other order of operations of method 1000, 1100 or 1200 is within the scope of the present disclosure. Method 1000, 1100 or 1200 includes exemplary operations, but the operations are not necessarily performed in the order shown. Operations in method 1000, 1100 or 1200 may be added, replaced, changed order, and/or eliminated as appropriate, in accordance with the spirit and scope of disclosed embodiments.

FIG. 11 is a flowchart of a method 1100 of forming or manufacturing an integrated circuit in accordance with some embodiments. It is understood that additional operations may be performed before, during, and/or after the method 1100 depicted in FIG. 11, and that some other operations may only be briefly described herein. In some embodiments, the method 1100 is usable to form integrated circuits, such as at least IC 100A-100B, 300, 400, 500, 600, 700, 800 or 900. In some embodiments, the method 1100 is usable to form integrated circuits having similar features and similar structural relationships as one or more of layout design 200.

In operation 1102 of method 1100, a layout design of an integrated circuit is generated. Operation 1102 is performed by a processing device (e.g., processor 1302 (FIG. 13)) configured to execute instructions for generating a layout design. In some embodiments, the layout design of method 1100 includes one or more patterns of at least layout design 200, or one or more features similar to at least IC 100A-100B, 300, 400, 500, 600, 700, 800 or 900. In some embodiments, the layout design of the present application is in a graphic database system (GDSII) file format.

In operation 1104 of method 1100, the integrated circuit is manufactured based on the layout design. In some embodiments, operation 1104 of method 1100 comprises manufacturing at least one mask based on the layout design, and manufacturing the integrated circuit based on the at least one mask. In some embodiments, operation 1104 corresponds to method 1000 of FIG. 10.

In operation 1106 of method 1100, a region (e.g., regions 660a-660e) is removed thereby forming a first contact and a second contact of an IC. In some embodiments, the first contact includes one of contacts 306a, 306b, 306c, 306d or contacts 606a, 606b, 606c, 606d. In some embodiments, the second contact includes one of contacts 306a, 306b, 306c, 306d or contacts 606a, 606b, 606c, 606d.

In some embodiments, the removed portion of the contact structure corresponds to a cut region (e.g., set of cut feature layout patterns 260 (FIGS. 2A-2G)). In some embodiments, operation 1106 of method 1100 is referred to as a MD-poly (CMD) process. In some embodiments, operation 1106 results in the formation of IC 100A-100B, 300, 400, 500, 600, 700, 800 or 900.

In some embodiments, the portion of the contact structure that is removed in operation 1106 is identified in layout design 200 by set of cut feature layout patterns 260. In some embodiments, the set of cut feature layout patterns 260 identifies a location of the removed portion of the contact structure of IC 100A-100B, 300, 400, 500, 600, 700, 800 or 900.

In some embodiments, operation 1106 is performed by a removal process. In some embodiments, the removal process includes one or more etching processes suitable to remove a portion of the contact structure. In some embodiments, the etching process of operation 1106 includes identifying a portion of the contact structure that is to be removed, and etching the portion of the contact structure that is to be removed. In some embodiments, a mask is used to specify portions of the structure that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like. In some embodiments, operation 1104 or 1106 of method 1100 is useable to manufacture one or more integrated circuits having one or more of the advantages described herein, and similar detailed description is therefore omitted. In some embodiments, operation 1106 is not performed.

Figure 12:
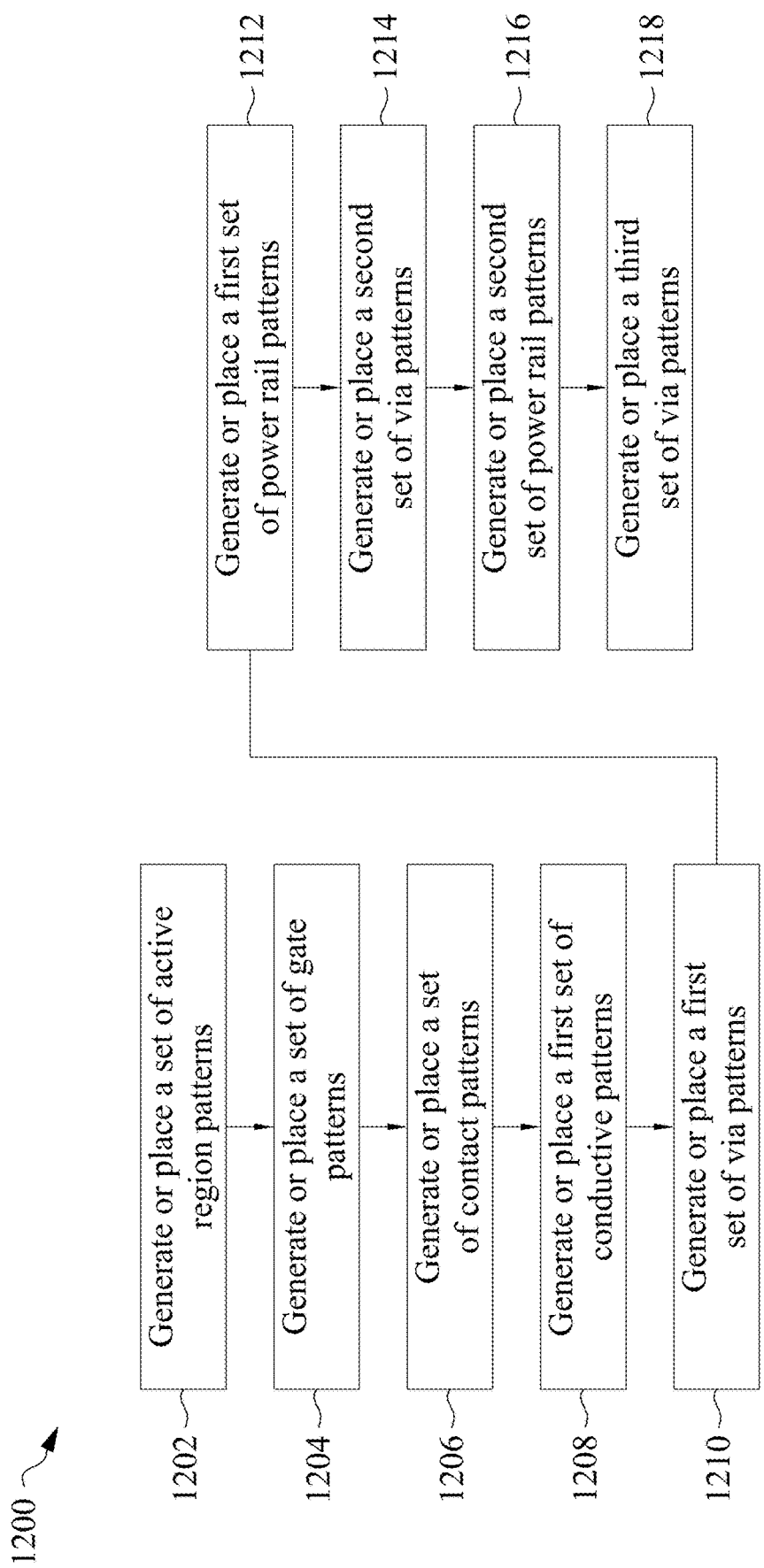
FIG. 12 is a functional flow chart of a method of manufacturing an IC device, in accordance with some embodiments.

FIG. 12 is a flowchart of a method 1200 of generating a layout design of an integrated circuit, in accordance with some embodiments. It is understood that additional operations may be performed before, during, and/or after the method 1200 depicted in FIG. 12, and that some other processes may only be briefly described herein. In some embodiments, method 1200 is an embodiment of operation 1102 of method 1100. In some embodiments, method 1200 is usable to generate one or more layout patterns of at least layout design 200, or one or more features similar to at least IC 300, 400, 500A, 500B, 600, 700, 800 or 900.

In some embodiments, method 1200 is usable to generate one or more layout patterns having structural relationships including alignment, lengths and widths, as well as configurations and layers of at least layout design 200, or one or more features similar to at least IC 300, 400, 500A, 500B, 600, 700, 800 or 900, and similar detailed description will not be described in FIG. 12, for brevity.

In operation 1202 of method 1200, a set of active region patterns is generated or placed on the layout design. In some embodiments, the set of active region patterns of method 1200 includes at least portions of one or more patterns of set of active region patterns 204. In some embodiments, the set of active region patterns of method 1200 includes one or more regions similar to the set of active regions 304, or active region 504a.

In operation 1204 of method 1200, a set of gate patterns is generated or placed on the layout design. In some embodiments, the set of gate patterns of method 1200 includes at least portions of one or more patterns of set of gate patterns 216. In some embodiments, the set of gate patterns of method 1200 includes one or more regions similar to the set of gates 316.

In operation 1206 of method 1200, a set of contact patterns is generated or placed on the layout design. In some embodiments, the set of contact patterns of method 1200 includes at least portions of one or more patterns of set of contact patterns 206.

In some embodiments, the set of contact patterns of method 1200 includes one or more contact patterns similar to the set of contacts 306 or 606. In some embodiments, the set of contact patterns of method 1200 includes one or more patterns or similar contacts in the MD layer.

In operation 1208 of method 1200, a first set of conductive patterns is generated or placed on the layout design. In some embodiments, the first set of conductive patterns of method 1200 includes at least portions of one or more patterns of at least the set of conductive patterns 212. In some embodiments, the first set of conductive patterns of method 1200 includes one or more conductive patterns similar to at least the set of conductive features 312. In some embodiments, the first set of conductive patterns of method 1200 includes one or more patterns or similar conductors in the M0 layer.

In operation 1210 of method 1200, a first set of via patterns is generated or placed on the layout design. In some embodiments, the first set of via patterns of method 1200 includes at least portions of one or more patterns of set of via patterns 210 or 218. In some embodiments, the first set of via patterns of method 1200 includes one or more via patterns similar to at least the set of vias 310, 318 or 610. In some embodiments, the first set of via patterns of method 1200 includes one or more patterns or similar vias in the VG or VD layer.

In operation 1212 of method 1200, a first set of power rail patterns is generated or placed on the layout design. In some embodiments, the first set of power rail patterns of method 1200 includes at least portions of one or more patterns of at least the set of power rail patterns 214. In some embodiments, the first set of power rail patterns of method 1200 includes one or more conductive patterns similar to at least the set of power rails 314. In some embodiments, the first set of power rail patterns of method 1200 includes one or more patterns or similar conductors in the M1 layer.

In operation 1214 of method 1200, a second set of via patterns is generated or placed on the layout design. In some embodiments, the second set of via patterns of method 1200 includes at least portions of one or more patterns of set of via patterns 220. In some embodiments, the second set of via patterns of method 1200 includes one or more via patterns similar to at least the set of vias 320 or 620. In some embodiments, the second set of via patterns of method 1200 includes one or more patterns or similar vias in the V0 layer.

In operation 1216 of method 1200, a second set of power rail patterns is generated or placed on the layout design. In some embodiments, the second set of power rail patterns of method 1200 includes at least portions of one or more patterns of set of power rail patterns 202. In some embodiments, the second set of power rail patterns of method 1200 includes one or more patterns similar to at least the set of power rails 302 or 702, or power rail 402 or 902. In some embodiments, the second power rail patterns of method 1200 includes one or more patterns or similar conductors in the BM layer.

In operation 1218 of method 1220, a third set of via patterns is generated or placed on the layout design. In some embodiments, the third set of via patterns of method 1200 includes at least portions of one or more patterns of set of via patterns 208. In some embodiments, the third set of via patterns of method 1200 includes one or more via patterns similar to at least the set of vias 308, 408, 708a, 708b, 808a or 908. In some embodiments, the third set of via patterns of method 1200 includes one or more patterns or similar vias in the VB layer.

Figure 13:
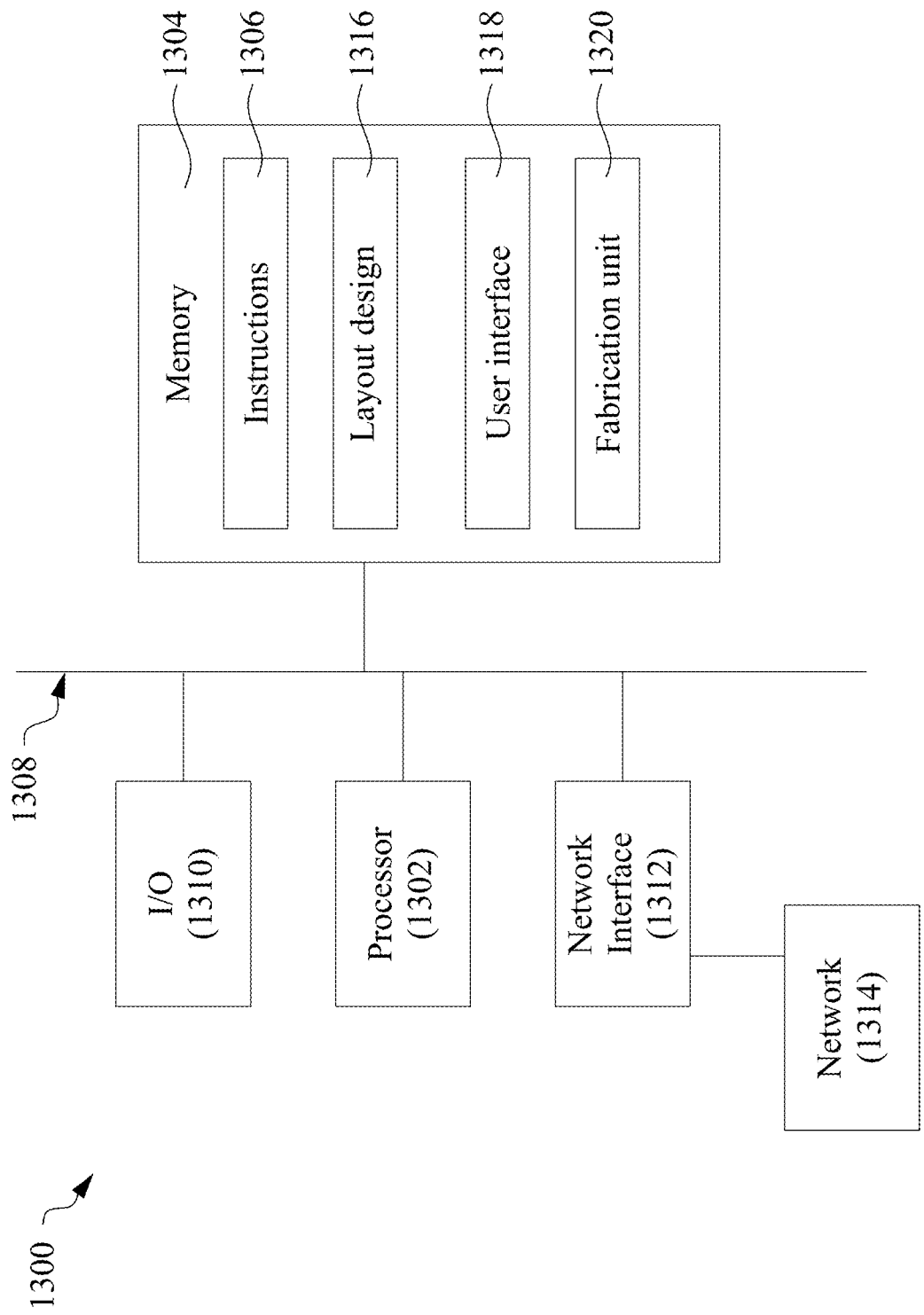
FIG. 13 is a schematic view of a system for designing an IC layout design and manufacturing an IC circuit in accordance with some embodiments.

FIG. 13 is a schematic view of a system 1300 for designing an IC layout design and manufacturing an IC circuit in accordance with some embodiments.

In some embodiments, system 1300 generates or places one or more IC layout designs described herein. System 1300 includes a hardware processor 1302 and a non-transitory, computer readable storage medium 1304 (e.g., memory 1304) encoded with, i.e., storing, the computer program code 1306, i.e., a set of executable instructions 1306. Computer readable storage medium 1304 is configured for interfacing with manufacturing machines for producing the integrated circuit. The processor 1302 is electrically coupled to the computer readable storage medium 1304 via a bus 1308. The processor 1302 is also electrically coupled to an I/O interface 1310 by bus 1308. A network interface 1312 is also electrically connected to the processor 1302 via bus 1308. Network interface 1312 is connected to a network 1314, so that processor 1302 and computer readable storage medium 1304 are capable of connecting to external elements via network 1314. The processor 1302 is configured to execute the computer program code 1306 encoded in the computer readable storage medium 1304 in order to cause system 1300 to be usable for performing a portion or all of the operations as described in method 1100-1200.

In some embodiments, the processor 1302 is a central processing unit (CPU), a multi-processor, a distributed processing system, an application specific integrated circuit (ASIC), and/or a suitable processing unit.

In some embodiments, the computer readable storage medium 1304 is an electronic, magnetic, optical, electromagnetic, infrared, and/or a semiconductor system (or apparatus or device). For example, the computer readable storage medium 1304 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1304 includes a compact disk-read only memory (CD-ROM), a compact disk-read/write (CD-R/W), and/or a digital video disc (DVD).

In some embodiments, the storage medium 1304 stores the computer program code 1306 configured to cause system 1300 to perform method 1100-1200. In some embodiments, the storage medium 1304 also stores information needed for performing method 1100-1200 as well as information generated during performing method 1100-1200, such as layout design 1316, user interface 1318 and fabrication unit 1320, and/or a set of executable instructions to perform the operation of method 1100-1200. In some embodiments, layout design 1316 comprises one or more of layout patterns of at least layout design 200, or features similar to at least IC 100A-100B, 300, 400, 500, 600, 700, 800 or 900.

In some embodiments, the storage medium 1304 stores instructions (e.g., computer program code 1306) for interfacing with manufacturing machines. The instructions (e.g., computer program code 1306) enable processor 1302 to generate manufacturing instructions readable by the manufacturing machines to effectively implement method 1100-1200 during a manufacturing process.

System 1300 includes I/O interface 1310. I/O interface 1310 is coupled to external circuitry. In some embodiments, I/O interface 1310 includes a keyboard, keypad, mouse, trackball, trackpad, and/or cursor direction keys for communicating information and commands to processor 1302.

System 1300 also includes network interface 1312 coupled to the processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interface such as ETHERNET, USB, or IEEE-2094. In some embodiments, method 1100-1200 is implemented in two or more systems 1300, and information such as layout design, and user interface are exchanged between different systems 1300 by network 1314.

System 1300 is configured to receive information related to a layout design through I/O interface 1310 or network interface 1312. The information is transferred to processor 1302 by bus 1308 to determine a layout design for producing at least IC 100A-100B, 300, 400, 500, 600, 700, 800 or 900. The layout design is then stored in computer readable medium 1304 as layout design 1316. System 1300 is configured to receive information related to a user interface through I/O interface 1310 or network interface 1312. The information is stored in computer readable medium 1304 as user interface 1318. System 1300 is configured to receive information related to a fabrication unit 1320 through I/O interface 1310 or network interface 1312. The information is stored in computer readable medium 1304 as fabrication unit 1320. In some embodiments, the fabrication unit 1320 includes fabrication information utilized by system 1300. In some embodiments, the fabrication unit 1320 corresponds to mask fabrication 1434 of FIG. 14.

In some embodiments, method 1100-1200 is implemented as a standalone software application for execution by a processor. In some embodiments, method 1100-1200 is implemented as a software application that is a part of an additional software application. In some embodiments, method 1100-1200 is implemented as a plug-in to a software application. In some embodiments, method 1100-1200 is implemented as a software application that is a portion of an EDA tool. In some embodiments, method 1100-1200 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1100-1200 is implemented by a manufacturing device to manufacture an integrated circuit using a set of masks manufactured based on one or more layout designs generated by system 1300. In some embodiments, system 1300 is a manufacturing device configured to manufacture an integrated circuit using a set of masks manufactured based on one or more layout designs of the present disclosure. In some embodiments, system 1300 of FIG. 13 generates layout designs of an integrated circuit that are smaller than other approaches. In some embodiments, system 1300 of FIG. 13 generates layout designs of integrated circuit structure that occupy less area and provide better routing resources than other approaches.

FIG. 14 is a block diagram of an integrated circuit (IC) manufacturing system 1400, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1400.

In FIG. 14, IC manufacturing system 1400 (hereinafter "system 1400") includes entities, such as a design house 1420, a mask house 1430, and an IC manufacturer/fabricator ("fab") 1440, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1420, mask house 1430, and IC fab 1440 is owned by a single larger company. In some embodiments, one or more of design house 1420, mask house 1430, and IC fab 1440 coexist in a common facility and use common resources.

Design house (or design team) 1420 generates an IC design layout 1422. IC design layout 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout 1422 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout 1422. The design procedure includes one or more of logic design, physical design or place and route. IC design layout 1422 is presented in one or more data files having information of the geometrical patterns. For example, IC design layout 1422 can be expressed in a GDSII file format or DFII file format.

Mask house 1430 includes data preparation 1432 and mask fabrication 1434. Mask house 1430 uses IC design layout 1422 to manufacture one or more masks 1445 to be used for fabricating the various layers of IC device 1460 according to IC design layout 1422. Mask house 1430 performs mask data preparation 1432, where IC design layout 1422 is translated into a representative data file (RDF). Mask data preparation 1432 provides the RDF to mask fabrication 1434. Mask fabrication 1434 includes a mask writer. A mask writer converts the RDF to an image on a substrate, such as a mask (reticle) 1445 or a semiconductor wafer 1442. The design layout 1422 is manipulated by mask data preparation 1432 to comply with particular characteristics of the mask writer and/or requirements of IC fab 1440. In FIG. 14, mask data preparation 1432 and mask fabrication 1434 are illustrated as separate elements. In some embodiments, mask data preparation 1432 and mask fabrication 1434 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1434, which may undo part of the modifications performed by OPC in order to meet mask creation rules.

In some embodiments, mask data preparation 1432 includes lithography process checking (LPC) that simulates processing that will be implemented by IC fab 1440 to fabricate IC device 1460. LPC simulates this processing based on IC design layout 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1422.

It should be understood that the above description of mask data preparation 1432 has been simplified for the purposes of clarity. In some embodiments, data preparation 1432 includes additional features such as a logic operation (LOP) to modify the IC design layout according to manufacturing rules. Additionally, the processes applied to IC design layout 1422 during data preparation 1432 may be executed in a variety of different orders.

After mask data preparation 1432 and during mask fabrication 1434, a mask 1445 or a group of masks 1445 are fabricated based on the modified IC design layout 1422. In some embodiments, mask fabrication 1434 includes performing one or more lithographic exposures based on IC design 1422. In some embodiments, an electron-beam (e-beam) or a mechanism of multiple e-beams is used to form a pattern on a mask (photomask or reticle) 1445 based on the modified IC design layout 1422. The mask 1445 can be formed in various technologies. In some embodiments, the mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1445 includes a transparent substrate (e.g., fused quartz) and an opaque material (e.g., chromium) coated in the opaque regions of the binary mask. In another example, the mask 1445 is formed using a phase shift technology. In the phase shift mask (PSM) version of mask 1445, various features in the pattern formed on the mask are configured to have proper phase difference to enhance the resolution and imaging quality. In various examples, the phase shift mask can be attenuated PSM or alternating PSM. The mask(s) generated by mask fabrication 1434 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1440 is an IC fabrication entity that includes one or more manufacturing facilities for the fabrication of a variety of different IC products. In some embodiments, IC Fab 1440 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1440 includes wafer fabrication tools 1452 (hereinafter "fabrication tools 1452") configured to execute various manufacturing operations on semiconductor wafer 1442 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1440 uses mask(s) 1445 fabricated by mask house 1430 to fabricate IC device 1460. Thus, IC fab 1440 at least indirectly uses IC design layout 1422 to fabricate IC device 1460. In some embodiments, a semiconductor wafer 1442 is fabricated by IC fab 1440 using mask(s) 1445 to form IC device 1460. In some embodiments, the IC fabrication includes performing one or more lithographic exposures based at least indirectly on IC design 1422. Semiconductor wafer 1442 includes a silicon substrate or other proper substrate having material layers formed thereon. Semiconductor wafer 1442 further includes one or more of various doped regions, dielectric features, multilevel interconnects, and the like (formed at subsequent manufacturing steps).

System 1400 is shown as having design house 1420, mask house 1430 or IC fab 1440 as separate components or entities. However, it is understood that one or more of design house 1420, mask house 1430 or IC fab 1440 are part of the same component or entity.

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a gated circuit, a header circuit, a first power rail, a second power rail and a third power rail. In some embodiments, the gated circuit is configured to operate on at least a first voltage or a second voltage. In some embodiments, the header circuit is coupled to the gated circuit. In some embodiments, the first power rail is on a back-side of a wafer, the first power rail extending in a first direction, the header circuit being configured to supply the first voltage to the gated circuit by the first power rail. In some embodiments, the second power rail on the back-side of the wafer, the second power rail extending in the first direction and being separated from the first power rail in a second direction different from the first direction, the second power rail being configured to supply the second voltage to the gated circuit, the second voltage being different from the first voltage. In some embodiments, the third power rail on a front-side of the wafer opposite of the back-side of the wafer, the third power rail including a first set of conductors extending in the second direction, and being separated in the first direction, each of the first set of conductors being configured to supply a third voltage to the header circuit. In some embodiments, the integrated circuit where the header circuit includes a first active region of a first dopant type, the first active region extending in the first direction, and being on the front-side of the wafer; and a second active region of the first dopant type, the second active region extending in the first direction, being on the front-side of the wafer, and being separated from the first active region in the second direction. The first active region includes a first set of transistors, the first set of transistors being electrically connected in parallel between the first power rail and the third power rail; and the second active region includes a second set of transistors, the second set of transistors being electrically connected in parallel between the first power rail and the third power rail. In some embodiments, the integrated circuit includes a first set of contacts overlapping at least the first active region or the second active region, the first set of contacts extending in the second direction, and being on a first level below the third power rail, each contact of the first set of contacts being separated from one another in the first direction. Each conductor of the second set of conductors is electrically connecting two or more of the first set of contacts in parallel. Each conductor of the second set of conductors is electrically connecting two or more of the first set of conductors in parallel. The first set of contacts does not overlap the second active region. In some embodiments, the integrated circuit includes a first set of vias between the first power rail and the first active region, the first set of vias electrically connecting the first power rail and the first active region together. In some embodiments, the integrated circuit includes a fourth power rail on the back-side of the wafer, the fourth power rail extending in the first direction, being configured to supply the first voltage to the gated circuit, and being separated from the first power rail in the second direction; and a second set of vias between the fourth power rail and the second active region, the second set of vias electrically connecting the fourth power rail and the second active region together.

Another aspect of this description relates to an integrated circuit. In some embodiments, the integrated circuit includes a first power rail, a power gating circuit, a second power rail, a third power rail and a fourth power rail. In some embodiments, the first power rail is on a back-side of a wafer, the first power rail extending in a first direction and configured to supply a first voltage. In some embodiments, the power gating circuit is coupled to the first power rail, and configured to supply the first voltage to the first power rail. In some embodiments, the second power rail is on the back-side of the wafer, the second power rail extending in the first direction, and being separated from the first power rail in the first direction and a second direction different from the first direction, the second power rail being configured to supply a second voltage. In some embodiments, the third power rail is on a front-side of the wafer opposite from the back-side of the wafer, the third power rail including a first set of conductors extending in the second direction, and each conductor of the first set of conductors is separated from one another in the first direction. In some embodiments, the fourth power rail is on the back-side of the wafer, the fourth power rail extending in the first direction, being separated from the first power rail in the second direction, and being separated from the second power rail in the first direction. In some embodiments, the third power rail and the fourth power rail are configured to supply a third voltage to the power gating circuit. In some embodiments, the power gating circuit includes a first active region extending in the first direction, being on the front-side of the wafer, and being above the first power rail and the fourth power rail, the first active region including a first set of transistors being electrically connected in parallel between the first power rail and at least the third power rail or the fourth power rail. The first active region has an I-shape. In some embodiments, the power gating circuit includes a first active region of a first dopant type, the first active region extending in the first direction, being on the front-side of the wafer, and being above the first power rail; and a second active region of the first dopant type, the second active region extending in the first direction, being on the front-side of the wafer, and being above the fourth power rail; a third active region of the first dopant type, the third active region extending in the first direction, being on the front-side of the wafer, and being above the fourth power rail; and a fourth active region of the first dopant type, the fourth active region extending in the first direction, being on the front-side of the wafer, and being above the first power rail. where each of the first active region, the second active region, the third active region and the fourth active region is separated from one another in the second direction. In some embodiments, the integrated circuit includes a fifth active region of a second dopant type different from the first dopant type, the fifth active region extending in the first direction, being on the front-side of the wafer, and being above the second power rail, and being separated from the second active region in the first direction; and a sixth active region of the second dopant type, the sixth active region extending in the first direction, being on the front-side of the wafer, and being above the second power rail, and being separated from the third active region in the first direction. In some embodiments, the integrated circuit includes a first set of vias between the first power rail and the first active region, the first set of vias electrically connecting the first power rail and the first active region together. The second set of vias are offset from the first set of vias in the first direction. The first power rail has an I-shape.

Still another aspect of this description relates to a method of fabricating an integrated circuit. In some embodiments, the method includes fabricating a set of transistors in a front-side of a wafer, fabricating a first set of vias in a back-side of the wafer opposite from the front-side, depositing a first conductive material on the back-side of the wafer thereby forming a first set of power rails electrically connected to the set of transistors by the first set of vias, fabricating a second set of vias in the front-side of the wafer, and depositing a second conductive material on the front-side of the wafer thereby forming a second set of power rails electrically connected to the set of transistors by at least the second set of vias. In some embodiments, the method includes fabricating a first set of contacts on the front-side of the wafer, the first set of contacts being electrically connected to the set of transistors; fabricating a third set of vias in the front-side of the wafer, the third set of vias electrically connected to the first set of contacts; and depositing a third conductive material on the front-side of the wafer thereby forming a first set of conductors extending in a first direction, the third set of vias electrically connecting the first set of conductors and the first set of contacts, and the third set of vias electrically connecting the second set of power rails and the first set of conductors. In some embodiments, fabricating the first set of contacts on the front-side of the wafer includes depositing a fourth conductive material over active regions of the set of transistors; and performing a cut metal process on the fourth conductive material thereby forming the first set of contacts. Implementations of the described techniques may include hardware, a method or process, or computer software on a computer-accessible medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a gated circuit configured to operate on at least a first voltage or a second voltage;
a header circuit coupled to the gated circuit;
a first power rail on a back-side of a wafer, the first power rail extending in a first direction, the header circuit being configured to supply the first voltage to the gated circuit by the first power rail;
a second power rail on the back-side of the wafer, the second power rail extending in the first direction and being separated from the first power rail in a second direction different from the first direction, the second power rail being configured to supply the second voltage to the gated circuit, the second voltage being different from the first voltage; and
a third power rail on a front-side of the wafer opposite of the back-side of the wafer, the third power rail including a first set of conductors extending in the second direction, and being separated in the first direction, each of the first set of conductors being configured to supply a third voltage to the header circuit.

2. The integrated circuit of claim 1, wherein the header circuit comprises:
a first active region of a first dopant type, the first active region extending in the first direction, and being on the front-side of the wafer; and
a second active region of the first dopant type, the second active region extending in the first direction, being on the front-side of the wafer, and being separated from the first active region in the second direction.

3. The integrated circuit of claim 2, wherein
the first active region includes a first set of transistors, the first set of transistors being electrically connected in parallel between the first power rail and the third power rail; and
the second active region includes a second set of transistors, the second set of transistors being electrically connected in parallel between the first power rail and the third power rail.

4. The integrated circuit of claim 2, further comprising:
a first set of contacts overlapping at least the first active region or the second active region, the first set of contacts extending in the second direction, and being on a first level below the third power rail, each contact of the first set of contacts being separated from one another in the first direction.

5. The integrated circuit of claim 4, further comprising:
a second set of conductors extending in the first direction, overlapping the first set of contacts, and being on a second level different from the first level; and
a first set of vias between the first set of contacts and the second set of conductors, the first set of vias electrically connecting the first set of contacts and the second set of conductors together,
wherein each conductor of the second set of conductors is electrically connecting two or more of the first set of contacts in parallel.

6. The integrated circuit of claim 5, further comprising:
a second set of vias between the first set of conductors and the second set of conductors, the second set of vias electrically connecting the first set of conductors and the second set of conductors together,
wherein each conductor of the second set of conductors is electrically connecting two or more of the first set of conductors in parallel.

7. The integrated circuit of claim 4, further comprising:
a second set of contacts overlapping the second active region, the second set of contacts extending in the second direction, being on the first level below the third power rail, and being separated from the first set of contacts in the second direction, each contact of the first set of contacts being separated from one another in the first direction,
wherein the first set of contacts does not overlap the second active region.

8. The integrated circuit of claim 4, further comprising:
a first set of vias between the first power rail and the first active region, the first set of vias electrically connecting the first power rail and the first active region together.

9. The integrated circuit of claim 8, further comprising:
a fourth power rail on the back-side of the wafer, the fourth power rail extending in the first direction, being configured to supply the first voltage to the gated circuit, and being separated from the first power rail in the second direction; and
a second set of vias between the fourth power rail and the second active region, the second set of vias electrically connecting the fourth power rail and the second active region together.

10. An integrated circuit comprising:
a first power rail on a back-side of a wafer, the first power rail extending in a first direction and configured to supply a first voltage;
a power gating circuit coupled to the first power rail, and configured to supply the first voltage to the first power rail;
a second power rail on the back-side of the wafer, the second power rail extending in the first direction, and being separated from the first power rail in the first direction and a second direction different from the first direction, the second power rail being configured to supply a second voltage;
a third power rail on a front-side of the wafer opposite from the back-side of the wafer, the third power rail including a first set of conductors extending in the second direction, and each conductor of the first set of conductors is separated from one another in the first direction; and a fourth power rail on the back-side of the wafer, the fourth power rail extending in the first direction, being separated from the first power rail in the second direction, and being separated from the second power rail in the first direction, wherein the third power rail and the fourth power rail are configured to supply a third voltage to the power gating circuit.

11. The integrated circuit of claim 10, wherein the power gating circuit comprises:

a first active region extending in the first direction, being on the front-side of the wafer, and being above the first power rail and the fourth power rail, the first active region including a first set of transistors being electrically connected in parallel between the first power rail and at least the third power rail or the fourth power rail.

12. The integrated circuit of claim 11, wherein the first active region has an I-shape.

13. The integrated circuit of claim 10, wherein the power gating circuit comprises:

a first active region of a first dopant type, the first active region extending in the first direction, being on the front-side of the wafer, and being above the first power rail; and a second active region of the first dopant type, the second active region extending in the first direction, being on the front-side of the wafer, and being above the fourth power rail;

a third active region of the first dopant type, the third active region extending in the first direction, being on the front-side of the wafer, and being above the fourth power rail; and a fourth active region of the first dopant type, the fourth active region extending in the first direction, being on the front-side of the wafer, and being above the first power rail.

wherein each of the first active region, the second active region, the third active region and the fourth active region is separated from one another in the second direction.

14. The integrated circuit of claim 13, further comprising:

a fifth active region of a second dopant type different from the first dopant type, the fifth active region extending in the first direction, being on the front-side of the wafer, and being above the second power rail, and being separated from the second active region in the first direction; and a sixth active region of the second dopant type, the sixth active region extending in the first direction, being on the front-side of the wafer, and being above the second power rail, and being separated from the third active region in the first direction.

15. The integrated circuit of claim 13, further comprising:

a first set of vias between the first power rail and the first active region, the first set of vias electrically connecting the first power rail and the first active region together.

16. The integrated circuit of claim 15, further comprising:

a second set of vias between the fourth power rail and the second active region and the third active region, the second set of vias electrically connecting the fourth power rail to the second active region or the third active region, wherein the second set of vias are offset from the first set of vias in the first direction.

17. The integrated circuit of claim 10, wherein the first power rail has an I-shape.

18. A method of fabricating an integrated circuit, the method comprising:

fabricating a set of transistors in a front-side of a wafer;

fabricating a first set of vias in a back-side of the wafer opposite from the front-side;

depositing a first conductive material on the back-side of the wafer thereby forming a first set of power rails electrically connected to the set of transistors by the first set of vias;

fabricating a second set of vias in the front-side of the wafer; and depositing a second conductive material on the front-side of the wafer thereby forming a second set of power rails electrically connected to the set of transistors by at least the second set of vias.

19. The method of claim 18, further comprising fabricating a first set of contacts on the front-side of the wafer, the first set of contacts being electrically connected to the set of transistors;

fabricating a third set of vias in the front-side of the wafer, the third set of vias electrically connected to the first set of contacts; and depositing a third conductive material on the front-side of the wafer thereby forming a first set of conductors extending in a first direction, the third set of vias electrically connecting the first set of conductors and the first set of contacts, and the second set of vias electrically connecting the second set of power rails and the first set of conductors.

20. The method of claim 19, wherein fabricating the first set of contacts on the front-side of the wafer comprises:

depositing a fourth conductive material over active regions of the set of transistors; and performing a cut metal process on the fourth conductive material thereby forming the first set of contacts.

* * * * *